United States Patent
Kim et al.

(10) Patent No.: US 12,341,136 B2
(45) Date of Patent: Jun. 24, 2025

(54) DISPLAY DEVICE INCLUDING AN EMISSION DEFINING LAYER AND METHOD FOR FABRICATION THEREOF

(71) Applicant: Samsung Display Co., LTD., Yongin-si (KR)

(72) Inventors: Jin Wan Kim, Hwaseong-si (KR); Min Woo Kim, Hwaseong-si (KR); Seung Geun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 494 days.

(21) Appl. No.: 17/664,853

(22) Filed: May 24, 2022

(65) Prior Publication Data

US 2023/0110747 A1   Apr. 13, 2023

(30) Foreign Application Priority Data

Oct. 13, 2021   (KR) ........................ 10-2021-0135540

(51) Int. Cl.
| | | |
|---|---|---|
| *G09G 3/32* | (2016.01) | |
| *H01L 25/075* | (2006.01) | |
| *H10H 20/01* | (2025.01) | |
| *H10H 20/812* | (2025.01) | |
| *H10H 20/824* | (2025.01) | |
| *H10H 20/832* | (2025.01) | |
| *H10H 20/855* | (2025.01) | |

(52) U.S. Cl.
CPC ....... *H01L 25/0753* (2013.01); *H10H 20/013* (2025.01); *H10H 20/812* (2025.01); *H10H 20/824* (2025.01); *H10H 20/832* (2025.01); *H10H 20/855* (2025.01); *G09G 3/32* (2013.01); *G09G 2300/0426* (2013.01); *G09G 2300/046* (2013.01); *G09G 2300/0809* (2013.01)

(58) Field of Classification Search
CPC ........ G09G 3/32; G09G 3/0426; G09G 3/046; G09G 3/0809; H01L 33/0062; H01L 33/06; H01L 33/30; H01L 33/40; H01L 33/58
USPC .................................................... 257/40, 88
See application file for complete search history.

(56) References Cited

U.S. PATENT DOCUMENTS

| | | | |
|---|---|---|---|
| 5,795,798 A | 8/1998 | Mishra et al. | |
| 2019/0123235 A1 | 4/2019 | Cho et al. | |
| 2020/0066787 A1* | 2/2020 | Park ..................... | H01L 27/156 |

(Continued)

FOREIGN PATENT DOCUMENTS

| | | |
|---|---|---|
| CN | 110534542 A | 12/2019 |
| CN | 210092086 U | 2/2020 |

(Continued)

*Primary Examiner* — Hoai V Pham
(74) *Attorney, Agent, or Firm* — Womble Bond Dickinson (US) LLP

(57) ABSTRACT

A display device and a method for fabrication thereof are provided. A display device includes a plurality of pixel electrodes spaced from each other on a substrate, a plurality of light emitting elements respectively located on the plurality of pixel electrodes, a common electrode layer on the plurality of light emitting elements, and an emission defining layer defining emission areas in which the plurality of light emitting elements are located, wherein the emission defining layer is in contact with a side surface of each of the plurality of light emitting elements and surrounds the side surface of each of the plurality of light emitting elements.

13 Claims, 71 Drawing Sheets

(56) References Cited

U.S. PATENT DOCUMENTS

2020/0135977 A1 4/2020 Leung et al.
2020/0328327 A1 10/2020 He et al.

FOREIGN PATENT DOCUMENTS

KR 10-1316330 B1 10/2013
KR 10-2019-0044492 4/2019

* cited by examiner

DISPLAY DEVICE INCLUDING AN EMISSION DEFINING LAYER AND METHOD FOR FABRICATION THEREOF

CROSS-REFERENCE TO RELATED APPLICATION

This application claims priority to and the benefit of Korean Patent Application No. 10-2021-0135540 filed on Oct. 13, 2021 in the Korean Intellectual Property Office, the entire content of which is incorporated by reference herein.

BACKGROUND

1. Field

The present disclosure relates to a display device and a method for fabrication thereof.

2. Description of the Related Arts

With the advance of information-oriented society, more and more demands are placed on display devices for displaying images in various ways. The display device may be a flat panel display device such as a liquid crystal display, a field emission display and a light emitting display. A light emitting display device may include an organic light emitting display device including an organic light emitting diode element as a light emitting element, an inorganic light emitting display device including an inorganic semiconductor element as a light emitting element, or a micro light emitting display device including a micro light emitting diode element as a light emitting element.

Recently, a head mounted display including the light emitting display device has been developed. A head mounted display (HMD) is a glasses-type monitor device of virtual reality (VR) or augmented reality that is worn in the form of glasses or a helmet to form a focal point at a close distance in front of eyes of a user. A high-resolution ultra-small light emitting diode display panel including a micro light emitting diode element may be applied to the head mounted display.

SUMMARY

Aspects of embodiments of the present disclosure provide a display device capable of partitioning an emission area of a light emitting element without damaging a sidewall of the light emitting element and a method for fabricating the display device.

However, aspects of embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes a plurality of pixel electrodes spaced from each other on a substrate, a plurality of light emitting elements respectively located on the plurality of pixel electrodes, a common electrode layer on the plurality of light emitting elements, and an emission defining layer defining emission areas in which the plurality of light emitting elements are disposed, wherein the emission defining layer is in contact with a side surface of each of the plurality of light emitting elements and surrounds the side surface of each of the plurality of light emitting elements.

A width of a bottom surface of each of the plurality of light emitting elements may be greater than a width of a top surface thereof.

A filling layer may be located between pixel electrodes adjacent to each other in one direction among the plurality of pixel electrodes, and the emission defining layer overlaps the filling layer in a thickness direction of the substrate.

A display device may further include a plurality of connection electrodes respectively located between the plurality of pixel electrodes and the plurality of light emitting elements, wherein the filling layer is located between connection electrodes adjacent to each other in the one direction among the plurality of connection electrodes.

Top or bottom surfaces of the emission defining layer and the plurality of light emitting elements may be at a same plane, and the plurality of light emitting elements extend in a thickness direction of the substrate.

The plurality of light emitting elements may include a first semiconductor layer, a second semiconductor layer, and an active layer between the first semiconductor layer and the second semiconductor layer.

The common electrode layer may include the same material as the second semiconductor layer.

The plurality of light emitting elements may include a first light emitting element including a first active layer, and a second light emitting element including a second active layer different from the first active layer.

A minimum distance between the first light emitting element and the second light emitting element may be equal to a minimum width of the emission defining layer between the first light emitting element and the second light emitting element.

The plurality of light emitting elements may further include a third light emitting element including a third active layer different from the first active layer and the second active layer, the first active layer, the second active layer, and the third active layer each contain indium (In), an indium content of the first active layer is greater than an indium content of the second active layer and the third active layer, and an indium content of the second active layer is greater than an indium content of the third active layer.

Each of the plurality of light emitting elements may further include a protrusion protruding from the second semiconductor layer and located between the second semiconductor layer and the common electrode layer, and the protrusion includes the same material as the second semiconductor layer.

A first width of the second semiconductor layer in one direction may be greater than a second width of the protrusion in the one direction.

At least a part of a top surface of the second semiconductor layer may be covered by the emission defining layer.

According to one or more embodiments of the present disclosure, a display device includes a plurality of pixel electrodes spaced from each other on a substrate, a common electrode layer on the plurality of pixel electrodes, an emission defining layer between the pixel electrodes and the common electrode layer and having a plurality of openings, and a plurality of light emitting elements in the plurality of openings of the emission defining layer on the pixel electrodes, wherein a maximum width of the plurality of openings is equal to a maximum width of each of the plurality of light emitting elements.

A minimum width of the plurality of openings may be equal to a minimum width of each of the plurality of light emitting elements.

According to one or more embodiments of the disclosure, a method for fabrication of a display device includes forming a common electrode layer including a first type semiconductor on a substrate, forming a hard mask on the common electrode layer, forming first openings penetrating the hard mask to expose the common electrode layer, forming a first light emitting element including a first type semiconductor layer, a first active layer, and a second type semiconductor layer in each of the first openings, forming second openings penetrating the hard mask to expose the common electrode layer, the second openings being spaced from the first openings, forming a second light emitting element including the first type semiconductor layer, a second active layer, and the second type semiconductor layer in each of the second openings, forming third openings penetrating the hard mask to expose the common electrode layer, the third openings being spaced from the second openings, and forming a third light emitting element including the first type semiconductor layer, a third active layer, and the second type semiconductor layer in each of the third openings, wherein the hard mask is in contact with a side surface of each of the first light emitting element, the second light emitting element, and the third light emitting element, and surrounds the side surface of each of the first light emitting element, the second light emitting element, and the third light emitting element.

One surface of each of the first light emitting element, the second light emitting element, and the third light emitting element and one surface of the hard mask may be at a same plane.

The first light emitting element, the second light emitting element, and the third light emitting element may have top and bottom surfaces with different widths.

The forming of a first opening from among the first openings on the common electrode layer may include forming the first opening by etching a part of the hard mask, and forming a sub-opening penetrating the hard mask to expose the common electrode layer in the first opening, wherein a width of the first opening is greater than a width of the sub-opening.

Each of the forming of the first light emitting element, the forming of the second light emitting element, and the forming of the third light emitting element may include forming a protrusion made of the same material as the common electrode layer in the sub-opening.

According to the display device according to the described embodiments, the light emitting element may be partitioned without the process of etching or exposing the sidewall of the light emitting element by forming an emission defining layer that partitions the light emitting element. Accordingly, defects in the light emitting element may be prevented or reduced.

According to the method for fabricating a display device according to the described embodiments, the light emitting element may be partitioned without the process of etching or exposing the sidewall of the light emitting element by forming the emission defining layer that partitions the light emitting element. Accordingly, defects in the light emitting element may be prevented or reduced.

However, the effects of the present disclosure are not limited to the aforementioned effects, and various other effects are included in the present specification.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

The present disclosure will now be described more fully hereinafter with reference to the accompanying drawings, in which one or more embodiments of the present disclosure are shown. This disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described in detail with reference to the accompanying drawings.

Figure 1:
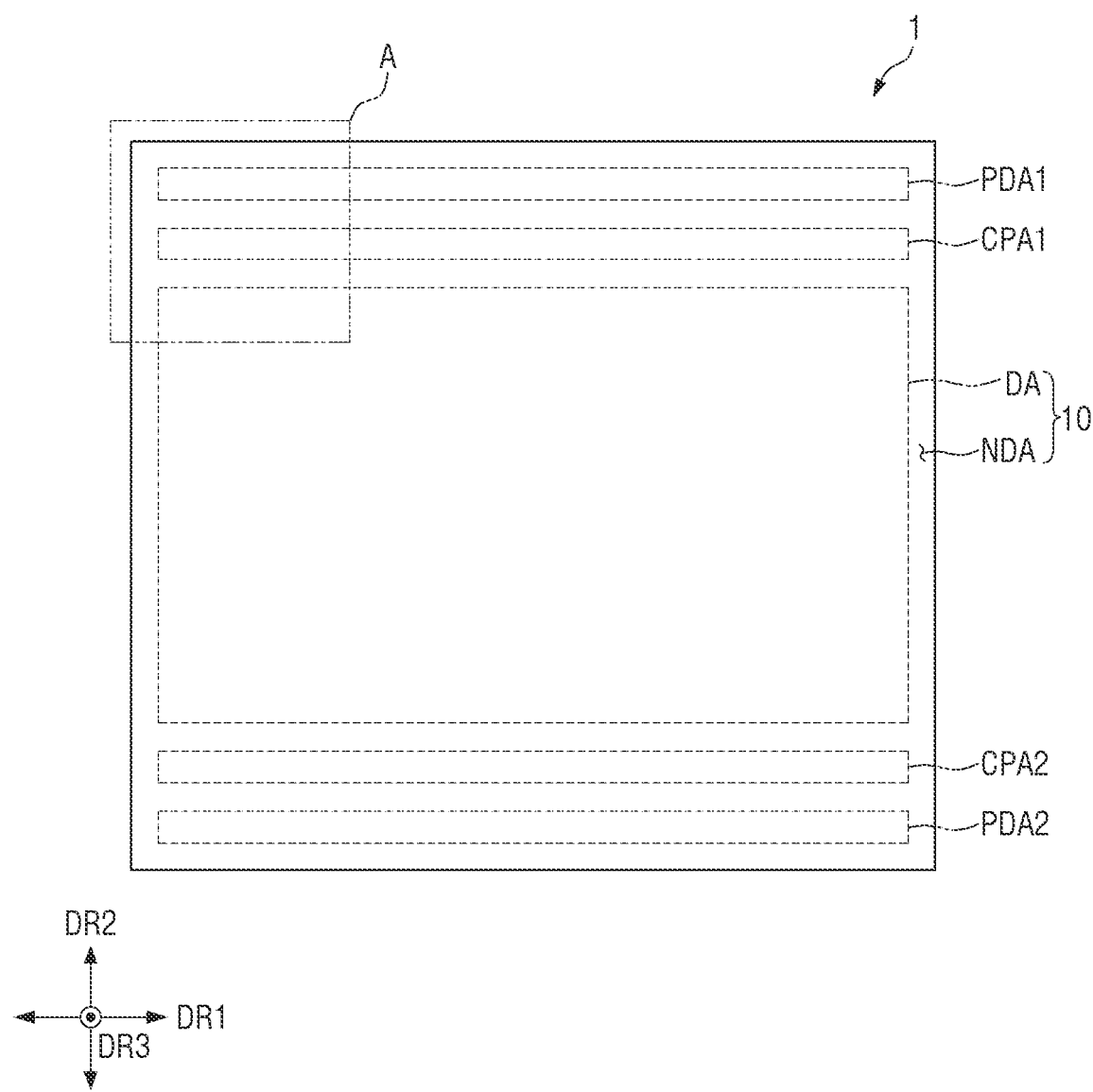
FIG. 1 is a plan view of a display device according to one or more embodiments.
Figure 2:
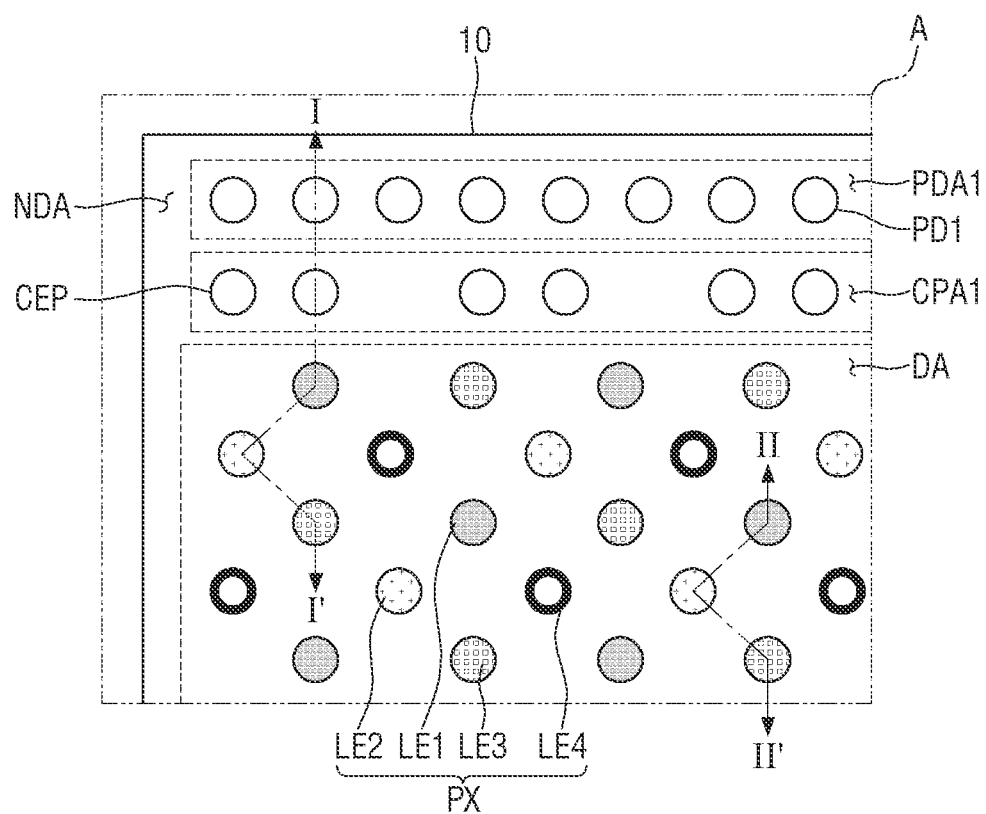
FIG. 2 is an enlarged plan view illustrating one example of an area A of FIG. 1.
Figure 2:

FIG. 1 is a plan view of a display device according to one or more embodiments, and FIG. 2 is an enlarged plan view illustrating one example of an area A of FIG. 1.

In FIGS. 1 to 2, a display device 1 according to one or more embodiments is mainly described as being an ultra-small light emitting diode display device (micro or nano light emitting diode display device) including an ultra-small light emitting diode (micro or nano light emitting diode) as a light emitting element LE, but embodiments of the present specification are not limited thereto.

In addition, in FIGS. 1 and 2, a first direction DR1 indicates a horizontal direction of a display panel 10, a second direction DR2 indicates a vertical direction of the display panel 10, and a third direction DR3 indicates a thickness direction of the display panel 10 or a thickness direction of the semiconductor circuit substrate 100. In this case, "left", "right", "upper" and "lower" indicate directions when the display panel 10 is viewed from above. For example, "right side" indicates one side of the first direction DR1, "left side" indicates the other side of the first direction DR1, "upper side" indicates one side of the second direction DR2, and "lower side" indicates the other side of the second direction DR2. Further, "upper portion" indicates one side of the third direction DR3, and "lower portion" indicates the other side of the third direction DR3.

Referring to FIGS. 1 and 2, a display device according to one or more embodiments includes the display panel 10 including a display area DA and a non-display area NDA.

The display panel 10 may have a quadrilateral planar shape having long sides in the first direction DR1 and short sides in the second direction DR2. However, the planar shape of the display panel 10 is not limited thereto, and may have a polygonal shape other than a quadrilateral shape, a circular shape, an elliptical shape, or an atypical shape.

The display area DA may be an area where an image is displayed, and the non-display area NDA may be an area where an image is not displayed. The non-display area NDA may be disposed to be around (or surround) the edge or periphery of display area DA. The non-display areas NDA may form a bezel of the display panel 10. Wires or circuit drivers included in the display panel 10 may be disposed in each of the non-display areas NDA, or external devices may be mounted thereon.

The display area DA of the display panel 10 may include a plurality of pixels PX. Each of the plurality of pixels PX may include a plurality of light emitting elements LE. Each of the pixels PX may include the one or more light emitting elements LE to display a specific color. The pixel PX includes the plurality of light emitting elements LE (LE1, LE2, LE3, and LE4), and the pixel PX may be defined as a minimum light emitting unit capable of displaying white light.

For example, the first light emitting element LE1 may emit light of a first color, the second light emitting element LE2 and the fourth light emitting element LE4 may emit light of a second color, and the third light emitting element LE3 may emit light of a third color. For example, the first color may be red, the second color may be green, and the third color may be blue. For example, the main peak wavelength of the first color light may be positioned between approximately 600 nm and 750 nm, the main peak wavelength of the second color light may be positioned between approximately 480 nm and 560 nm, and the main peak wavelength of the third color light may be positioned between approximately 370 nm and 460 nm, but the present disclosure is not limited thereto. For example, each of the light emitting elements LE may emit light of the same color, and any one of the light emitting elements LE may emit yellow light. The main peak wavelength of yellow light may be positioned between approximately 550 nm and 600 nm. In one or more embodiments, one pixel PX may include the four light emitting elements LE1, LE2, LE3, and LE4, but is not limited thereto.

Each of the light emitting elements LE may have a circular shape in a plan view. However, the present disclosure is not limited thereto, and the light emitting element LE may have a polygonal shape such as a quadrilateral shape or a pentagonal shape, an elliptical shape, or an atypical shape other than a circular shape.

The plurality of light emitting elements LE1, LE2, LE3, and LE4 may be disposed to be spaced from each other in the first direction DR1 and the second direction DR2. The first light emitting element LE1 and the third light emitting element LE3 may be alternately arranged along the first direction DR1 and the second direction DR2. The second light emitting element LE2 and the fourth light emitting element LE4 may be alternately arranged along the first direction DR1 and the second direction DR2.

The plurality of light emitting elements LE1, LE2, LE3, and LE4 may be alternately disposed in diagonal directions DD1 and DD2 between the first direction DR1 and the second direction DR2. The first diagonal direction DD1 may be a direction inclined at 45° relative to the first direction DR1 and the second direction DR2, and the second diagonal direction DD2 may be a direction orthogonal to the first diagonal direction DD1.

For example, the first light emitting element LE1 and the second light emitting element LE2 may be alternately arranged along the first diagonal direction DD1. The third light emitting element LE3 and the fourth light emitting element LE4 may be alternately arranged along the first diagonal direction DD1. The first light emitting element LE1 and the fourth light emitting element LE4 may be alternately arranged along the second diagonal direction DD2.

The area of the first light emitting element LE1, the area of the second light emitting element LE2, the area of the third light emitting element LE3, and the area of the fourth light emitting element LE4 may be substantially the same, but the present disclosure is not limited thereto. For example, the area of the first light emitting element LE1 may be greater than that of the second light emitting element LE2 to the fourth light emitting element LE4.

Each of the light emitting elements LE may be electrically connected to a pixel electrode AE in FIG. 5 of the semiconductor circuit substrate 100 in FIG. 5 through a first connection electrode CNE1 in FIG. 5, which will be described later. In addition, each of the light emitting elements LE may be electrically connected to the common electrode layer CEL of FIG. 5 of a display substrate 200 of FIG. 5.

Figure 5:
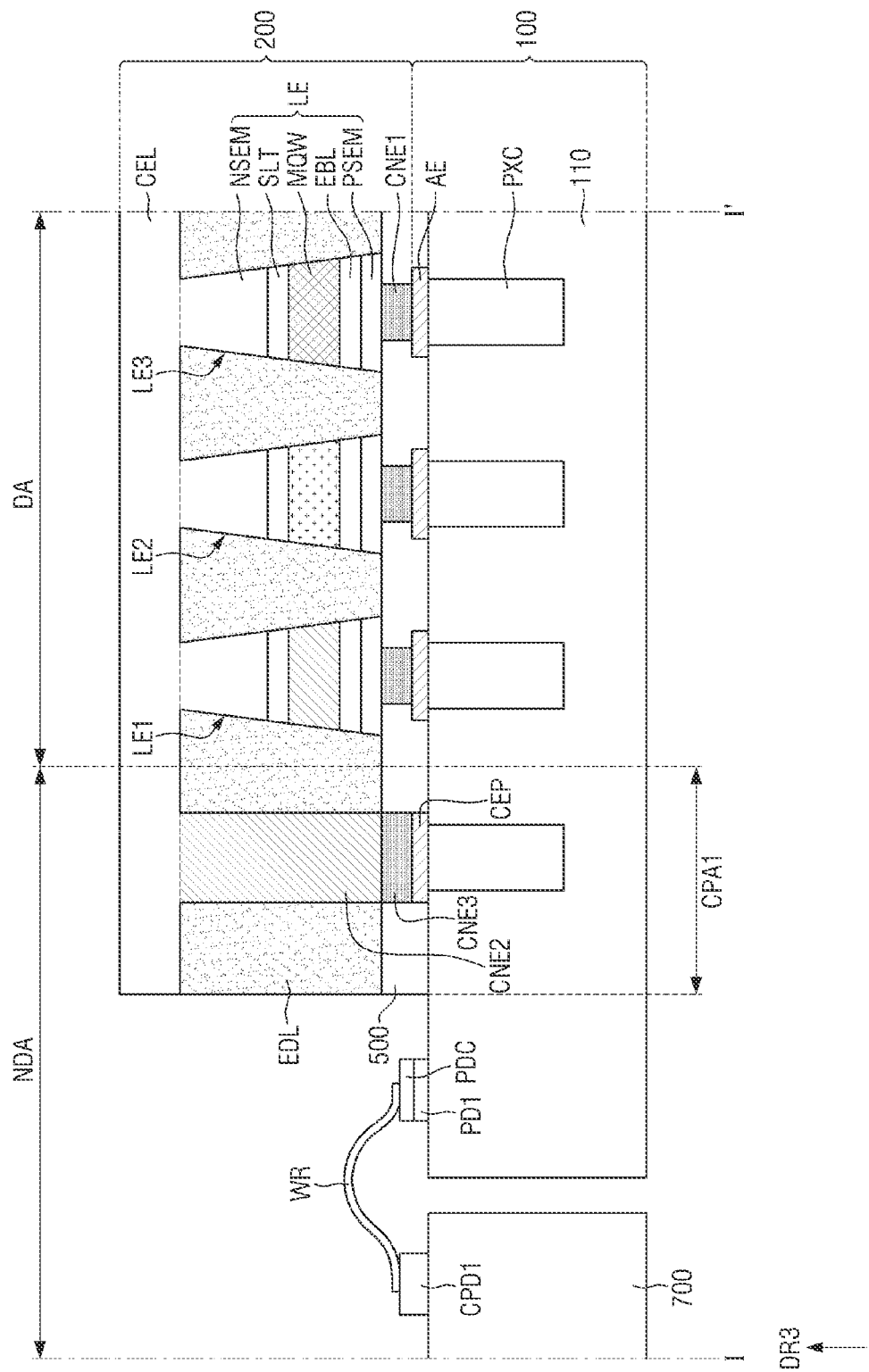
FIG. 5 is a cross-sectional view taken along the line I-I' of FIG. 2.

In one or more embodiments, the light emitting elements LE may be partitioned by an emission defining layer EDL in FIG. 5. The light emitting elements LE may have emission areas defined by the emission defining layer EDL. The emission defining layer EDL may be disposed to be around (or surround) each of the light emitting elements LE, and may be directly in contact with the side surface of the light emitting element LE. Accordingly, the light emitting elements LE may not be exposed to external foreign substances, for example, dust or air during the fabricating process of the display device. In addition, because each of the light emitting elements LE may be partitioned by the emission defining layer EDL, the light emitting element LE may be individualized without an etching process of the light emitting element LE. This will be described in detail with further reference to other drawings.

The non-display area NDA of the display panel 10 may include a first common electrode area CPA1, a second common electrode area CPA2, a first pad area PDA1, and a second pad area PDA2.

The first common electrode area CPA1 may be disposed between the first pad area PDA1 and the display area DA. The second common electrode area CPA2 may be disposed between the second pad area PDA2 and the display area DA. Each of the first common electrode area CPA1 and the second common electrode area CPA2 may include common electrode connection portions CEP. The common electrode connection portions CEP may be spaced from each other in the first direction DR1 in the common electrode areas CPA1 and CPA2, but the present disclosure is not limited thereto.

The common electrode connection portions CEP may be disposed on the semiconductor circuit substrate 100 to receive a common voltage from a pixel circuit unit PXC. As will be described later, the common electrode areas CPA1 and CPA2 may include a third connection electrode CNE3 being directly in contact with the common electrode connection portion CEP. The third connection electrode CNE3 may overlap each of the common electrode connection portions CEP. The third connection electrode CNE3 may be electrically connected to each of the common electrode connection portion CEP and the common electrode layer CEL.

The first pad area PDA1 may be disposed on the upper side of the display panel 10. The first pad area PDA1 may include first pads PD1 connected to a circuit board 700 of FIG. 5. The second pad area PDA2 may be disposed on the lower side of the display panel 10. The second pad area PDA2 may include second pads to be connected to the circuit board 700. In one or more embodiments, the second pad area PDA2 may be omitted.

The first pads PD1 may be electrically connected to the circuit board 700. The first pads PD1 may be arranged to be spaced from each other in the first direction DR1 in the first pad area PDA1. The disposition of the first pads PD1 may be designed according to the number of light emitting elements LE disposed in the display area DA and the disposition of wires electrically connected thereto. The disposition of different pads may be variously modified according to the disposition of the light emitting elements LE and the disposition of wires electrically connected thereto.

Figure 3:
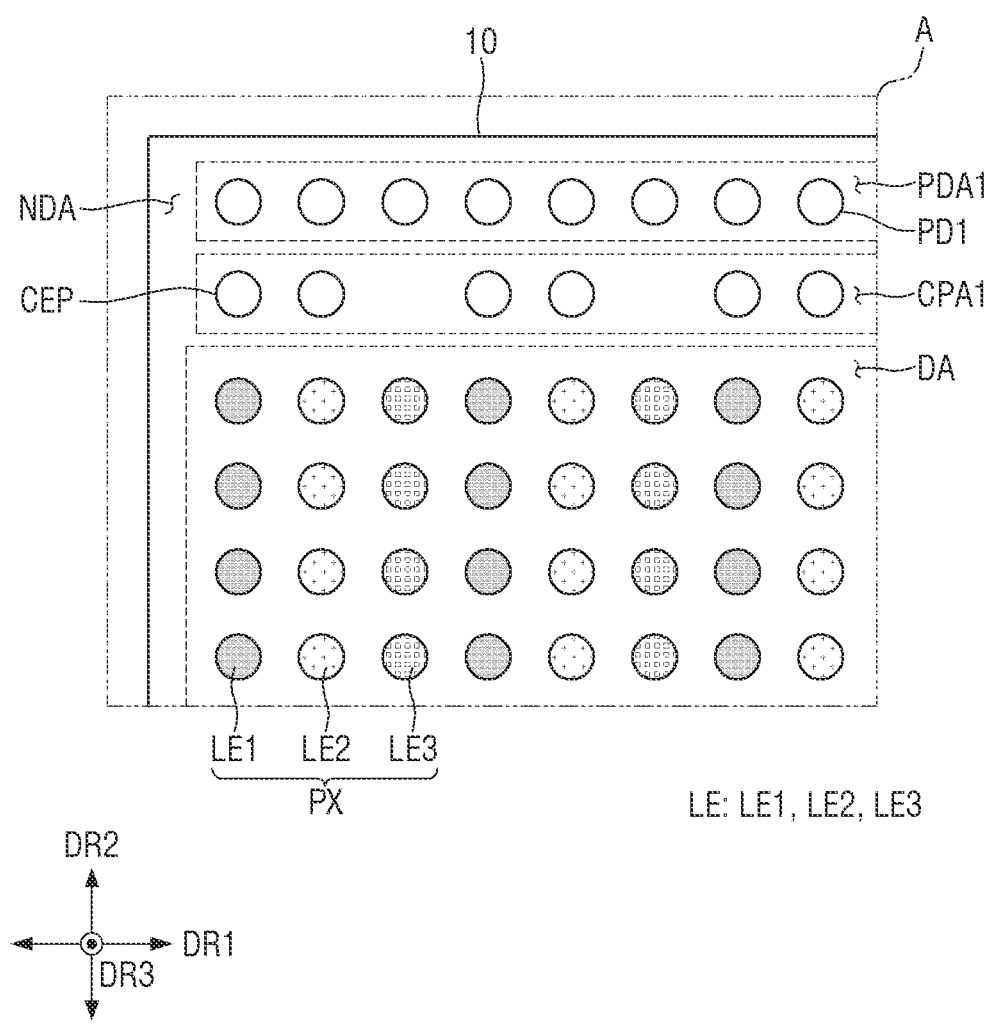
FIG. 3 is an enlarged plan view illustrating another example of the area A of FIG. 1.

FIG. 3 is an enlarged plan view illustrating an example of the area A of FIG. 1.

In FIG. 3, one pixel PX may be constituted with three light emitting elements including the first light emitting element LE1, the second light emitting element LE2, and the third light emitting element LE3. The pixels PX may be arranged in a matrix direction similar to the light emitting elements LE. For example, the pixels PX may be arranged along the rows and columns of a matrix.

For example, one pixel PX may include the first light emitting element LE1, the second light emitting element LE2, and the third light emitting element LE3. The first light emitting element LE1 may emit light of a first color, the second light emitting element LE2 may emit light of a second color, and the third light emitting element LE3 may emit light of a third color. For example, the first color may be red, the second color may be green, and the third color may be blue. However, the present disclosure is not limited thereto, and each of the light emitting elements LE may emit light having the same color. In one or more embodiments, one pixel PX may include the three light emitting elements LE1, LE2, and LE3, but is not limited thereto.

Each of the light emitting elements LE may have a circular shape in a plan view. However, the present disclosure is not limited thereto, and the light emitting element LE may have a polygonal shape such as a quadrilateral shape or a pentagonal shape, an elliptical shape, or an atypical shape other than a circular shape.

The plurality of light emitting elements LE1, LE2, and LE3 may be disposed to be spaced from each other in the first direction DR1 and the second direction DR2. The first light emitting element LE1, the second light emitting element LE2, and the third light emitting element LE3 may be alternately arranged along the first direction DR1, and each of the plurality of first light emitting elements LE1, second light emitting elements LE2, and third light emitting elements LE3 may be repeatedly disposed in the second direction DR2. The first light emitting element LE1, the second light emitting element LE2, and the third light emitting element LE3 may be sequentially arranged along the first direction DR1, and this arrangement may be repeated.

The area of the first light emitting element LE1, the area of the second light emitting element LE2, and the area of the third light emitting element LE3 may be substantially the same, but is not limited thereto. For example, the area of the first light emitting element LE1 may be greater than that of the second light emitting element LE2 and the third light emitting element LE3.

Figure 4:
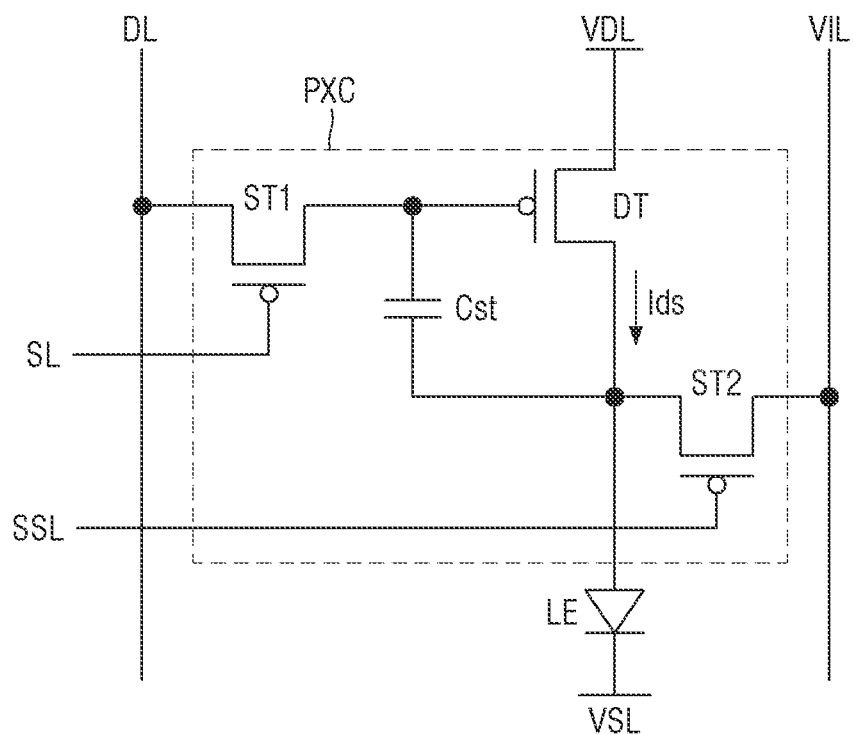
FIG. 4 is a circuit diagram of a pixel circuit unit and a light emitting element according to one or more embodiments.

FIG. 4 is a circuit diagram of a pixel circuit unit and a light emitting element according to one or more embodiments.

Referring to FIG. 4, each of the plurality of pixels PX may include the light emitting element LE and the pixel circuit unit PXC controlling the emission amount of the light emitting element LE.

The light emitting element LE emits light according to a driving current Ids. The emission amount of the light emitting element LE may be proportional to the driving current Ids. The light emitting element LE may be an inorganic light emitting element including an anode electrode, a cathode electrode, and an inorganic semiconductor disposed between the anode electrode and the cathode electrode. For example, the light emitting element LE may be a micro light emitting diode.

The anode electrode of the light emitting element LE may be connected to the source electrode of a driving transistor DT, and the cathode electrode thereof may be connected to a second power line VSL to which a low potential voltage lower than the high potential voltage is supplied. The circuit diagram of FIG. 4 exemplifies a case where the anode electrode of the light emitting element LE is the pixel electrode AE in FIG. 5 and the cathode electrode is the common electrode connection portion CEP in FIG. 5.

The driving transistor DT adjusts a current flowing from the first power line VDL, to which the first source voltage is applied, to the light emitting element LE according to a voltage difference between a gate electrode and the source electrode of the driving transistor DT. The gate electrode of the driving transistor DT may be connected to the first electrode of the first transistor ST1, the source electrode thereof may be connected to the anode electrode of the light emitting element LE, and the drain electrode thereof may be connected to the first power line VDL to which a high potential voltage is applied.

The first transistor ST1 is turned on by a scan signal applied from the scan line SL to connect the data line DL to the gate electrode of the driving transistor DT. The gate electrode of the first transistor ST1 may be connected to the scan line SL, the first electrode thereof may be connected to the gate electrode of the driving transistor DT, and the second electrode thereof may be connected to the data line DL.

A second transistor ST2 is turned on by the sensing signal of a sensing signal line SSL to connect an initialization voltage line VIL to the source electrode of the driving transistor DT. The gate electrode of the second transistor ST2 may be connected to the sensing signal line SSL, the first electrode thereof may be connected to the initialization voltage line VIL, and the second electrode thereof may be connected to the source electrode of the driving transistor DT.

The first electrode of each of the first and second transistors ST1 and ST2 may be a source electrode, and the second electrode thereof may be a drain electrode, but it should be noted that the present disclosure is not limited thereto. That is, the first electrode of each of the first and second transistors ST1 and ST2 may be a drain electrode, and the second electrode thereof may be a source electrode.

The capacitor Cst is formed between the gate electrode and the source electrode of the driving transistor DT. The capacitor Cst stores a difference voltage between the gate voltage and the source voltage of the driving transistor DT.

However, this is only an example, and the pixel circuit unit PXC may have a structure that further includes a plurality of transistors.

In addition, although FIG. 4 illustrates a case where the driving transistor DT and the first and second transistors ST1 and ST2 are NMOS transistors, some or all of the transistors may also be provided as PMOS transistors.

Figure 6:
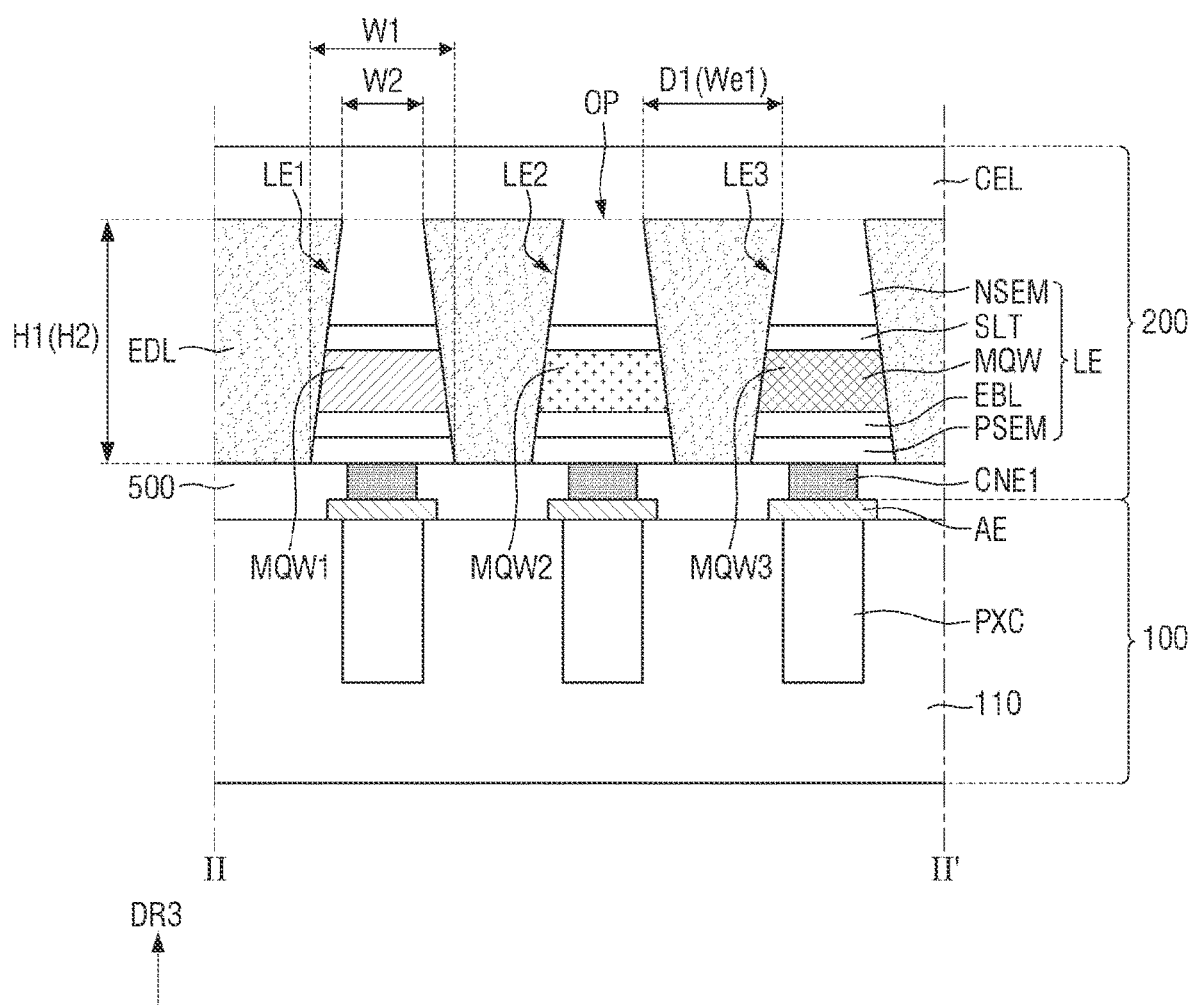
FIG. 6 is a cross-sectional view taken along the line II-II' of FIG. 2.

FIG. 5 is a cross-sectional view taken along the line I-I' of FIG. 2, and FIG. 6 is a cross-sectional view taken along line II-II' of FIG. 2. FIG. 5 illustrates a cross section across the plurality of light emitting elements LE and the common electrode connection portions CEP disposed in the non-display area NDA and the display area DA.

Referring to FIGS. 5 and 6, the display device 1 according to one or more embodiments may include the semiconductor circuit substrate 100 and the display substrate 200.

The semiconductor circuit substrate 100 may include a first substrate 110, a plurality of pixel circuit units PXC, the pixel electrodes AE, and the common electrode connection portions CEP. The display substrate 200 may include the light emitting elements LE, the emission defining layer EDL, the common electrode layer CEL, and the connection electrodes CNE1, CNE2, and CNE3. The display device 1 may further include a filling layer 500 disposed between the semiconductor circuit substrate 100 and the display substrate 200, and the circuit board 700 disposed in the non-display area NDA.

The first substrate 110 may be a silicon wafer substrate. The first substrate 110 may be made of monocrystalline silicon.

Each of the plurality of pixel circuit units PXC may be disposed on the first substrate 110. Each of the plurality of pixel circuit units PXC may include a complementary metal-oxide semiconductor (CMOS) circuit formed using a semiconductor process. Each of the plurality of pixel circuit units PXC may include at least one transistor formed by the semiconductor process. Further, each of the plurality of pixel circuit units PXC may further include at least one capacitor formed by the semiconductor process.

The plurality of pixel circuit units PXC may be disposed in the display area DA and the non-display area NDA. Among the plurality of pixel circuit units PXC, each of the pixel circuit units PXC disposed in the display area DA may be electrically connected to a pixel electrode AE corresponding thereto. That is, the plurality of pixel circuit units PXC and the plurality of pixel electrodes AE may be connected in a one-to-one correspondence. Each of the plurality of pixel circuit units PXC may apply an anode voltage to the pixel electrode AE.

Among the plurality of pixel circuit units PXC, each of the pixel circuit units PXC disposed in the non-display area NDA may be electrically connected to the corresponding common electrode connection portion CEP. Each of the plurality of pixel circuit units PXC may apply a cathode voltage from the second power line VSL in FIG. 4 to the common electrode connection portion CEP. The plurality of pixel circuit units PXC may overlap the common electrode connection portion CEP, the second connection electrode CNE2, and the third connection electrode CNE3 in the third direction DR3.

The plurality of pixel electrodes AE may be disposed in the display area DA, and each of them may be disposed on the pixel circuit unit PXC corresponding thereto. Each of the pixel electrodes AE may be an exposed electrode that is formed integrally with the pixel circuit unit PXC and exposed from the pixel circuit unit PXC. That is, each of the pixel electrodes AE may protrude from the top surface of the pixel circuit unit PXC. Each of the pixel electrodes AE may be supplied with an anode voltage from the pixel circuit unit PXC. The pixel electrode AE may include a metal material such as aluminum (Al).

The plurality of common electrode connection portions CEP may be disposed in the common electrode areas CPA1 and CPA2 of the non-display area NDA, and may each be disposed on the pixel circuit unit PXC corresponding thereto. The common electrode connection portion CEP may be an exposed electrode formed integrally with the pixel circuit unit PXC and exposed from the pixel circuit unit PXC. That is, each of the common electrode connection portions CEP may protrude from the top surface of the pixel circuit unit PXC. The common electrode connection portion CEP may include a metal material such as aluminum (Al).

The common electrode connection portions CEP may electrically connect the second power line VSL of the pixel circuit unit PXC, and the third connection electrode CNE3, the second connection electrode CNE2, and the common electrode layer CEL of the display substrate 200. Accordingly, the voltage applied to the common electrode layer CEL through the common electrode connection portion CEP may be applied to the light emitting element LE.

The plurality of first pads PD1 are disposed in the first pad area PDA1 in the non-display area NDA. The plurality of first pads PD1 are disposed to be spaced from the common electrode connection portion CEP. The plurality of first pads PD1 may be spaced from the common electrode connection portion CEP to the outside of the non-display area NDA.

A pad connection electrode PDC may be disposed on the first pad PD1. The pad connection electrode PDC may be in contact with the top surface of the first pad PD1 and may include the same material as the third connection electrode CNE3. The pad connection electrode PDC may be connected to the circuit pad CPD1 of the circuit board 700 through a conductive connection member such as a wire WR. That is, the first pad PD1, the pad connection electrode PDC, the wire WR, and the circuit pad CPD1 of the circuit board 700 may be electrically connected to each other.

In one or more embodiments, the semiconductor circuit substrate 100 and the circuit board 700 may be disposed on a lower substrate. The semiconductor circuit substrate 100 and the circuit board 700 may be attached to the top surface of the lower substrate using an adhesive member such as a pressure sensitive adhesive.

The circuit board 700 may be a flexible printed circuit board (FPCB), a printed circuit board (PCB), a flexible printed circuit (FPC), or a flexible film such as a chip on film (COF).

The display substrate 200 may include the plurality of light emitting elements LE, the emission defining layer EDL defining them, and the common electrode layer CEL, and may be disposed on the semiconductor circuit substrate 100. The light emitting elements LE may be disposed to correspond to the plurality of pixel electrodes AE of the semiconductor circuit substrate 100.

The emission defining layer EDL (or a partition wall) may be disposed between the common electrode layer CEL and the pixel electrode AE of the semiconductor circuit substrate 100. The emission defining layer EDL may overlap the common electrode layer CEL without overlapping the pixel electrode AE, and may be directly in contact with the bottom surface of the common electrode layer CEL. The emission defining layer EDL may include a plurality of openings (refer to FIGS. 11, 13, and 15) exposing the common electrode layer CEL. Openings OP may provide a space in which the light emitting element LE of each pixel PX is formed, and may define an emission area thereof. That is, the emission defining layer EDL is disposed to surround each of the light emitting elements LE, and may be disposed directly on the side surface of each of the light emitting elements LE. The light emitting element LE may be disposed in the emission defining layer EDL, and the opening OP of the emission defining layer EDL may determine a growth area of the light emitting element LE. Thus, at least one surfaces of the light emitting element LE and the emission defining layer EDL may be flat to each other (e.g., at a same plane). For example, at least one of the top surface and bottom surface of the emission defining layer EDL and the light emitting element LE may be flat. In the drawings, it is illustrated that all of the top surface and the bottom surface of the emission defining layer EDL and the light emitting element LE are flat. In this case, a height H1 of the emission defining layer EDL and a height H2 of the light emitting element LE may be the same. Here, the top surface may be a surface in contact with the common electrode layer CEL, and may be defined as one surface of a second semiconductor layer NSEM of the light emitting element LE. The bottom surface may be a surface in contact with the first connection electrode CNE1 and may be defined as one surface of a first semiconductor layer PSEM of the light emitting element LE. In one or more embodiments, the height H1 of the emission defining layer EDL may be different from the height H2 of the light emitting element LE, and in this case, the top surface and/or the bottom surface of the emission defining layer EDL and the light emitting element LE may not be flat.

The emission defining layer EDL may protect the light emitting element LE from foreign substances such as dust or air, and may insulate the light emitting element LE from other layers. The emission defining layer EDL may include an inorganic insulating material such as silicon nitride (SiNx), silicon oxide (SiOx), silicon oxynitride (SiOxNy), aluminum oxide (AlOy), aluminum nitride (AlNx), or the like.

On the other hand, when the light emitting element is individualized by dry etching, a sidewall effect in which a sidewall of the light emitting element is chemically or structurally damaged may occur. For example, the sidewall of the light emitting element may be damaged by an etching etchant in a dry etching process. In this case, non-radiative recombination in which electrons and holes recombine without generating light on the sidewall of the light emitting element may occur, which may lead to a decrease in internal quantum efficiency (IQE/EQE), and deterioration due to heating may occur.

In the display device 1 according to the present embodiment, because the opening OP of the emission defining layer EDL provides a space for forming the light emitting element LE, the width, height, position, and shape of the opening OP of the emission defining layer EDL, the distance between the openings OP, and the like may be substantially the same as the width, height, position, and shape of the light emitting element LE, the distance between the light emitting elements LE, and the like. Accordingly, although the sidewall of the light emitting element LE is not etched, the emission area of the light emitting element LE is defined, and because each of the light emitting elements LE may be individualized, a sidewall effect of the light emitting element LE may be prevented or reduced. Accordingly, defects of the light emitting element LE may be prevented or reduced, and light efficiency may be improved.

The light emitting elements LE may be disposed in each of the openings OP of the emission defining layer EDL. Each of the light emitting elements LE may be an inorganic light emitting diode element. The light emitting elements LE may include a plurality of semiconductor layers NSEM, PSEM, EBL, and SLT and an active layer MQW. The light emitting elements LE may be electrically connected to the pixel circuit unit PXC of the semiconductor circuit substrate 100 to emit light from the active layer MQW.

Each of the light emitting elements LE may have a shape extending in the third direction DR3 (i.e., the thickness direction of the first substrate 110). A length in the third direction DR3 of the light emitting element LE may be longer than a length in a horizontal direction, and as one example, a length of the light emitting element LE in the third direction DR3 may be approximately 1 to 5 μm. The light emitting element LE may have a cylindrical shape that is longer in width than in height, a disc shape, or a rod shape. However, the present disclosure is not limited thereto, and the light emitting element LE may have various shapes, such as a rod shape, a wire shape, a tube shape, a polygonal prism shape such as a regular cube, a rectangular parallelepiped and a hexagonal prism, or a shape extending in one direction and having a partially inclined outer surface.

According to one or more embodiments, each of the light emitting elements LE may include the first semiconductor layer PSEM, the electron blocking layer EBL, the active layer MQW, the superlattice layer SLT, and the second semiconductor layer NSEM. The first semiconductor layer PSEM, the electron blocking layer EBL, the active layer MQW, the superlattice layer SLT, and the second semiconductor layer NSEM may be sequentially stacked in the third direction DR3.

The first semiconductor layer PSEM may be a p-type semiconductor, and may include a semiconductor material having a chemical formula of $Al_xGa_yIn1-x-yN$ ($0 \le x \le 1$, $0 \le y \le 1$, $0 \le x+y \le 1$). For example, it may be any one or more of p-type doped AlGaInN, GaN, AlGaN, InGaN, AlN and InN. The first semiconductor layer PSEM may be doped with a p-type dopant, and the p-type dopant may be Mg, Zn, Ca, Ba, or the like. For example, the first semiconductor layer PSEM may be p-GaN doped with p-type Mg. The first semiconductor layer PSEM may have a thickness in a range of 30 nm to 200 nm.

The electron blocking layer EBL may be disposed on the first semiconductor layer PSEM. The electron blocking layer EBL may prevent electrons flowing into the active layer MQW from being injected into another layer without being recombined with holes in the active layer MQW. For example, the electron blocking layer EBL may be p-AlGaN doped with p-type Mg. The thickness of the electron blocking layer EBL may be within a range of 10 nm to 50 nm, but the present disclosure is not limited thereto. In one or more embodiments, the electron blocking layer EBL may be omitted.

The active layer MQW may be disposed on the electron blocking layer EBL. The active layer MQW may emit light due to recombination of the electrons and the holes in response to the light emitting signal applied through the first semiconductor layer PSEM and the second semiconductor layer NSEM. The active layer MQW may include a material having a single or multiple quantum well structure. When the active layer MQW contains a material having a multiple quantum well structure, the active layer MQW may have the structure in which a plurality of well layers and barrier layers are alternately laminated. At this time, the well layer may be formed of InGaN, and the barrier layer may be formed of GaN or AlGaN, but the present disclosure is not limited thereto. For example, the active layer MQW may have a structure in which semiconductor materials having large band gap energy and semiconductor materials having small band gap energy are alternately stacked, and may include other Group III to Group V semiconductor materials according to the wavelength band of the emitted light.

The superlattice layer SLT is disposed on the active layer MQW. The superlattice layer SLT may reduce stress due to the difference in lattice constant between the second semiconductor layer NSEM and the active layer MQW. For example, the superlattice layer SLT may be formed of InGaN or GaN. The thickness of the superlattice layer SLT may be about 50 nm to 200 nm. However, in one or more embodiments, the superlattice layer SLT may be omitted.

The second semiconductor layer NSEM may be disposed on the superlattice layer SLT. The second semiconductor layer NSEM may be an n-type semiconductor. The second semiconductor layer NSEM may include a semiconductor material having a chemical formula of $Al_xGa_yIn1-x-yN$ ($0 \le x \le 1$, $0 \le y \le 1$, $0 \le x+y \le 1$). For example, it may be any one or more of n-type doped AlGaInN, GaN, AlGaN, InGaN, AlN and InN. The second semiconductor layer NSEM may be doped with an n-type dopant, and the n-type dopant may be Si, Ge, Sn, or the like. For example, the second semiconductor layer NSEM may be n-GaN doped with n-type Si. The thickness of the second semiconductor layer NSEM may be in a range of 500 nm to 1 µm, but is not limited thereto.

According to one or more embodiments, some of the light emitting elements LE of the display device 1 may include the different active layers MQW to emit light of different colors. For example, the first light emitting element LE1 may include a first active layer MQW1 to emit red light of a first color, the second light emitting element LE2 and the fourth light emitting element LE4 may include a second active layer MQW2 to emit green light of a second color, and the third light emitting element LE3 may include a third active layer MQW3 to emit blue light of a third color. Each of the first light emitting element LE1, the second light emitting element LE2, the third light emitting element LE3, and the fourth light emitting element LE4 may have different concentrations of dopants doped in the first semiconductor layer PSEM, the electron blocking layer EBL, the active layer MQW, the superlattice layer SLT, and the second semiconductor layer NSEM, or in the chemical formula of $Al_xGa_yIn1-x-yN$ ($0 \le x \le 1$, $0 \le y \le 1$, $0 \le x+y \le 1$), the 'x' and 'y' values may be different from each other. The first to fourth light emitting elements LE1, LE2, LE3, and LE4 may have substantially the same structure and material, but may emit light of different colors due to different component ratios of the semiconductor layers.

For example, when the active layers MQW1, MQW2, and MQW3 include InGaN, each layer may emit light whose color may vary according to the content of indium (In). For example, as the content of indium (In) increases, the wavelength band of the light emitted by the active layer may move to the red wavelength band, and as the content of indium (In) decreases, the wavelength band of the light emitted by the active layer may move to the blue wavelength band. Accordingly, the content of indium (In) in the first active layer MQW1 may be higher than the content of indium (In) in each of the second active layer MQW2 and the third active layer MQW3. In addition, the content of indium (In) in the second active layer MQW2 may be higher than the content of indium (In) in the third active layer MQW3. For example, the content of indium (In) in the third active layer MQW3 may be approximately 10 to 20%, the content of indium (In) in the second active layer MQW2 may be approximately 20 to 30%, and the content of indium (In) in the first active layer MQW1 may be 30 to 45%. That is, by adjusting the content of indium (In) in the active layer MQW, the light emitting elements LE may emit light of different colors.

Because the emission defining layer EDL is disposed to fill all the spaces between the light emitting elements LE, a minimum distance D1 between two adjacent light emitting elements LE may be the same as a minimum width We1 of the emission defining layer EDL disposed therebetween. For example, the minimum distance D1 between the first light emitting element LE1 and the second light emitting element LE2 may be the same as the minimum width We1 of the emission defining layer EDL disposed therebetween. For another example, the minimum distance D1 between the second light emitting element LE2 and the third light emitting element LE3 may be the same as the minimum width We1 of the emission defining layer EDL disposed therebetween.

The light emitting elements LE may have a shape in which the widths of the top surface and the bottom surface are different from each other. For example, each of the light emitting elements LE may have a shape in which a width W1 of the bottom surface is greater than a width W2 of the top surface. The light emitting elements LE may have a trapezoidal shape in cross-sectional view, but are not limited thereto. For example, the light emitting elements LE may have a shape whose side surface includes a curved portion in cross-sectional view. In other words, the widths of the light emitting elements LE may increase as they approach the semiconductor circuit substrate 100, and the widths thereof may decrease as they approach the common electrode layer CEL. However, the present disclosure is not limited thereto, and the light emitting elements LE may have a rectangular shape in cross-sectional view, in which the widths of the top surface and the bottom surface are the same.

The display device 1 according to the present embodiment includes the light emitting element LE having a shape in which the width W1 of the bottom surface is greater than the width W2 of the top surface, so that the area of the active layer MQW of the light emitting element LE may increase as they approach the semiconductor circuit substrate 100 compared to a case where the light emitting element LE has the same width in the third direction DR3. When the area of the active layer MQW of the light emitting element LE increases, the photocurrent flowing through the active layer MQW increases, so that the emission amount of the light emitting element LE may increase.

The common electrode layer CEL may be disposed on the emission defining layer EDL. The common electrode layer CEL may be connected to the second semiconductor layer NSEM as one common layer. The common electrode layer CEL may be disposed over the entire surface of the display substrate 200 regardless of the light emitting elements LE.

The common electrode layer CEL may be an n-type semiconductor including the same material as the second semiconductor layer NSEM. The common electrode layer CEL may include a semiconductor material having a chemical formula of $Al_xGa_yIn1-x-yN$ ($0 \leq x \leq 1$, $0 \leq y \leq 1$, $0 \leq x+y \leq 1$). For example, it may be any one or more of n-type doped AlGaInN, GaN, AlGaN, InGaN, AlN and InN. The common electrode layer CEL may be doped with an n-type dopant, and the n-type dopant may be Si, Ge, Sn, or the like. For example, the common electrode layer CEL may be n-GaN doped with n-type Si.

In the drawings, it is exemplified that the common electrode layer CEL is integrated by including the same material as that of the second semiconductor layer NSEM, but the present disclosure is not limited thereto. In one or more embodiments, the common electrode layer CEL may also be disposed as a separate layer including a material different from that of the second semiconductor layer NSEM. The common electrode layer CEL may also be electrically connected to the second semiconductor layer NSEM without being integrated with the second semiconductor layer NSEM.

The plurality of connection electrodes CNE (CNE1, CNE2, and CNE3) may be disposed between the display substrate 200 and the semiconductor circuit substrate 100. The connection electrodes CNE1, CNE2, and CNE3 may include the first connection electrode CNE1 disposed between the light emitting element LE and the pixel electrode AE, and the second connection electrode CNE2 and the third connection electrode CNE3 disposed between the common electrode layer CEL and the common electrode connection portion CEP.

The first connection electrode CNE1 may be disposed to correspond to the light emitting elements LE and the pixel electrode AE in the display area DA. The first connection electrode CNE1 may be disposed on one surface of the first semiconductor layer PSEM of the light emitting elements LE.

The first connection electrode CNE1 may be directly disposed on the pixel electrode AE, and may be electrically connected to the pixel electrode AE to transmit an emission signal applied to the pixel electrode AE to the light emitting element LE. The width of the first connection electrode CNE1 may be formed to be smaller than the width of the light emitting element LE, but is not limited thereto. The first connection electrode CNE1 may serve as a bonding metal to adhere the pixel electrode AE and the light emitting elements LE to each other in a fabricating process. The first connection electrode CNE1 may include a material that may be electrically connected to the pixel electrode AE and the light emitting elements LE. For example, the first connection electrode CNE1 may include at least one of gold (Au), copper (Cu), aluminum (Al), or tin (Sn), or may include a transparent conductive oxide such as indium tin oxide (ITO) or indium zinc oxide (IZO). Alternatively, the first connection electrode CNE1 may include a first layer containing any one of gold (Au), copper (Cu), aluminum (Al), and tin (Sn), and a second layer containing another one of gold (Au), copper (Cu), aluminum (Al), and tin (Sn).

The second connection electrode CNE2 and the third connection electrode CNE3 may be disposed to correspond to the common electrode connection portions CEP in the common electrode area CPA1. The second connection electrode CNE2 may be disposed on the common electrode connection portion CEP, and the third connection electrode CNE3 may be disposed between the second connection electrode CNE2 and the common electrode connection portion CEP.

The second connection electrode CNE2 may have a shape extending in one direction and may be disposed in the opening of the emission defining layer EDL. The height of the second connection electrode CNE2 in the third direction DR3 may be the same as the height H1 of the emission defining layer EDL. In this case, the bottom surfaces of the second connection electrode CNE2 and the emission defining layer EDL may be flat, but the present disclosure is not limited thereto.

The third connection electrode CNE3 may be directly disposed on and may be in contact with the common electrode connection portion CEP. The third connection electrode CNE3 may be electrically connected to the common electrode connection portion CEP, and may also be electrically connected to any one of the pads through the pixel circuit unit PXC disposed in the non-display area NDA.

The second connection electrode CNE2 and the third connection electrode CNE3 may include a material that may be electrically connected to the common electrode connection portion CEP. For example, the second connection electrode CNE2 and the third connection electrode CNE3 may include at least one of gold (Au), copper (Cu), aluminum (Al), or tin (Sn). Alternatively, the second connection electrode CNE2 and the third connection electrode CNE3 may include a first layer including any one of gold (Au), copper (Cu), aluminum (Al), and tin (Sn) and a second layer including another one of gold (Au), copper (Cu), aluminum (Al), and tin (Sn).

The filling layer 500 may be disposed between the semiconductor circuit substrate 100 and the display substrate 200. The filling layer 500 may fill a space formed between the first substrate 110 and the common electrode layers CEL by a height difference between the pixel electrode AE and the common electrode connection portion CEP of the semiconductor circuit substrate 100, and the light emitting elements LE of the display substrate 200. For example, the filling layer 500 may fill a space formed between the pixel electrodes AE adjacent to each other in the horizontal direction, between the first connection electrodes CNE1 adjacent to each other in the horizontal direction, and between the common electrode connection portions CEP. The filling layer 500 may be an area filled with air or a vacuum area. The filling layer 500 may serve to insulate the exposed electrodes. The filling layer 500 is not limited thereto, and may include an inorganic insulating material such as silicon oxide (SiOx), silicon nitride (SiNx), or silicon oxynitride (SiOxNy), or may include an organic insulating material.

According to one or more embodiments, in the display device 1, the respective second semiconductor layers NSEM of the light emitting elements LE may be electrically connected to each other. For example, the common electrode layer CEL may include the same material as the second semiconductor layer NSEM, and each of the second semiconductor layers NSEM of the light emitting elements LE may be integrated with the common electrode layer CEL. In the display substrate 200, the plurality of second semiconductor layers NSEM may partially protrude from the common electrode layer CEL to form patterns that are spaced from each other.

The common electrode layer CEL may be electrically connected to the third connection electrode CNE3 disposed in the common electrode areas CPA1 and CPA2, and may be electrically connected to the common electrode connection portion CEP of the semiconductor circuit substrate 100. In one or more embodiments, the emission defining layer EDL may not be disposed on the common electrode areas CPA1 and CPA2 of one surface of the common electrode layer CEL, and the third connection electrode CNE3 may be directly disposed thereon. The common electrode layer CEL may be electrically connected to the second semiconductor layer NSEM of the light emitting elements LE in the display area DA.

The light emitting elements LE may be commonly electrically connected to the common electrode layer CEL, but the first semiconductor layers PSEM of the different light emitting elements LE1, LE2, LE3, and LE4 may be electrically connected to the different pixel circuit units PXC on the semiconductor circuit substrate 100. For example, one ends of the plurality of light emitting elements LE may be electrically connected to different pixel electrodes AE of the semiconductor circuit substrate 100 through the first connection electrode CNE1. The other ends of the light emitting elements LE may be electrically connected to the common electrode connection portion CEP of the semiconductor circuit substrate 100 through the common electrode layer CEL, the second connection electrode CNE2, and the third connection electrode CNE3. Each of the different light emitting elements LE1, LE2, LE3, and LE4 may have one end electrically connected to each of the pixel circuit units PXC of the semiconductor circuit substrate 100, and the other end electrically connected to the pixel circuit unit PXC of the semiconductor circuit substrate 100 through the common electrode layer CEL. The third connection electrode CNE3 and the common electrode layer CEL may serve as a common electrode of the light emitting elements LE.

In the display device 1 according to the present embodiment, because the light emitting elements LE may be individualized without a process of etching the light emitting elements LE by the emission defining layer EDL, sidewall defects caused by etching may be suppressed or reduced. In addition, because the light emitting element LE having a shape in which the width W1 of the bottom surface is greater than the width W2 of the top surface may include the active layer MQW having a relatively large area, the emission amount may increase.

Hereinafter, a fabricating process of the display device 1 will be described with further reference to other drawings.

Figure 7:
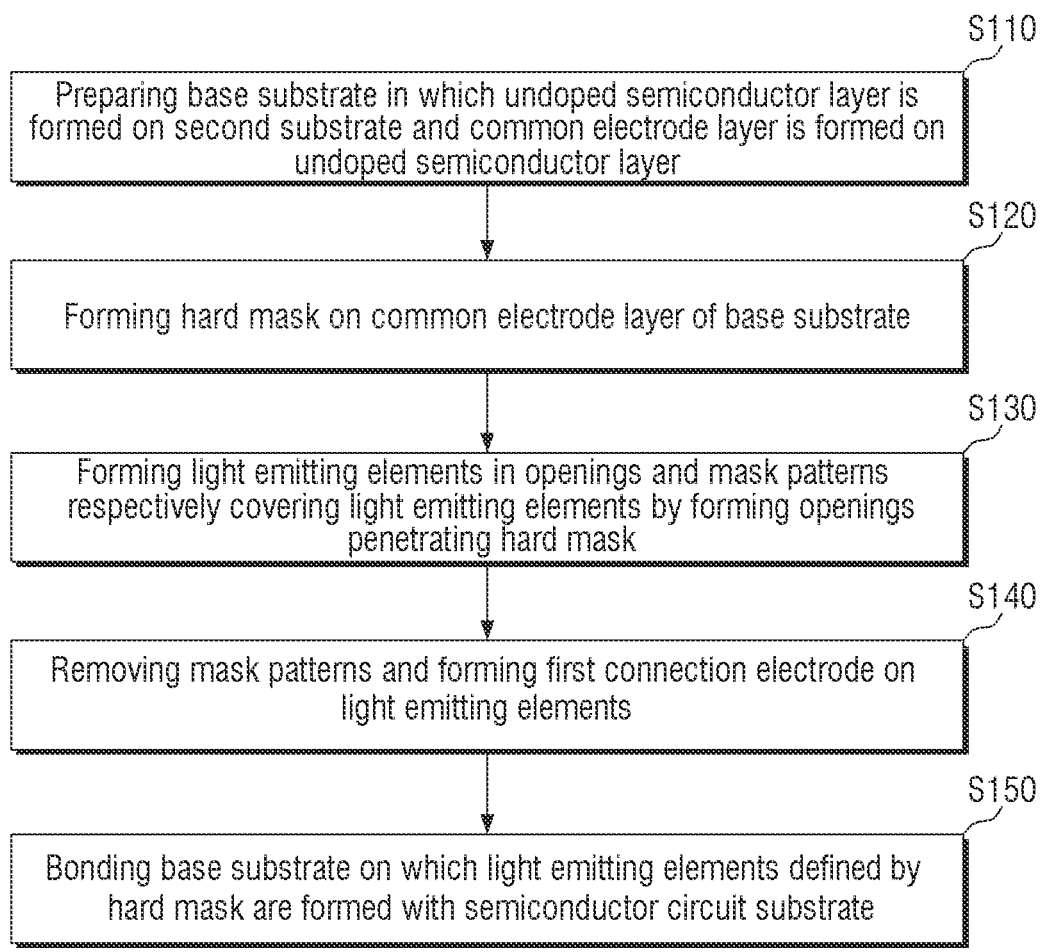
FIG. 7 is a flowchart showing a method of fabricating a display device according to one or more embodiments.
Figure 8:
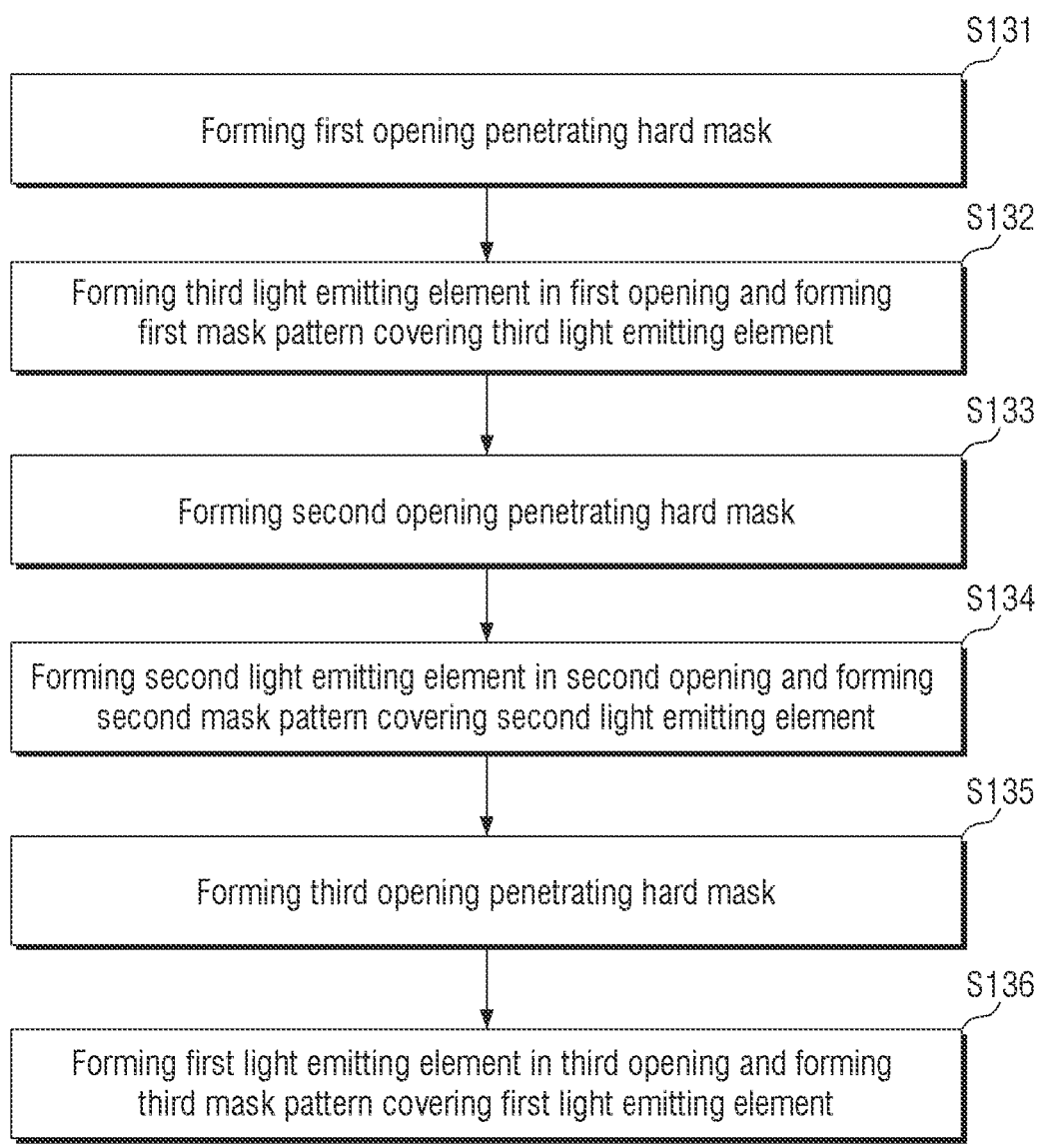
FIG. 8 is a flowchart illustrating an example of the fabricating method of S130 of FIG. 7.

FIG. 7 is a flowchart showing a method of fabricating a display device according to one or more embodiments. FIG. 8 is a flowchart illustrating an example of the fabricating method of S130 of FIG. 7.

Referring to FIG. 7, the method for fabricating the display device 1 according to one or more embodiments may include preparing a base substrate SUB in which an undoped semiconductor layer USEM is formed on a second substrate 210 and the common electrode layer CEL is formed on the undoped semiconductor layer USEM (S110), forming a hard mask HM on the common electrode layer CEL of the base substrate SUB (S120), forming the light emitting elements LE in a plurality of openings OP and mask patterns MK1, MK2 and MK3 respectively covering the light emitting elements LE by forming the plurality of openings OP penetrating the hard mask HM (S130), removing the mask patterns MK1, MK2 and MK3 and forming the first connection electrode CNE1 on the light emitting elements LE (S140), and bonding the base substrate SUB on which the light emitting elements LE defined by the hard mask HM are formed with the semiconductor circuit substrate 100 (S150).

The method for fabricating the display device 1 may include a process of preparing each of the semiconductor circuit substrate 100 and the display substrate 200 and then bonding them together. In the fabricating process of the display substrate 200, a process may be performed in which preparing the base substrate SUB including the undoped semiconductor layer USEM and the common electrode layer CEL and forming the plurality of light emitting elements LE thereon. The light emitting elements LE may include active layers the MQW1, MQW2, and MQW3 having different materials, and may be formed by layers of different materials according to positions.

Referring to FIG. 8, the S130 of forming the light emitting elements LE in a plurality of openings OP and mask patterns MK1, MK2 and MK3 respectively covering the light emitting elements LE by forming the plurality of openings OP penetrating the hard mask HM according to one or more embodiments will be described in detail.

The S130 may further include forming a first opening OP1 penetrating the hard mask HM (S131), forming the third light emitting element LE3 in the first opening OP1 and forming the first mask pattern MK1 covering the third light emitting element LE3 (S132), forming a second opening OP2 penetrating the hard mask HM (S133), forming the second light emitting element LE2 in the second opening OP2 and forming the second mask pattern MK2 covering the second light emitting element LE2 (S134), forming a third opening OP3 penetrating the hard mask HM (S135), and forming the first light emitting element LE1 in the third opening OP3 and forming the third mask pattern MK3 covering the first light emitting element LE1 (S136).

Hereinafter, the method for fabricating the display device 1 will be described in detail with further reference to other drawings.

FIGS. 9 to 21 are cross-sectional views sequentially illustrating a fabricating process of a display device according to one embodiment. FIGS. 9 to 21 sequentially illustrate a fabricating process based on one cross section of the display device 1 illustrated in FIG. 5.

Figure 9:
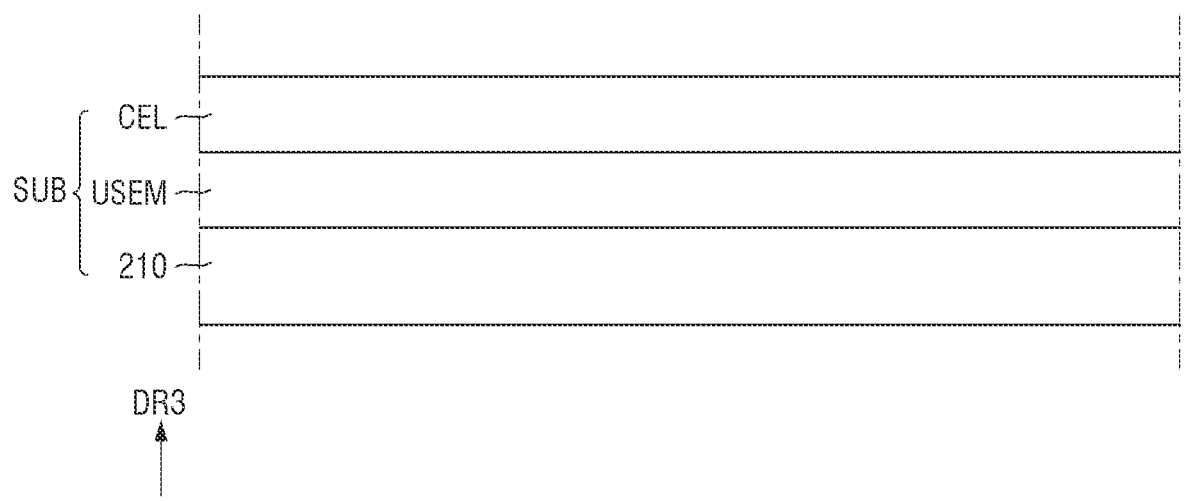
FIGS. 9 to 21 are cross-sectional views sequentially illustrating a fabricating process of a display device according to one or more embodiments.

First, referring to FIG. 9, the base substrate SUB is prepared in which the undoped semiconductor layer USEM is formed on the second substrate 210 and the common electrode layer CEL is formed on the undoped semiconductor layer USEM (S110).

The base substrate SUB includes the second substrate 210, the undoped semiconductor layer USEM disposed on the second substrate 210, and the common electrode layer CEL disposed on the undoped semiconductor layer USEM. The second substrate 210 may be a sapphire substrate ($Al_2O_3$) or a silicon wafer including silicon. However, the present disclosure is not limited thereto, and the second substrate 210 may also be a semiconductor substrate such as a GaAs substrate. Hereinafter, a case in which the second substrate 210 is a sapphire substrate will be described as an example.

The undoped semiconductor layer USEM and the common electrode layer CEL disposed on the second substrate 210 are the same as described above. The common electrode layer CEL may be an n-type semiconductor, and the undoped semiconductor layer USEM may include an undoped semiconductor, and may be a material that is not n-type or p-type doped. In one or more embodiments, the common electrode layer CEL may be any one or more of n-type doped AlGaInN, GaN, AlGaN, InGaN, AlN and InN. The undoped semiconductor layer USEM may be at least one of undoped InAlGaN, GaN, AlGaN, InGaN, AlN, or InN, but is not limited thereto. Although the drawing illustrates that one layer of the undoped semiconductor layer USEM is stacked, the present disclosure is not limited thereto, and a plurality of layers may also be formed. The undoped semiconductor layer USEM may be disposed to reduce a lattice constant difference between the common electrode layer CEL and the second substrate 210.

The undoped semiconductor layer USEM and the common electrode layer CEL may be formed through an epitaxial growth method. The epitaxial growth method may be electron beam deposition, physical vapor deposition (PVD), chemical vapor deposition (CVD), plasma laser deposition (PLD), dual-type thermal evaporation, sputtering, metal organic chemical vapor deposition (MOCVD), or the like. As one example, it may be performed by metal organic chemical vapor deposition (MOCVD), but is not limited thereto.

In one or more embodiments, a precursor material for forming the plurality of semiconductor material layers may be selected to form a target material in a selectable range without any limitation. For example, the precursor material may be a metal precursor including an alkyl group such as a methyl group or an ethyl group. Examples of the precursor material may include, but are not limited to, trimethylgallium $Ga(CH_3)_3$, trimethylaluminum $Al(CH_3)_3$, and triethyl phosphate $(C_2H_5)_3PO_4$.

Figure 10:
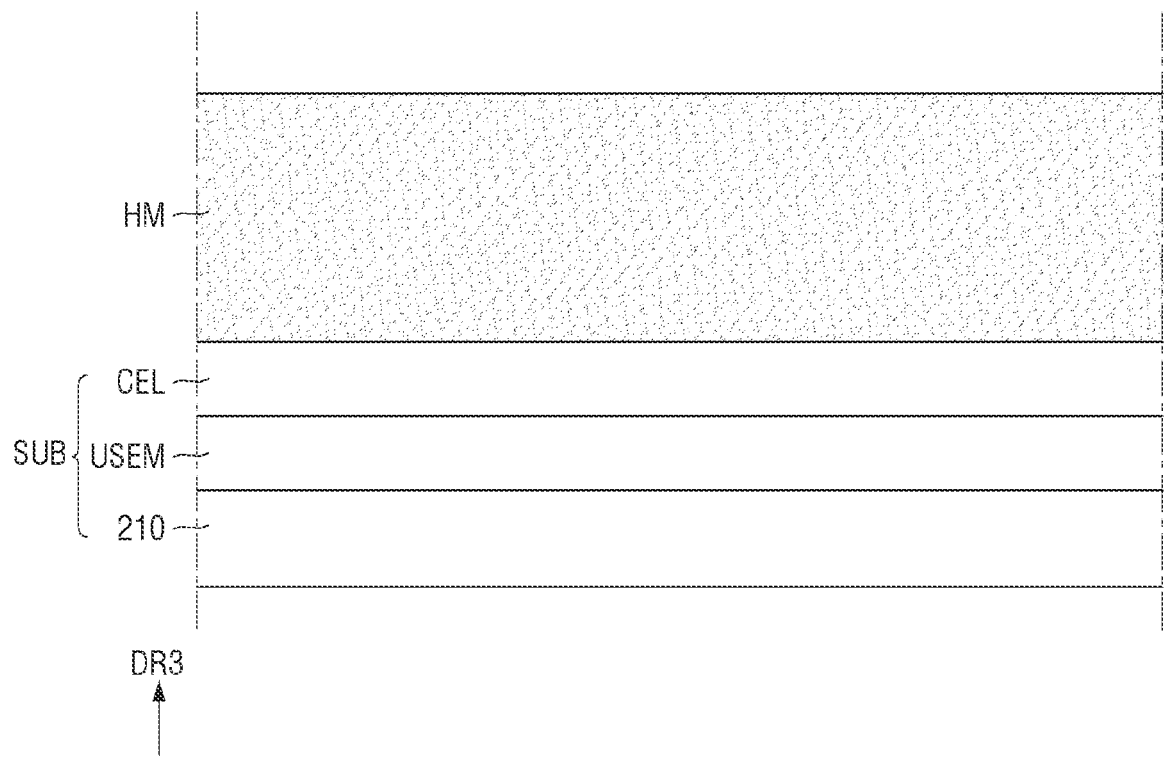

Next, referring to FIG. 10, the hard mask HM is formed on the common electrode layer CEL of the base substrate SUB (S120).

The hard mask HM may be entirely disposed on the common electrode layer CEL. The hard mask HM may include an insulating material such as silicon oxide (SiOx), silicon nitride (SiNx), or silicon oxynitride (SiOxNy), and may function as a mask of a process for forming the light emitting elements LE. As described above, the hard mask HM may be the emission defining layer EDL defining the light emitting elements LE.

Figure 11:
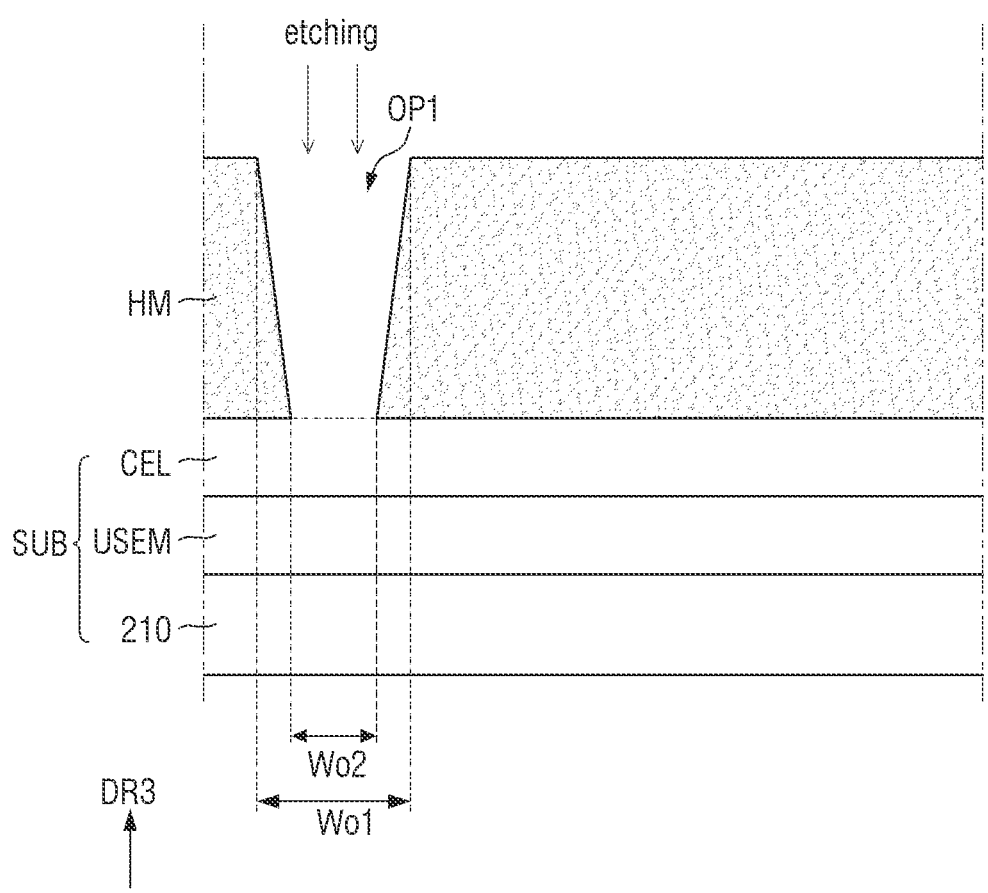
Figure 12:
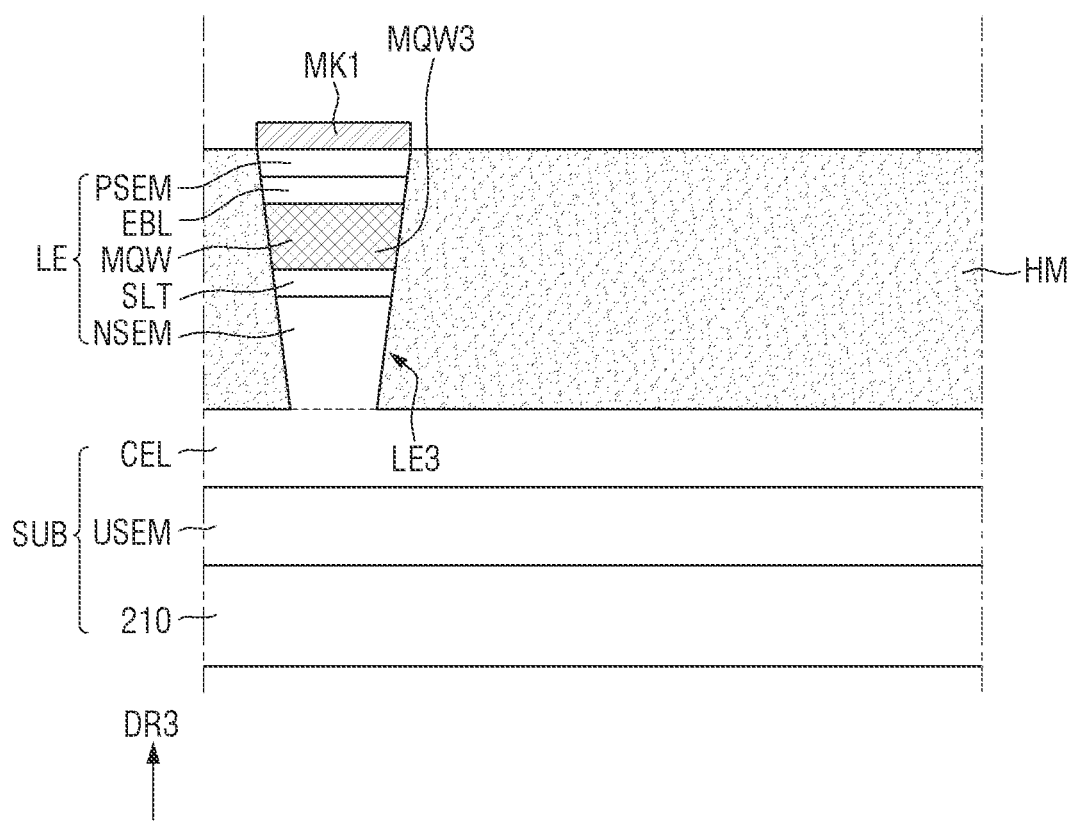

A method for fabricating the plurality of openings OP and the light emitting element LE will be described with reference to FIGS. 11 to 19 in conjunction with FIG. 8. In FIGS. 11 to 19, "bottom surface" corresponds to the top surface after bonding the semiconductor circuit substrate 100 with the display substrate 200, and "top surface" corresponds to the bottom surface after bonding the semiconductor circuit substrate 100 with the display substrate 200. Referring to FIGS. 11 and 12, the first opening OP1 penetrating the hard mask HM is formed (S131). Then, the third light emitting element LE3 is formed in the first opening OP1, and the first mask pattern MK1 covering the third light emitting element LE3 is formed (S132). A width Wo1 of the bottom surface of the first opening OP1 may be greater than a width Wo2 of the top surface.

The hard mask HM is etched to form a plurality of first openings OP1 exposing the common electrode layer CEL. The plurality of first openings OP1 are formed to be spaced from each other. The third light emitting element LE3 is formed in each of the plurality of first openings OP1. The separation distance, width, and the like of the first openings OP1 may be set according to the disposition and size of the third light emitting elements LE3 disposed on the display substrate 200. That is, the widths Wo1 and Wo2 of the first opening OP1 may be the same as the widths (W1 and W2 of FIG. 6) of the third light emitting element LE3. In addition, because the hard mask HM corresponds to the emission defining layer EDL in FIG. 5 for individualizing the third light emitting elements LE3, the distance (e.g., D1 of FIG. 6) between the adjacent third light emitting elements LE3 may be the same as the width (e.g., We1 of FIG. 6) of the emission defining layer EDL. The width Wo1 of the bottom surface of the first opening OP1 may be greater than the width Wo2 of the top surface, and the width W1 of the bottom surface of the third light emitting element LE3 formed in the first opening OP1 may be greater than the width W2 of the top surface (e.g., see FIG. 6).

The process of forming the light emitting elements LE may be performed through an epitaxial growth method like the process of forming the undoped semiconductor layer USEM and the common electrode layer CEL. When the top surface of the common electrode layer CEL is exposed by the first opening OP1, a semiconductor crystal is grown by injecting a precursor material onto the common electrode layer CEL. The second semiconductor layer NSEM disposed on the common electrode layer CEL may include substantially the same material as the common electrode layer CEL, and may be formed by growing semiconductor crystals of the common electrode layer CEL. Accordingly, the second semiconductor layer NSEM and the common electrode layer CEL may be integrated.

Then, the superlattice layer SLT, the third active layer MQW3, the electron blocking layer EBL, and the first semiconductor layer PSEM are sequentially grown to form the third light emitting element LE3. In this process, only the third light emitting elements LE3 having the third active layer MQW3 may be formed, and in subsequent repeated processes, the light emitting elements LE1 and LE2 including the second active layer MQW2 or the first active layer MQW1 may be formed.

Then, the first mask pattern MK1 covering the third light emitting element LE3 is formed. The first mask pattern MK1 may be formed of an inorganic layer such as a silicon oxide layer ($SiO_2$), an aluminum oxide layer ($Al_2O_3$), or a hafnium oxide layer (HfOx), and may include the same material as the above-described hard mask HM, but the embodiment of the present specification is not limited thereto. The first mask pattern MK1 may be a passivation layer or a barrier layer that protects the third light emitting element LE3. The first mask pattern MK1 may be formed on the third light emitting element LE3 through an additional etching process, but is not limited thereto. For example, the first mask pattern MK1 may be formed on the entire surface of the third light emitting element LE3 and the hard mask HM.

Referring to FIGS. 11 and 12, the first opening OP1 penetrating the hard mask HM is formed (S131). Then, the third light emitting element LE3 is formed in the first opening OP1, and the first mask pattern MK1 covering the third light emitting element LE3 is formed (S132).

The hard mask HM is etched to form the plurality of first openings OP1 exposing the common electrode layer CEL. The plurality of first openings OP1 are formed to be spaced from each other. The third light emitting element LE3 is formed in each of the plurality of first openings OP1. The separation distance, width, and the like of the first openings OP1 may be set according to the disposition and size of the third light emitting elements LE3 disposed on the display substrate 200. That is, the width of the first openings OP1 and the distance between the first openings OP1 may be the same as the width of the third light emitting element LE3 and the distance between the third light emitting elements LE3. In addition, because the hard mask HM corresponds to the emission defining layer EDL for individualizing the third light emitting elements LE3, the distance between the adjacent third light emitting elements LE3 may be the same as the width of the emission defining layer EDL. The width W1 of the bottom surface of the third light emitting element LE3 formed in the first opening OP1 may be greater than the width W2 of the top surface thereof.

Figure 13:
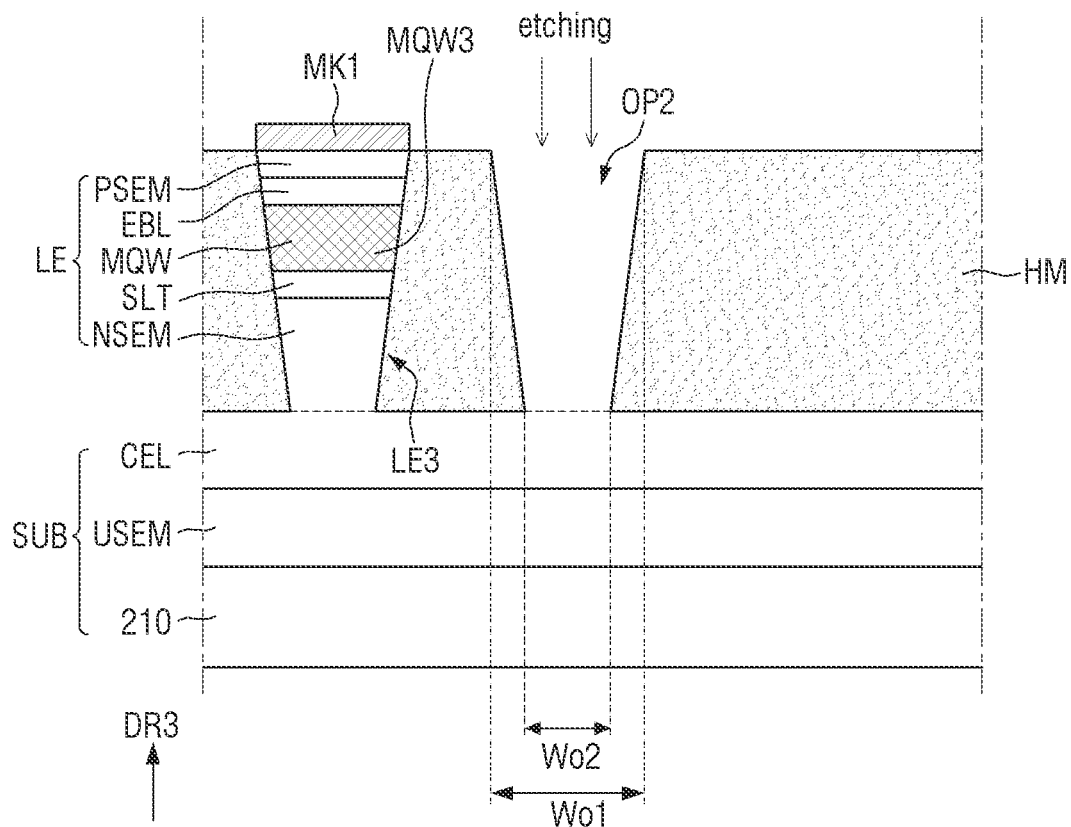
Figure 14:
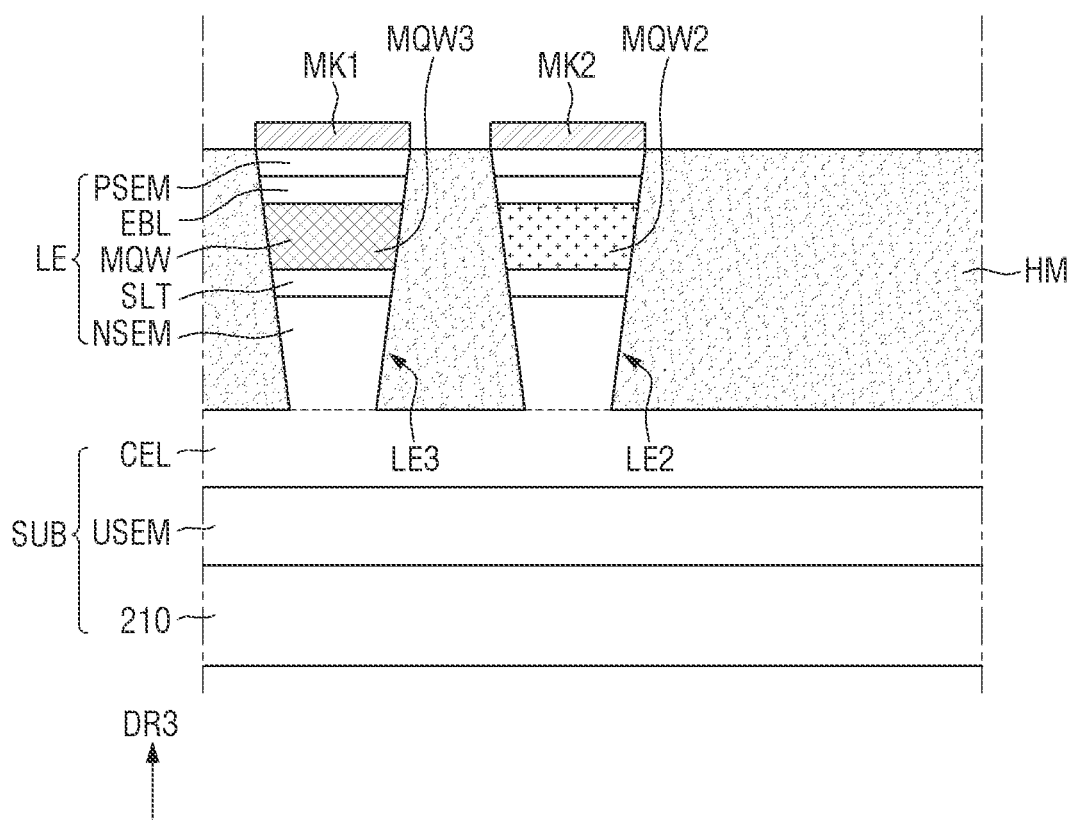

Referring to FIGS. 13 and 14, the second opening OP2 penetrating the hard mask HM is formed (S133). Then, the second light emitting element LE2 is formed in the second opening OP2, and the second mask pattern MK2 covering the second light emitting element LE2 is formed (S134). The width Wo1 of the bottom surface of the second opening OP2 may be greater than the width Wo2 of the top surface thereof.

The hard mask HM is etched to form a plurality of second openings OP2 exposing the common electrode layer CEL. The plurality of second openings OP2 are formed to be spaced from each other. The second light emitting element LE2 is formed in each of the plurality of second openings OP2. The separation distance, width, and the like of the second openings OP2 may be set according to the disposition and size of the second light emitting elements LE2 disposed on the display substrate 200. That is, the widths Wo1 and Wo2 of the second opening OP2 and the distance therebetween (e.g., We1 in FIG. 6) may be the same as the widths W1 and W2 (see FIG. 6) of the second light emitting element LE2 and the distance therebetween (e.g., D1 in FIG. 6). The width Wo1 of the bottom surface of the second opening OP2 may be greater than the width Wo2 of the top surface thereof, and the width W1 of the bottom surface of the second light emitting element LE2 formed in the second opening OP2 may be greater than the width W2 of the top surface thereof.

The second semiconductor layer NSEM, the superlattice layer SLT, the second active layer MQW2, the electron blocking layer EBL, and the first semiconductor layer PSEM are sequentially grown on the common electrode layer CEL exposed by the second opening OP2 to form the second light emitting element LE2.

The process of forming the second light emitting element LE2 may be performed using different precursor materials and process conditions from the process of forming the third light emitting element LE3. The third light emitting element LE3 and the second light emitting element LE2 may include the third active layer MQW3 and the second active layer MQW2, respectively, and as described above, may include different doping concentrations, indium (In) contents, or the like. In the fabricating process of the display device 1, the same process of forming the light emitting element LE is repeated, but process conditions in each process may be partially different.

Then, a second mask pattern MK2 covering the second light emitting element LE2 is formed. The second mask pattern MK2 may be formed of an inorganic layer such as a silicon oxide layer ($SiO_2$), an aluminum oxide layer ($Al_2O_3$), or a hafnium oxide layer (HfOx), and may include the same material as the above-described hard mask HM, but the present specification is not limited thereto. The second mask pattern MK2 may be a passivation layer or a barrier layer that protects the second light emitting element LE2. The second mask pattern MK2 may be formed on the third light emitting element LE3 through an additional etching process, but is not limited thereto.

Figure 15:
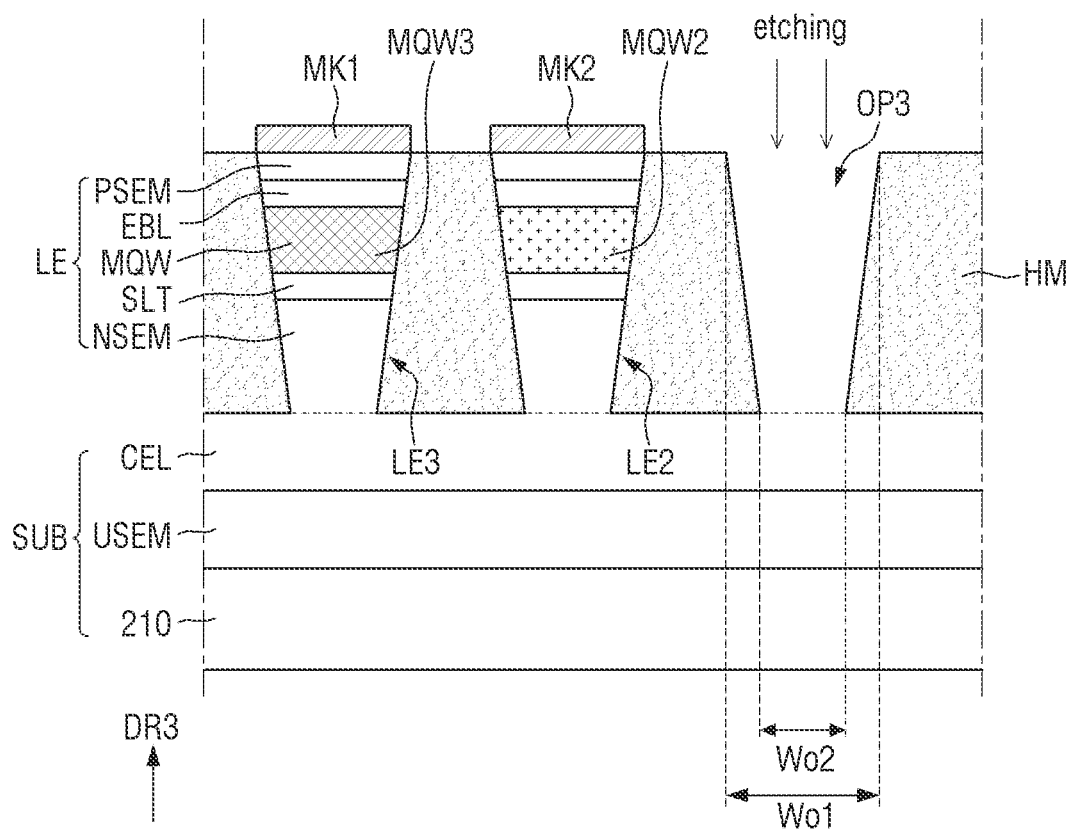
Figure 16:
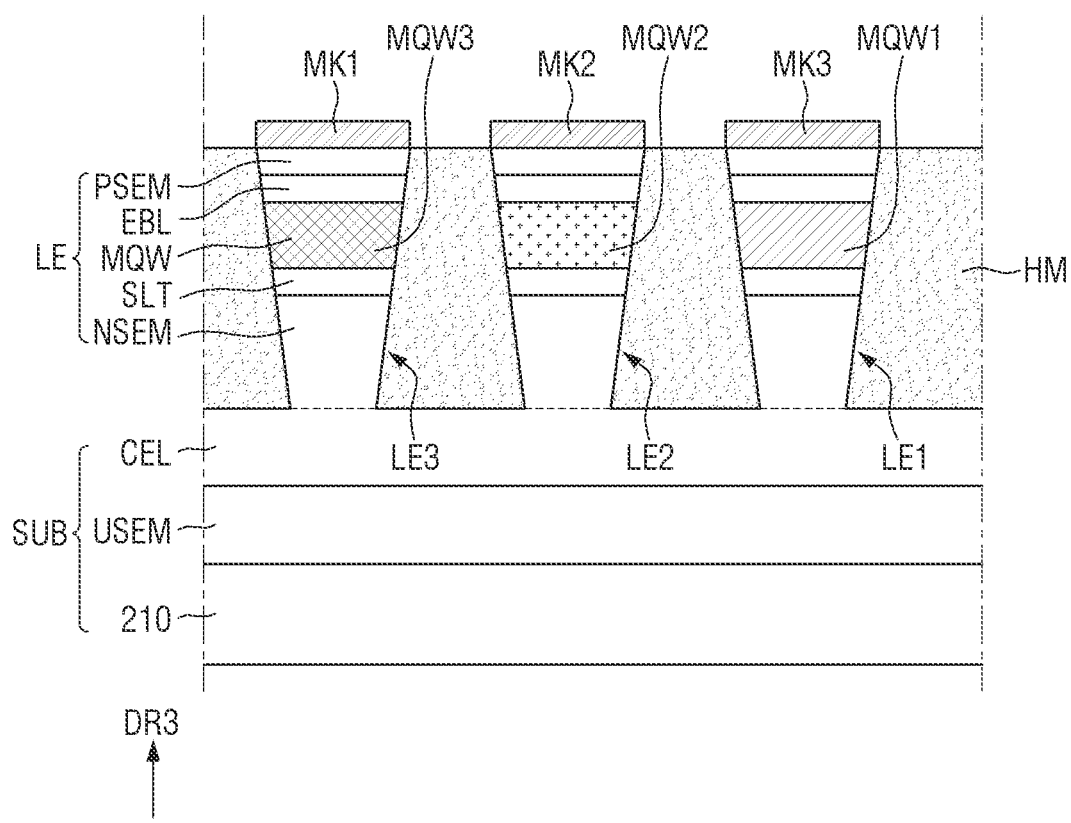

Referring to FIGS. 15 and 16, the third opening OP3 penetrating the hard mask HM is formed (S135). Then, the first light emitting element LE1 is formed in the third opening OP3, and the third mask pattern MK3 covering the first light emitting element LE1 is formed (S136). The width Wo1 of the bottom surface of the third opening OP3 may be greater than the width Wo2 of the top surface thereof.

In the same manner as described above but under different process conditions, materials, and the like, the first light emitting element LE1 including the first active layer MQW1, and the third mask pattern MK3 covering the first light emitting element LE1 are formed on the common electrode layer CEL. A detailed description thereof is the same as described above.

On the other hand, in the etching process for forming the first to third mask patterns MK1, MK2, and MK3 of the present specification, a mask may be disposed, except for the area in which the first to third mask patterns MK1, MK2, and MK3 are etched, in the remaining area.

Figure 17:
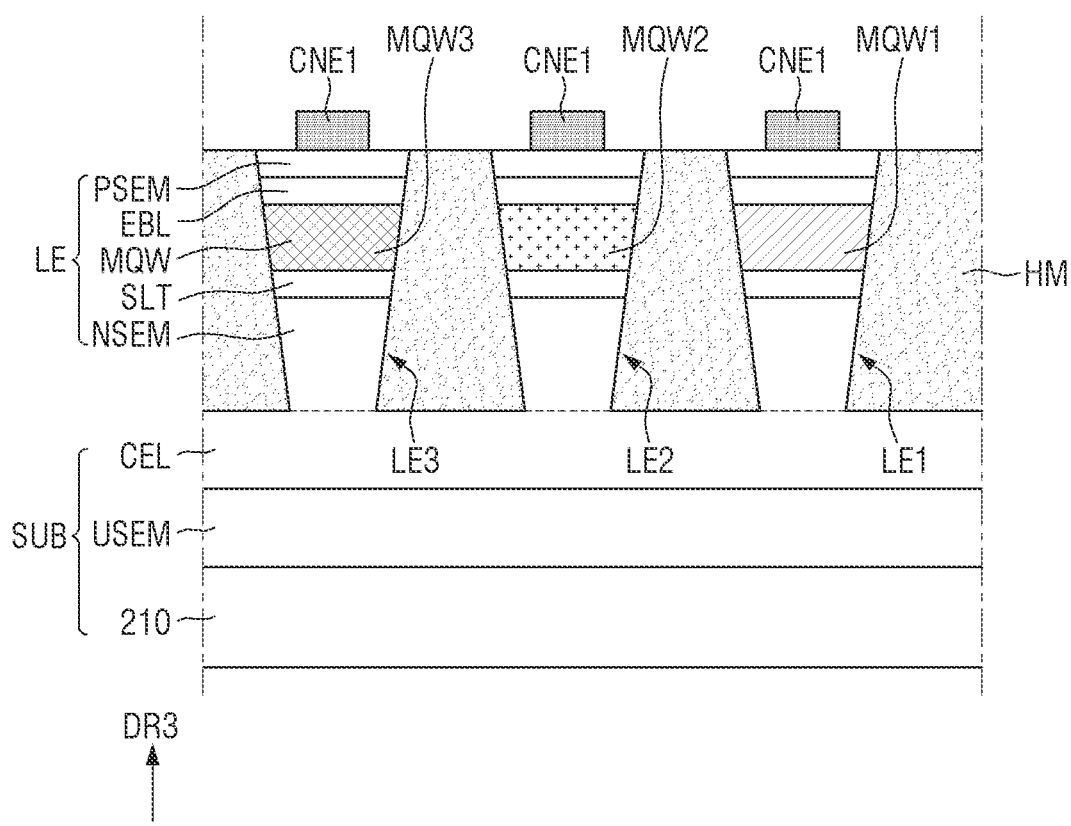

Next, as illustrated in FIG. 17, the mask patterns MK1, MK2, and MK3 are removed, and the first connection electrode CNE1 is formed on the light emitting elements LE (S140).

The top surfaces of the first to third light emitting elements LE1, LE2, and LE3 may be exposed by removing the mask patterns MK1, MK2, and MK3. The top surfaces of the first to third light emitting elements LE1, LE2, and LE3 and the top surface of the hard mask HM may be planarized. The process of removing the mask patterns MK1, MK2, and MK3 may be performed through an etching process. The etching process may include dry etching, wet etching, reactive ion etching (RIE), deep reactive ion etching (DRIE), inductively coupled plasma reactive ion etching (ICP-RIE), or the like. In the present specification, the meaning of planarization includes forming a substantially flat surface as well as having one surface parallel.

The first connection electrode CNE1 is formed on the top surface of each of the first to third light emitting elements LE1, LE2, and LE3 in which the top surface of the first semiconductor layer PSEM is exposed. The first connection electrode CNE1 may be formed on the light emitting elements LE1, LE2, and LE3 through a photo process.

Through the above process, the display substrate 200 disposed on the second substrate 210 may be fabricated. Then, the display device 1 may be fabricated by bonding the semiconductor circuit substrate 100 and the display substrate 200 to each other.

Figure 18:
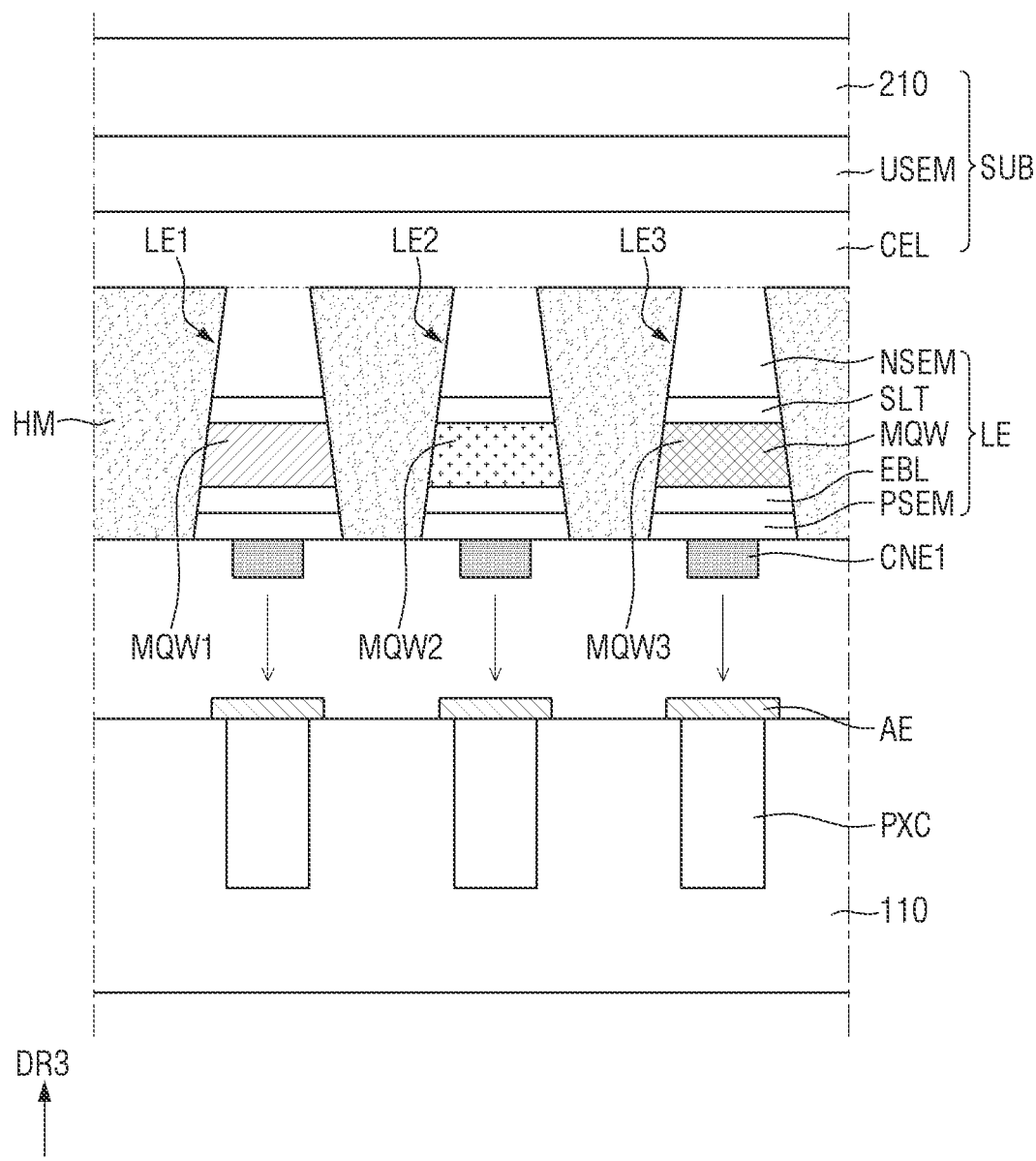

Referring to FIG. 18, the base substrate SUB on which the light emitting elements LE defined by the hard mask HM are formed and the semiconductor circuit substrate 100 are bonded (S150).

The semiconductor circuit substrate 100 includes the first substrate 110 including pixel circuit units PXC, and a pixel electrode AE formed on one surface of the first substrate 110. The second substrate 210 and the display substrate 200 may be aligned on the semiconductor circuit substrate 100 so that the light emitting elements LE correspond to the pixel electrodes AE of the semiconductor circuit substrate 100. The first connection electrode CNE1 may be aligned to overlap the corresponding pixel electrode AE in a thickness direction.

When the second substrate 210 and the display substrate 200 are aligned with the semiconductor circuit substrate 100, the filling layer 500 is disposed therebetween, and the display substrate 200 and the semiconductor circuit substrate 100 are bonded to each other. As one example, in the filling layer 500, when the display substrate 200 and the semiconductor circuit substrate 100 are aligned and the first connection electrodes CNE1 come into contact with the pixel electrodes AE, a material of the filling layer 500 may be injected to fill the space between the display substrate 200 and the semiconductor circuit substrate 100. Thereafter, when the injected material of the filling layer 500 is cured, the display substrate 200 and the semiconductor circuit substrate 100 may be bonded to each other. However, the present disclosure is not limited thereto.

The first connection electrode CNE1 disposed on the light emitting elements LE of the display substrate 200 may be directly in contact with the pixel electrode AE. When the semiconductor circuit substrate 100 and the display substrate 200 are bonded to each other, both ends of the light emitting elements LE may be electrically connected to the pixel circuit unit PXC of the semiconductor circuit substrate 100.

Figure 19:
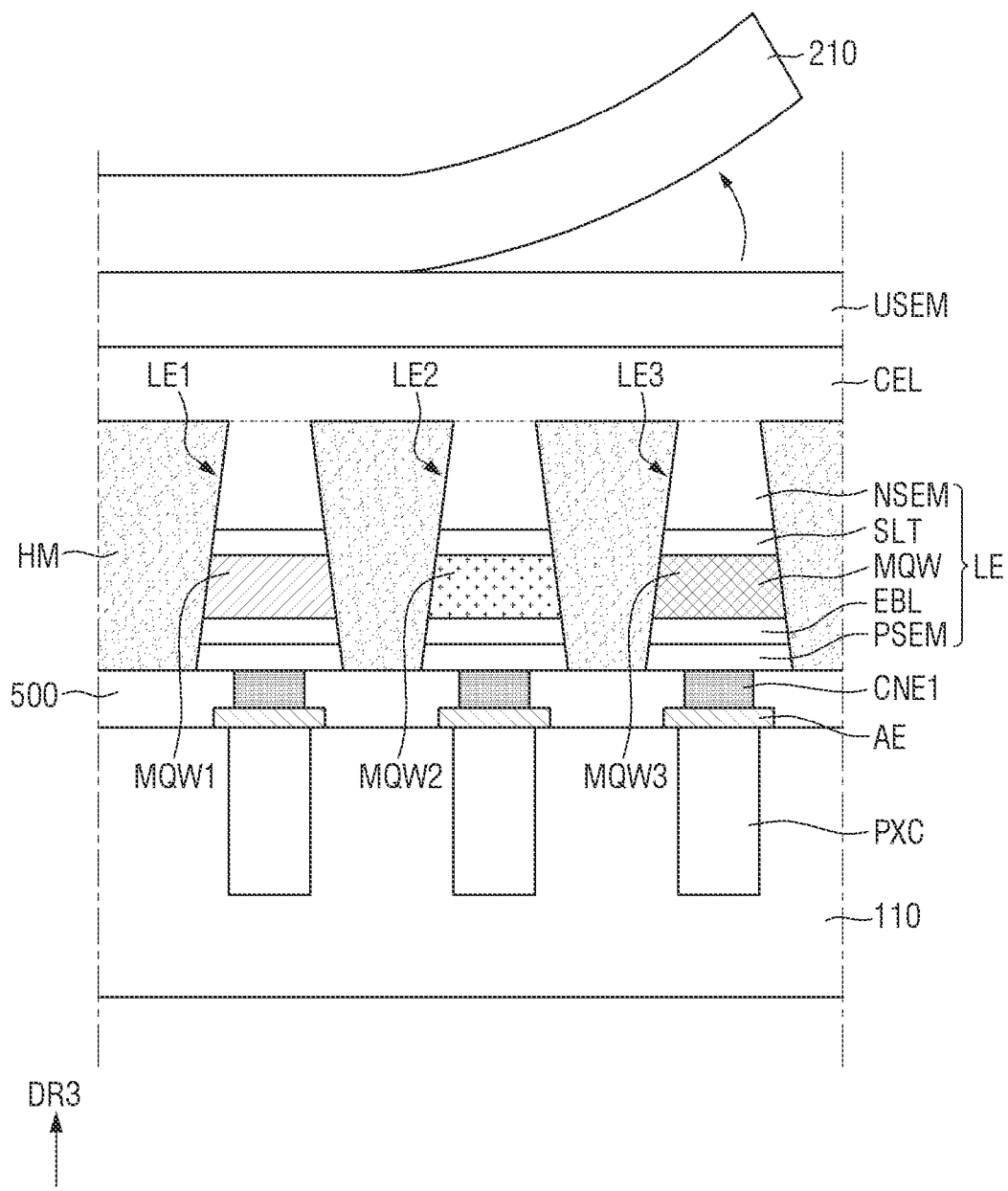
Figure 20:
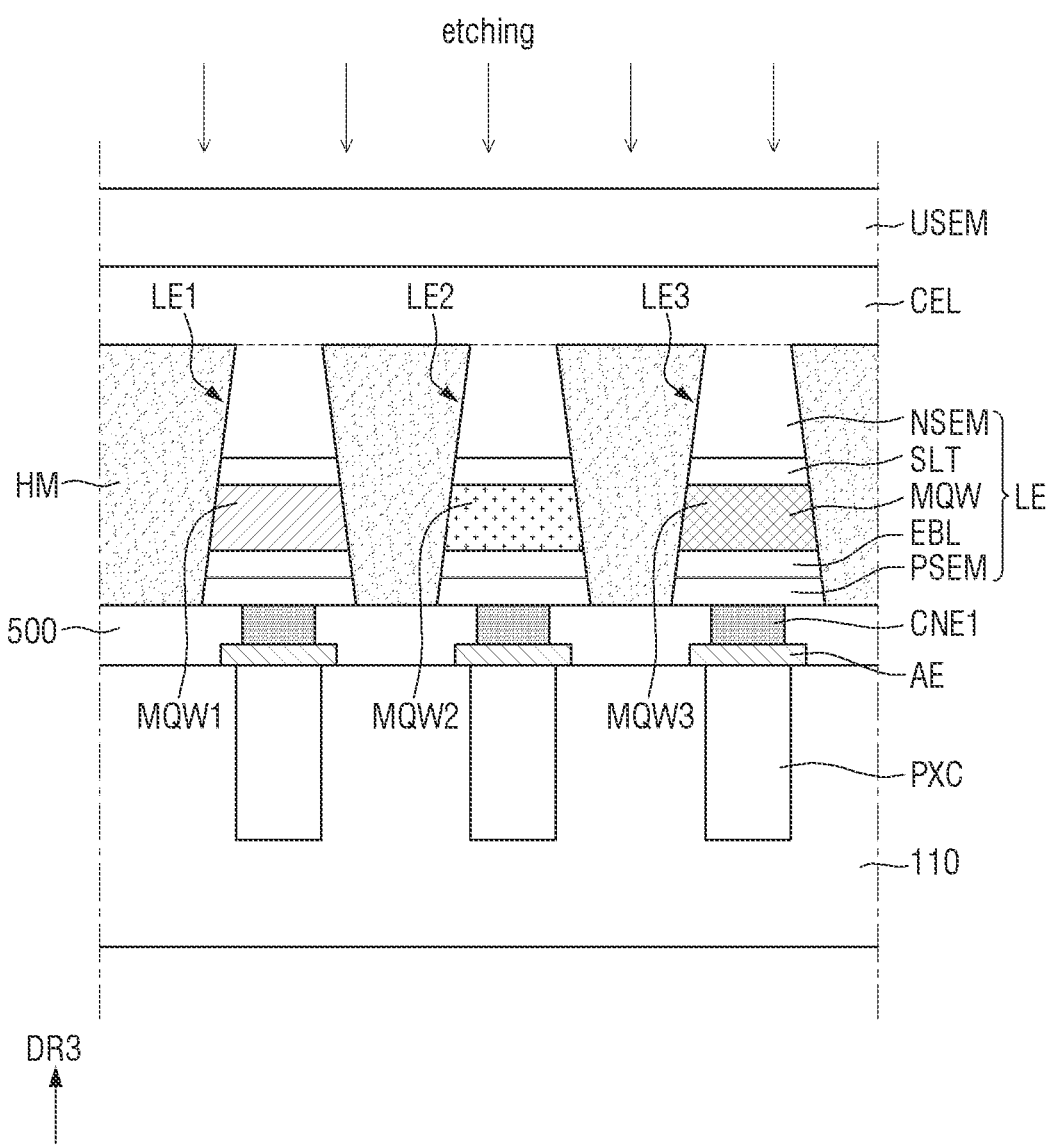
Figure 21:
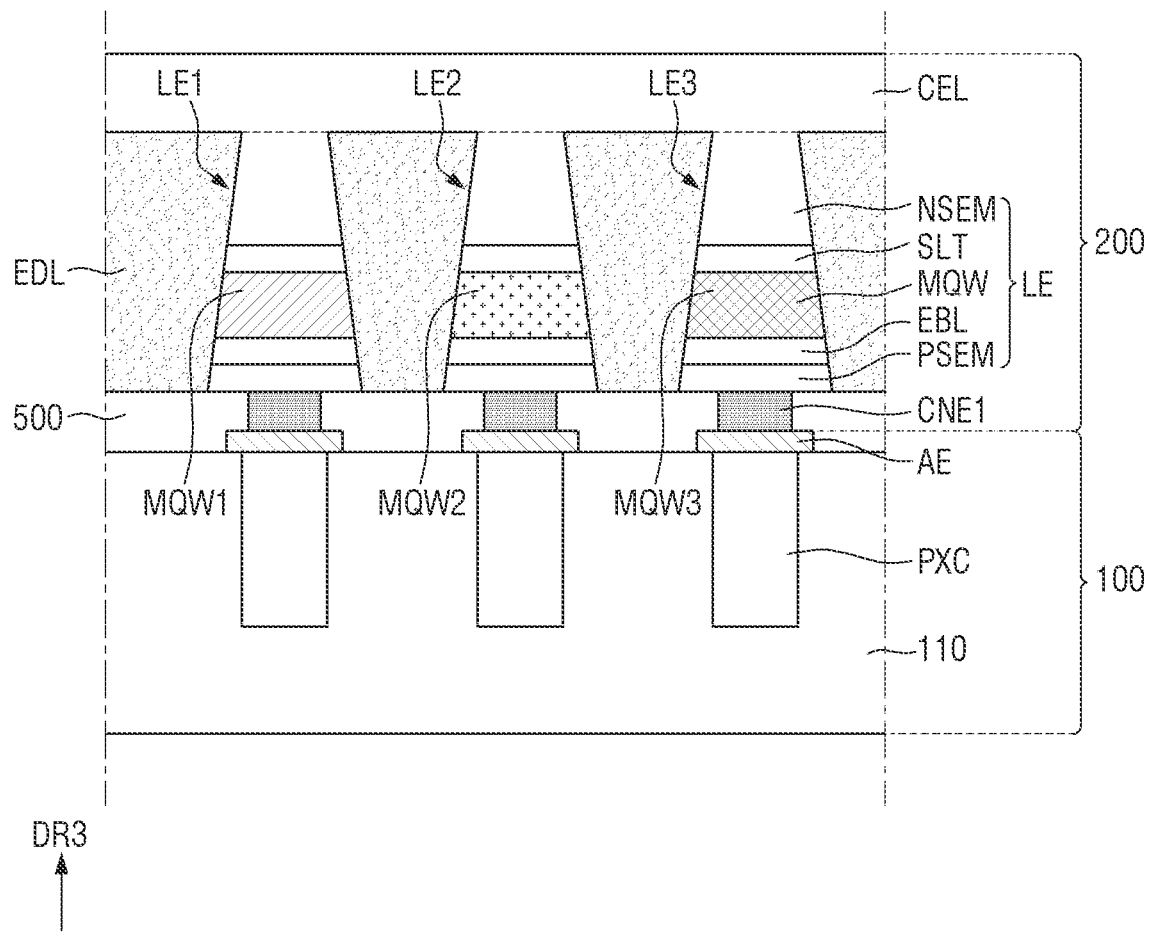

Next, referring to FIGS. 19 to 21, the second substrate 210 disposed on the undoped semiconductor layer USEM of the display substrate 200 may be removed, and the undoped semiconductor layer USEM may be removed through an etching process to fabricate the display device 1.

According to the method for fabricating the display device 1 according to the present embodiment, the light emitting elements LE1, LE2, and LE3 may be individualized without etching the hard mask HM between the light emitting elements LE1, LE2, and LE3, and thus a problem in which sidewalls of the light emitting elements LE1, LE2, and LE3 are damaged as the hard mask HM is etched may be prevented. For example, when the sidewalls of the light emitting elements LE and the hard mask HM disposed therebetween are etched by a dry etching process, an etching etchant (e.g., $Cl_2$ or $O_2$) may remain on the sidewalls of the light emitting elements LE and serve as defects of the light emitting elements LE. Alternatively, in the present embodiment, because the hard mask HM (or the emission defining layer EDL) may partition the emission area of each of the light emitting elements LE, an etching process for individualizing the light emitting elements LE may be omitted. Accordingly, the display device 1 may include the light emitting elements LE in which defects are prevented.

Hereinafter, a structure of the display device 1 according to one or more embodiments will be described with reference to FIG. 22.

Figure 22:
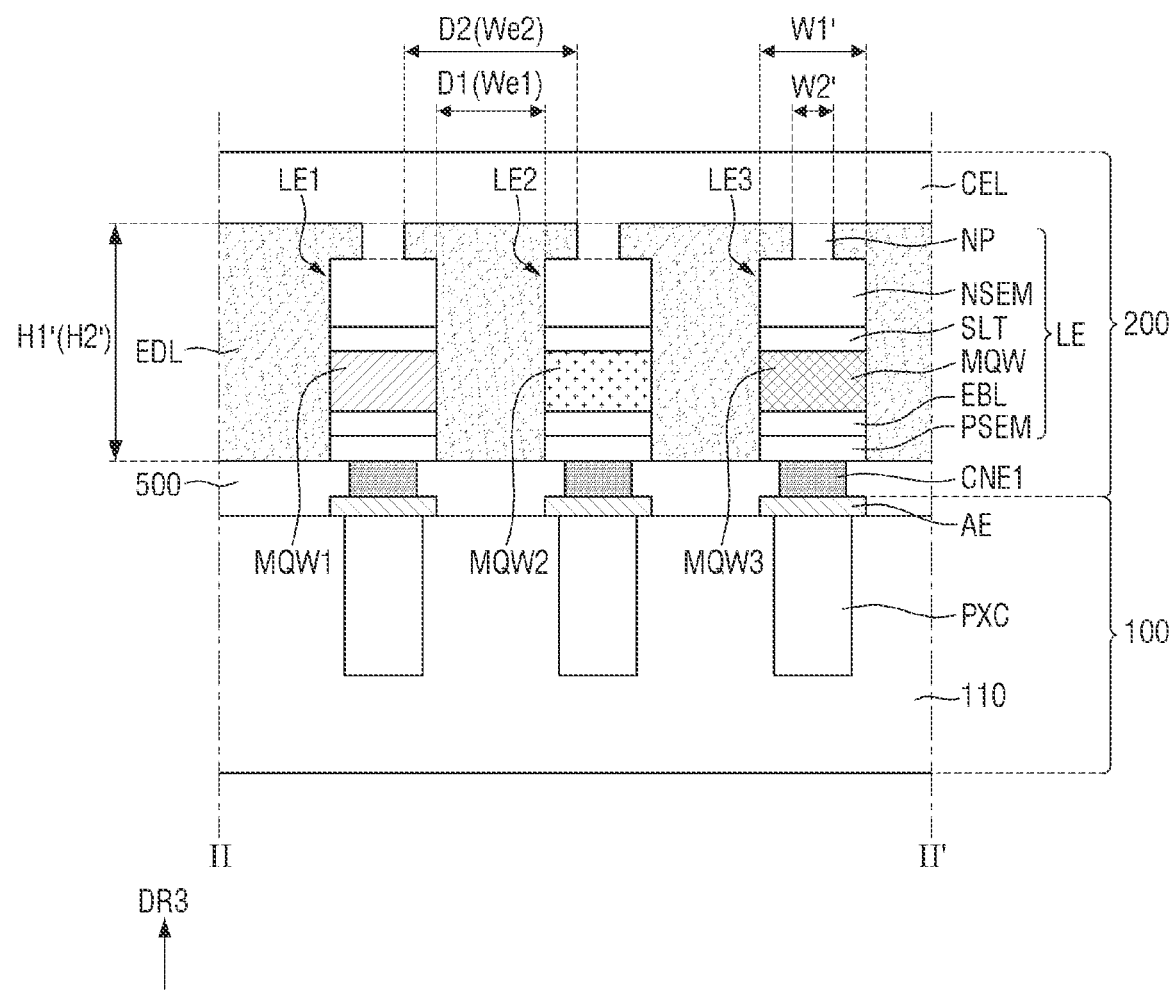
FIG. 22 is a cross-sectional view of first to third light emitting elements according to one or more embodiments.

FIG. 22 is a cross-sectional view of first to third light emitting elements according to one or more embodiments. FIG. 22 may correspond to a cross-sectional view taken along the line II-II' of FIG. 2.

The display device 1 according to the present embodiment differs from the previous embodiment in that the light emitting element LE of the display device 1 according to the present embodiment further includes a protrusion NP protruding in a direction from the second semiconductor layer NSEM to the common electrode layer CEL and the emission defining layer EDL includes a portion protruding in a horizontal direction.

For example the emission defining layer EDL may further include an opening for an area in which the protrusion NP grows from the common electrode layer CEL. The plurality of openings OP of the emission defining layer EDL may include the first opening OP1, the second opening OP2, and the third opening OP3 having a first width Wo1', and may include a first sub-opening SOP1, a second sub-opening SOP2, and a third sub-opening SOP3 having a second width Wo2' smaller than the first width Wo1' (see FIGS. 24 to 40). The first to third openings OP1, OP2, and OP3 of the emission defining layer EDL may provide a space in which the first semiconductor layer PSEM, the active layer MQW, and the second semiconductor layer NSEM of the light emitting element LE are formed, and the sub-openings SOP of the emission defining layer EDL may provide a space in which the protrusions NP of the light emitting element LE are formed. That is, the first to third openings OP1, OP2, and OP3 of the emission defining layer EDL may determine growth areas of the first semiconductor layer PSEM, the active layer MQW, and the second semiconductor layer NSEM, and the sub-openings SOP may determine a growth area of the protrusion NP. Accordingly, the first width Wo1' of each of the first to third openings OP1, OP2, and OP3 may be the same as the width W1' of the first and second semiconductor layers PSEM and NSEM of the first to third light emitting elements LE1, LE2, and LE3, and the second width Wo2' of each of the sub-openings SOP may be the same as the width W2' of the protrusion NP.

In addition, because the emission defining layer EDL is disposed to fill all the spaces between the light emitting elements LE, the minimum distance D1 between the first and second semiconductor layers PSEM and NSEM may be the same as the minimum width We1 of the emission defining layer EDL disposed therebetween. In addition, a minimum distance D2 between the adjacent protrusions NP may be the same as the minimum width We2 of the emission defining layer EDL disposed therebetween. In one or more embodiments, the minimum width We1 of the emission defining layer EDL disposed between the second semiconductor layers NSEM may be smaller than the minimum width We2 of the emission defining layer EDL disposed between the protrusions NP.

The emission defining layer EDL may be disposed to be in contact with the side surface of each of the light emitting elements LE and may be around (or may surround) the side surface of each of the light emitting elements LE.

Each of the protrusions NP may be disposed in the sub-opening SOP of the emission defining layer EDL. Each of the protrusions NP may be disposed on the second semiconductor layer NSEM and may be directly in contact with the common electrode layer CEL. The protrusions NP may be portions protruding in the direction toward the common electrode layer CEL from the second semiconductor layer NSEM, and may be portions having a different width in the horizontal direction compared to the width of the second semiconductor layer NSEM. That is, the width W1' of the first and second semiconductor layers PSEM and NSEM may be greater than the width W2' of the protrusion NP.

Each of the light emitting elements LE may be covered by the emission defining layer EDL. For example, the side surface of the light emitting element LE may be covered by the emission defining layer EDL, and at least a part of the top surface of the second semiconductor layer NSEM of the light emitting element LE may be covered by the emission defining layer EDL. The bottom surface of the first semiconductor layer PSEM of the light emitting element LE may not be covered by the emission defining layer EDL and may be planarized with the bottom surface of the emission defining layer EDL. Although the drawing illustrates that a height H1' of the emission defining layer EDL is the same as a height H2' of the light emitting element LE including the protrusion NP, the present disclosure is not limited thereto. The light emitting element LE may be crystal-grown to be smaller than the height of the emission defining layer EDL, or may also be crystal-grown beyond the emission defining layer EDL.

On the other hand, when the height H1' of the emission defining layer EDL is the same as the height H2' of the light emitting element LE including the protrusion NP, the bottom surface of the emission defining layer EDL and the bottom surface of the light emitting element LE may be flat, and the top surface of the emission defining layer EDL and the top surface of the light emitting element LE may be flat. In other words, the bottom surface of the emission defining layer EDL and the bottom surface of the first semiconductor layer PSEM may be flat, and the top surface of the emission defining layer EDL and the top surface of the protrusion NP may be flat.

The protrusions NP may be an n-type semiconductor including the same material as that of the above-described second semiconductor layer NSEM. For example, the protrusions NP may be n-GaN doped with n-type Si. The protrusions NP may be integrated with the second semiconductor layer NSEM. The height of each of the protrusions NP may be less than that of the second semiconductor layer NSEM, but is not limited thereto.

The common electrode layer CEL differs from the previous embodiment in that it is disposed on the protrusion NP. The common electrode layer CEL may include the same material as the protrusion NP and the second semiconductor layer NSEM to be integrated.

In the display device 1 according to the present embodiment, because the openings OP and the sub-openings SOP of the emission defining layer EDL provide a space for forming the light emitting element LE, the width, height, position, and shape of the opening OP of the emission defining layer EDL, the distance between the openings OP, and the like may be substantially the same as the width, height, position, and shape of the light emitting element LE, the distance between the light emitting elements LE, and the like. Accordingly, although the sidewall of the light emitting element LE is not etched, the emission area of the light emitting element LE is defined, and because each of the light emitting elements LE may be individualized, a sidewall effect of the light emitting element LE may be prevented or reduced. Accordingly, defects of the light emitting element LE may be prevented or reduced, and light efficiency may be improved.

In addition, in the display device 1 according to the present embodiment, as the openings OP and the sub-openings SOP are formed in the emission defining layer EDL, because the current generated in the light emitting element LE flows densely in the protrusion NP having a small width (e.g., W2'), the current density of the sidewall of the light emitting element LE may decrease. That is, the sidewall effect may be suppressed or reduced.

For example, the current generated in the active layer MQW flows toward the common electrode layer CEL. When the current density of the sidewall of the light emitting element LE is increased, a sidewall effect causing non-radiative recombination occurs, and the higher the current density of the central portion rather than the sidewall of the light emitting element LE, the less the sidewall effect. In the case of the display device 1 including the protrusion NP, the current generated in the active layer MQW flows to the common electrode layer CEL through the protrusion NP, so that the current density may be higher at the central portion than the sidewall. In other words, the current may flow to the common electrode layer CEL through the protrusion NP smaller than the width of the light emitting element LE. Accordingly, a sidewall effect due to a defect of the light emitting element LE may be prevented, and light efficiency may be improved.

Hereinafter, a fabricating process based on one cross section of the display device 1 of FIG. 22 will be described with further reference to other drawings.

Figure 23:
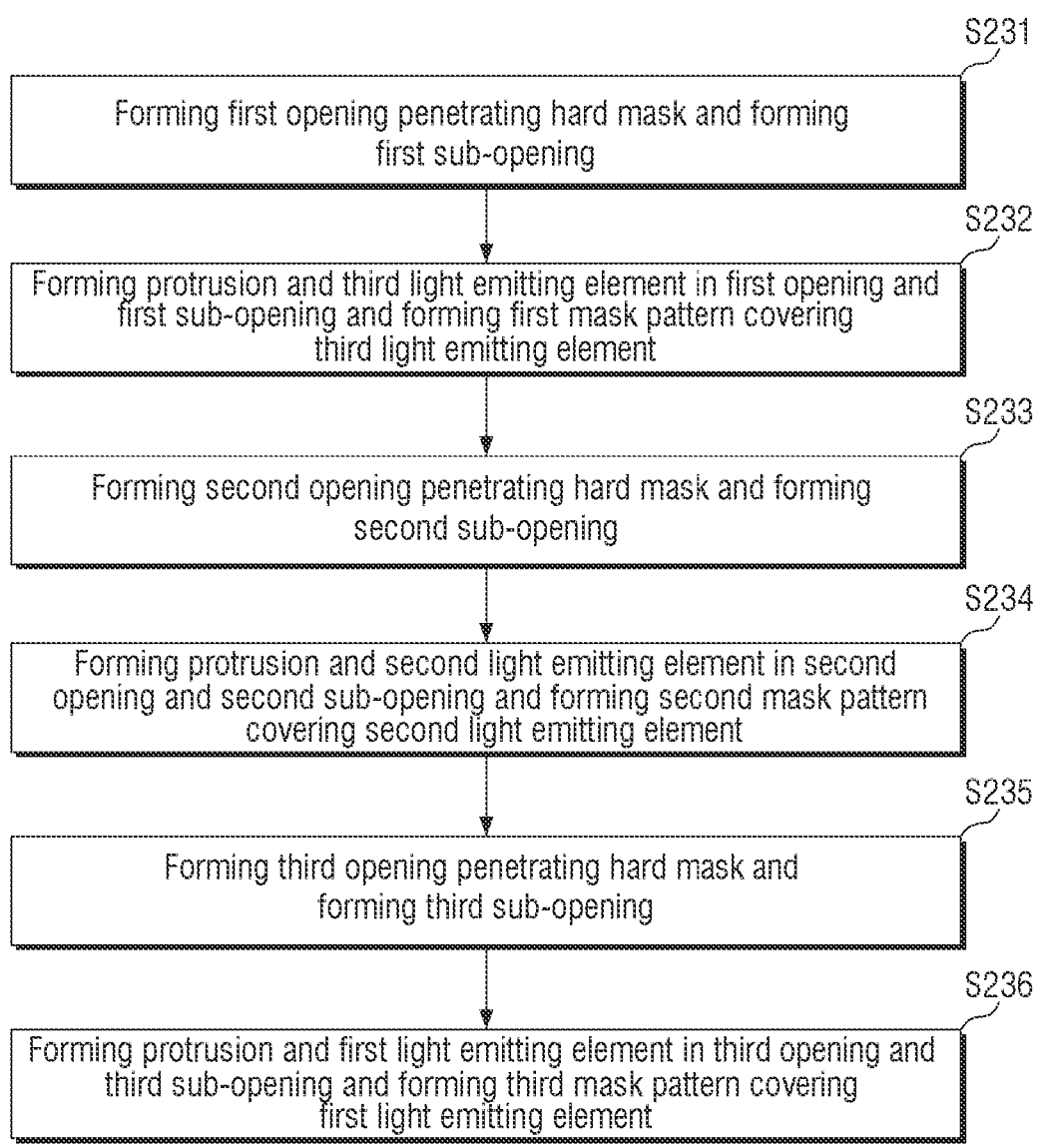
FIG. 23 is a flowchart illustrating an example of the fabricating method of S130 of FIG. 7.

FIG. 23 is a flowchart illustrating an example of the fabricating method of S130 of FIG. 7. FIGS. 24 to 40 are cross-sectional views sequentially illustrating a fabricating process of a display device according to an embodiment.

The fabricating process of the display device 1 according to the present embodiment differs from the previous embodiment in that the first to third sub-openings SOP1, SOP2, and SOP3 having different widths from the first to third openings OP1, OP2, and OP3 are included. FIGS. 24 to 40 further illustrate processes of the second connection electrode CNE2 and the third connection electrode CNE3 connected to the common electrode connection portion CEP disposed in the common electrode areas CPA1 and CPA2.

The S130 may further include forming the first opening OP1 penetrating the hard mask HM and forming the first sub-opening SOP1 (S231), forming the protrusion NP and the third light emitting element LE3 in the first opening OP1 and the first sub-opening SOP1 and forming the first mask pattern MK1 covering the third light emitting element LE3 (S232), forming the second opening OP2 penetrating the hard mask HM and forming the second sub-opening SOP2 (S233), forming the protrusion NP and the second light emitting element LE2 in the second opening OP2 and the second sub-opening SOP2 and forming the second mask pattern MK2 covering the second light emitting element LE2 (S234), forming the third opening OP3 penetrating the hard mask HM and forming the third sub-opening SOP3 (S235), and forming the protrusion NP and the first light emitting element LE1 in the third opening OP3 and the third sub-opening SOP3 and forming the third mask pattern MK3 covering the first light emitting element LE1 (S236).

Figure 24:
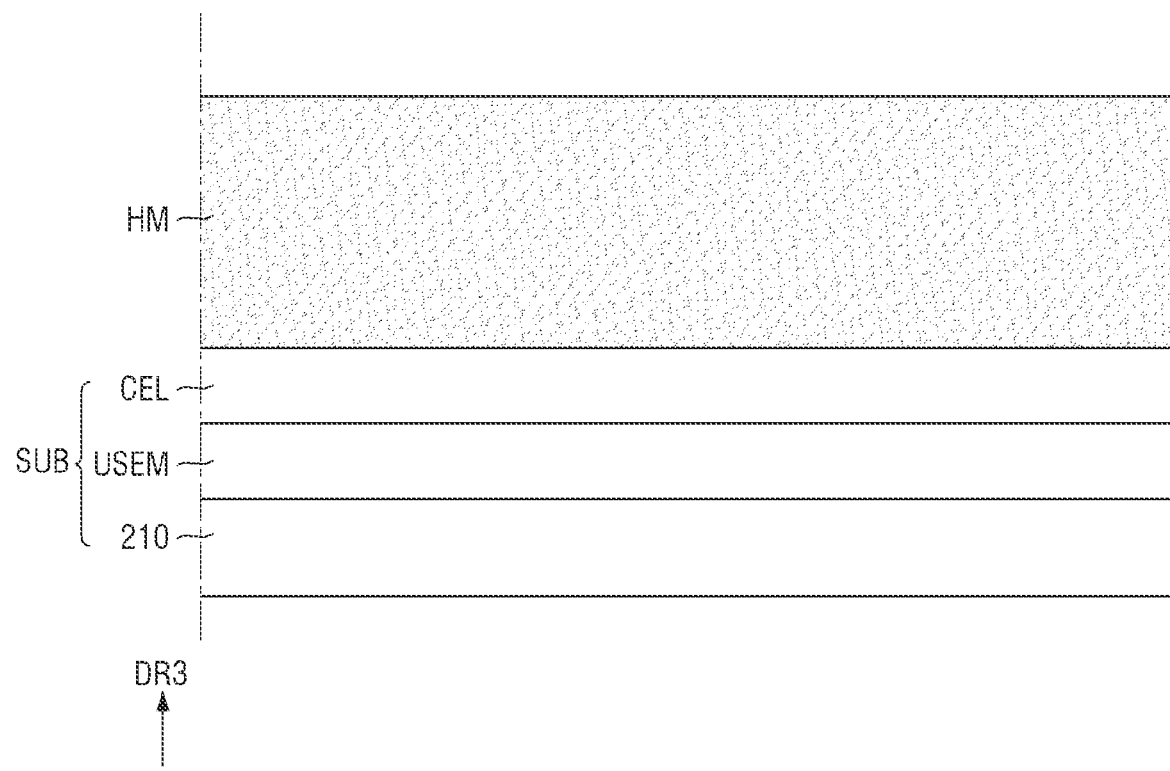
FIGS. 24 to 40 are cross-sectional views sequentially illustrating a fabricating process of a display device according to one or more embodiments.

Referring to FIG. 24, the hard mask HM is formed on the base substrate SUB including the second substrate 210, the undoped semiconductor layer USEM, and the common electrode layer CEL.

Next, referring to FIGS. 25 to 33, the plurality of first to third openings OP1, OP2, and OP3 and the plurality of sub-openings SOP1, SOP2, and SOP3 penetrating the hard mask HM are formed, and the light emitting elements LE including the protrusions NP and the mask patterns MK1, MK2, and MK3 respectively covering the light emitting elements LE are formed in the plurality of first to third openings OP1, OP2 and OP3 and the plurality of sub-openings SOP1, SOP2 and SOP3 (S130).

Figure 25:
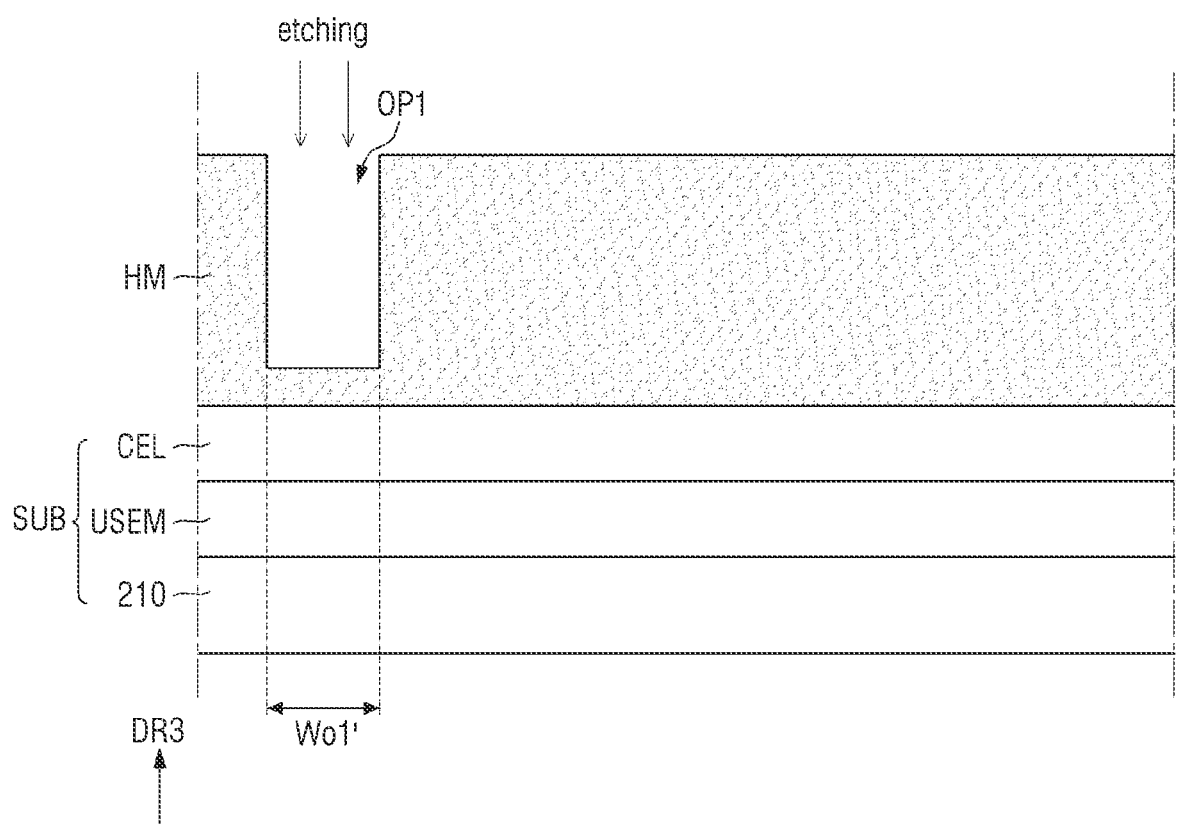
Figure 26:
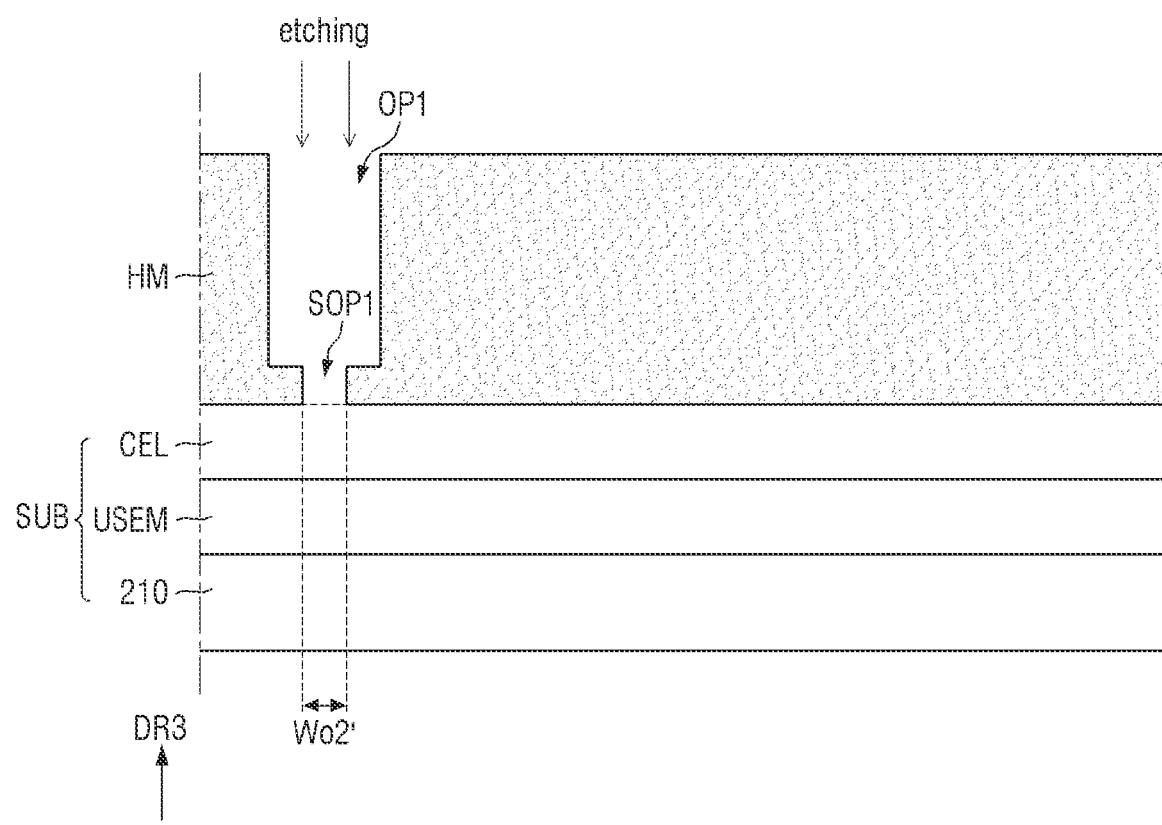
Figure 27:
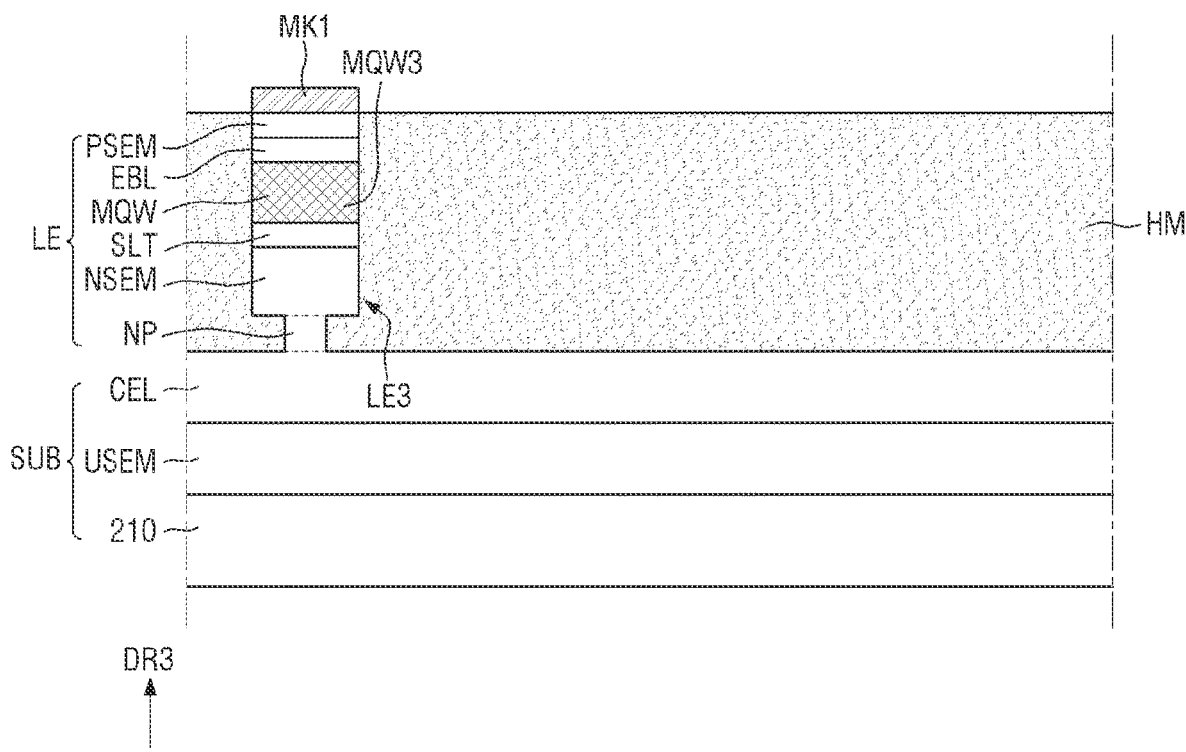

Referring to FIGS. 25 to 27, the first opening OP1 penetrating the hard mask HM is formed, and the first sub-opening SOP1 is formed (S231). Then, the protrusion NP is formed in the first sub-opening SOP1, the third light emitting element LE3 including the second semiconductor layer NSEM, the third active layer MQW3, and the first semiconductor layer PSEM is formed in the first opening OP1, and the first mask pattern MK1 covering the third light emitting element LE3 is formed (S232). The first width Wo1' of the first opening OP1 may be greater than the second width Wo2' of the first sub-opening SOP1.

A part of the hard mask HM is etched to form the first opening OP1 penetrating the hard mask HM. The first opening OP1 may remove a portion of the top surface of the hard mask HM and may not expose the common electrode layer CEL. Then, a portion of the hard mask HM in which the first opening OP1 is formed is etched to have a smaller width to form the first sub-opening SOP1 penetrating the hard mask HM. The first sub-opening SOP1 may remove the hard mask HM to expose the common electrode layer CEL. The plurality of first openings OP1 are spaced from each other, and the plurality of first sub-openings SOP1 are formed to be spaced from each other. The first sub-opening SOP1 may be formed in each of the plurality of first openings OP1. The third light emitting element LE3 is formed in the plurality of first openings OP1, and the protrusion NP is formed in the plurality of first sub-openings SOP1.

Because the third light emitting element LE3 is formed in the first opening OP1 and the first sub-opening SOP1, the width Wo1' of the first opening OP1 may be the same as the width W1' (see FIG. 22) of the first and second semiconductor layers PSEM and NSEM and of the third active layer MQW3, and the width Wo2' of the first sub-opening SOP1 may be the same as the width W2' (see FIG. 22) of the protrusion NP.

The process of forming the light emitting elements LE may be performed through an epitaxial growth method like the process of forming the undoped semiconductor layer USEM and the common electrode layer CEL, and thus it will be omitted. The protrusion NP disposed on the common electrode layer CEL and the second semiconductor layer NSEM disposed on the protrusion NP may include substantially the same material as the common electrode layer CEL, and may be formed by growing semiconductor crystals of the common electrode layer CEL. Accordingly, the second semiconductor layer NSEM, the protrusion NP, and the common electrode layer CEL may be integrated.

Subsequently, the superlattice layer SLT, the third active layer MQW3, the electron blocking layer EBL, and the first semiconductor layer PSEM are sequentially grown to form the third light emitting element LE3, and the process of forming the first mask pattern MK1 is the same as that of FIG. 12.

Figure 28:
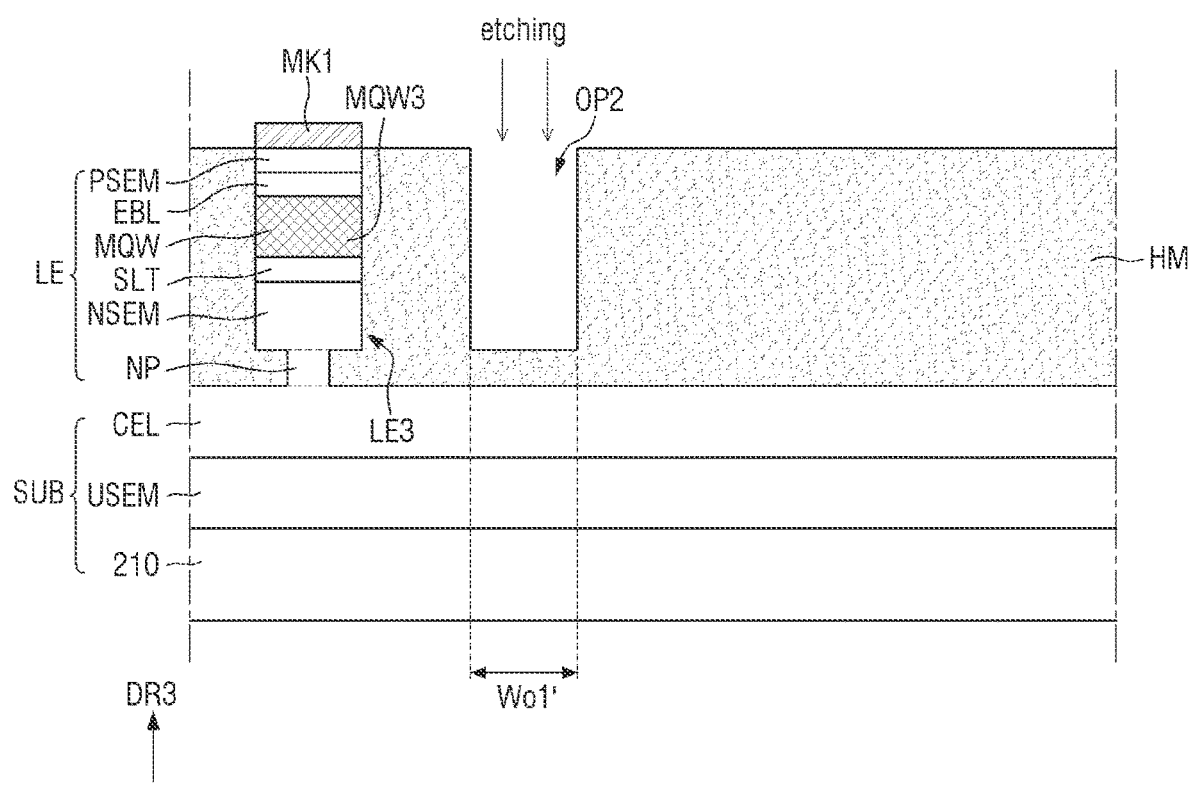
Figure 29:
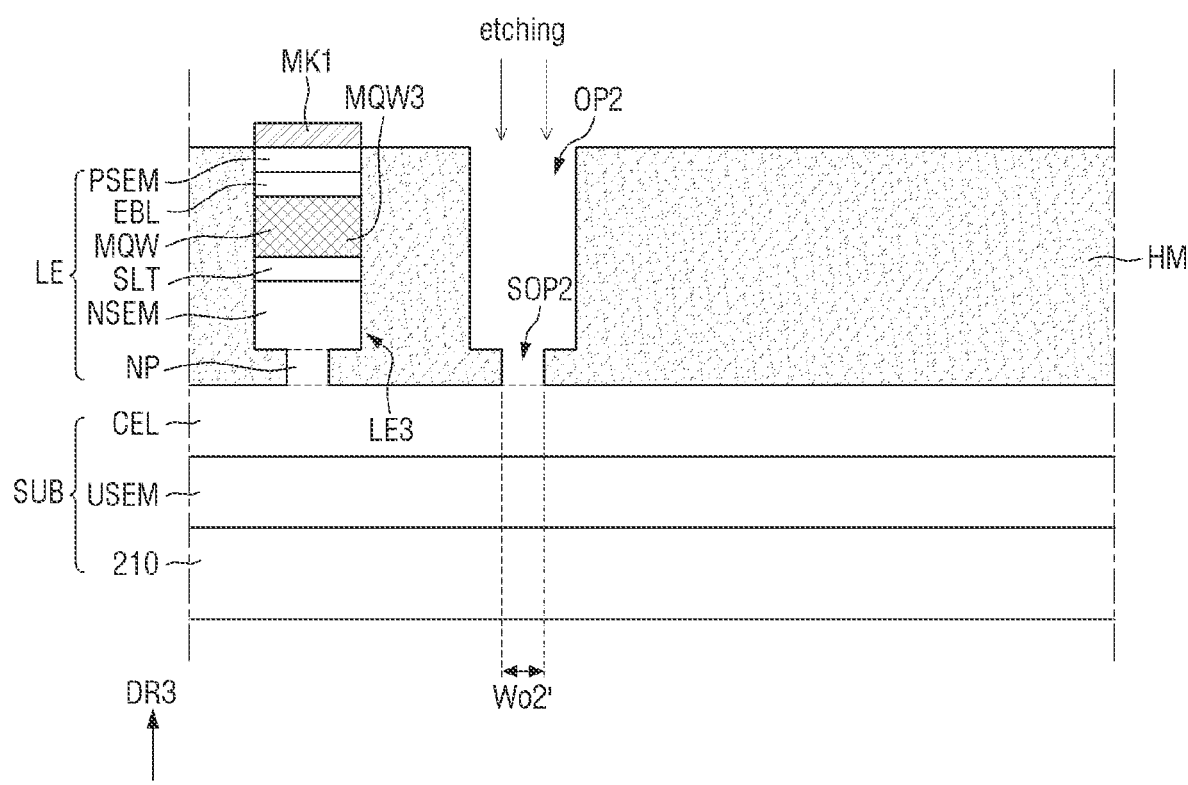
Figure 30:
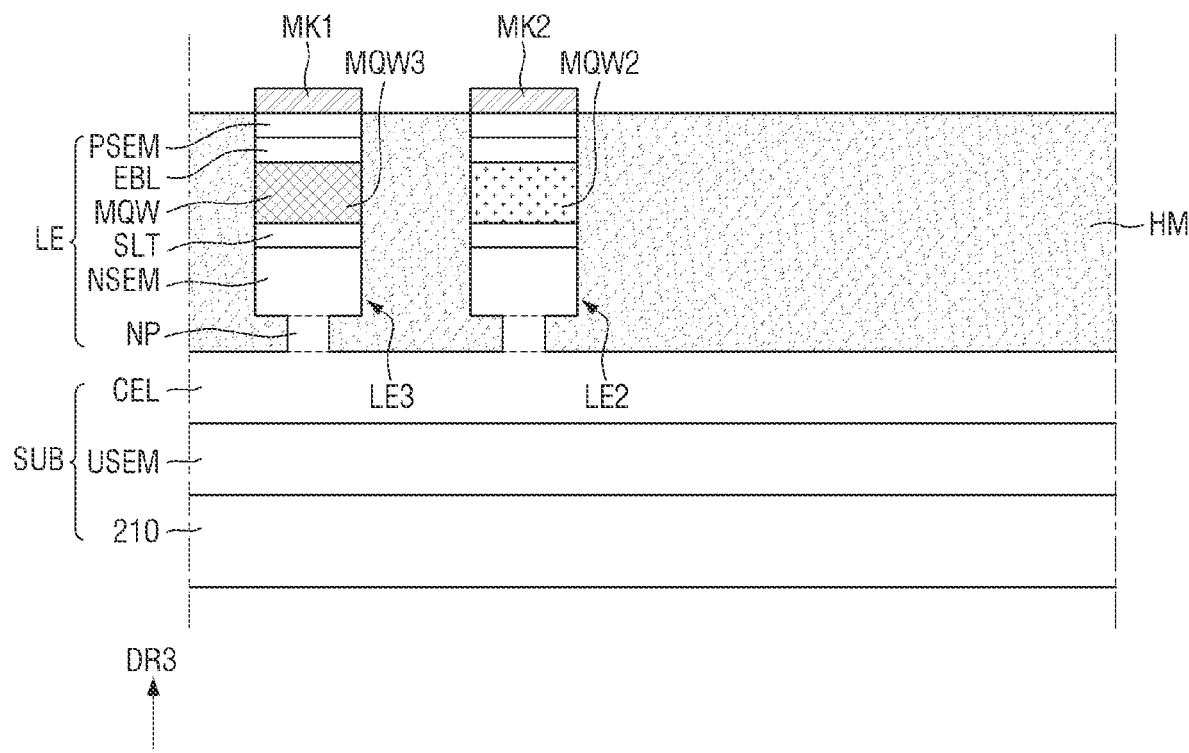

Referring to FIGS. 28 to 30, the second opening OP2 penetrating the hard mask HM is formed, and the second sub-opening SOP2 is formed (S233). Then, the protrusion NP is formed in the second sub-opening SOP2, the second light emitting element LE2 including the second semiconductor layer NSEM, the second active layer MQW2, and the first semiconductor layer PSEM is formed in the second opening OP2, and the second mask pattern MK2 covering the second light emitting element LE2 is formed (S234). The first width Wo1' of the second opening OP2 may be greater than the second width Wo2' of the second sub-opening SOP2. The second sub-opening SOP2 may be formed in each of the plurality of second openings OP2. Because the second light emitting element LE2 is formed in the second opening OP2 and the second sub-opening SOP2, the width Wo1' of the second opening OP2 may be the same as the width W1' (see FIG. 22) of the first and second semiconductor layers PSEM and NSEM and the second active layer MQW2, and the width Wo2' of the second sub-opening SOP2 may be the same as the width W2' (see FIG. 22) of the protrusion NP.

The protrusion NP is formed on the common electrode layer CEL exposed by the second opening OP2 and the second sub-opening SOP2, and the second semiconductor layer NSEM, the superlattice layer SLT, the second active layer MQW2, the electron blocking layer EBL, and first semiconductor layer PSEM are sequentially grown on the protrusion NP to form the second light emitting element LE2. Thereafter, the second mask pattern MK2 covering the second light emitting element LE2 is formed. This is the same as that of FIG. 14.

Figure 31:
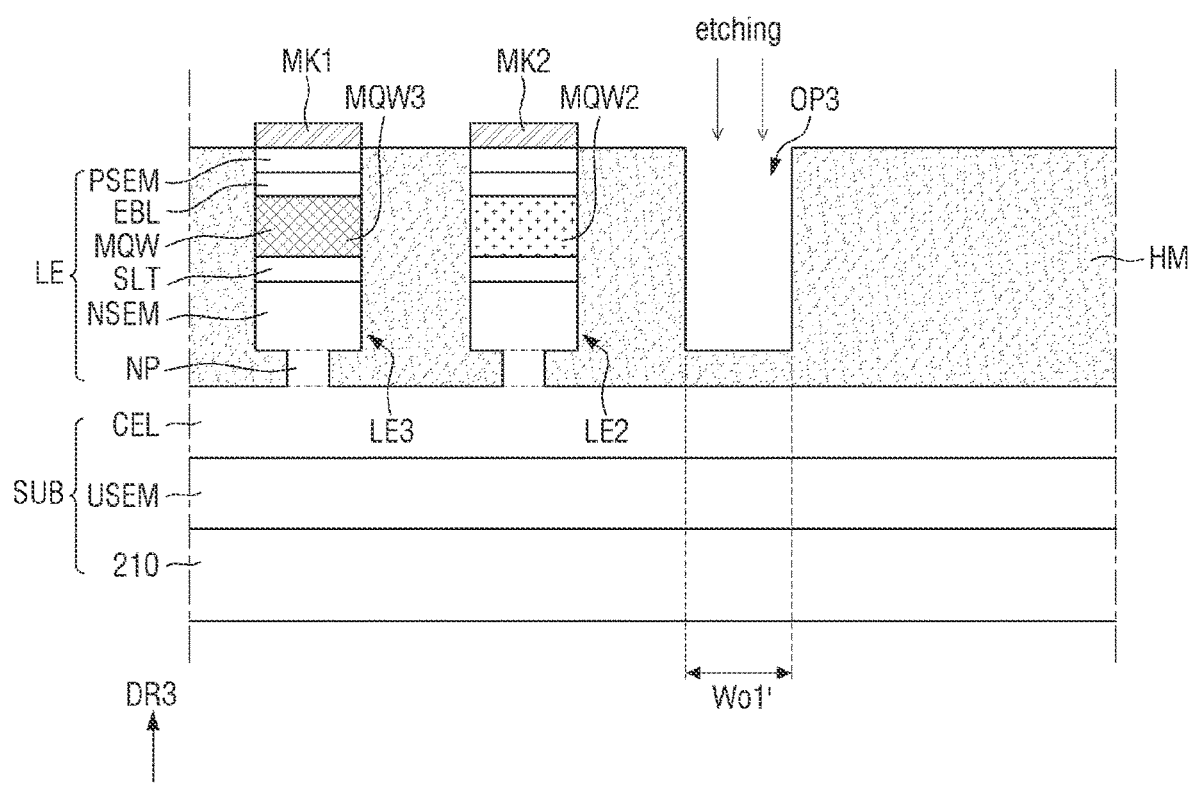
Figure 32:
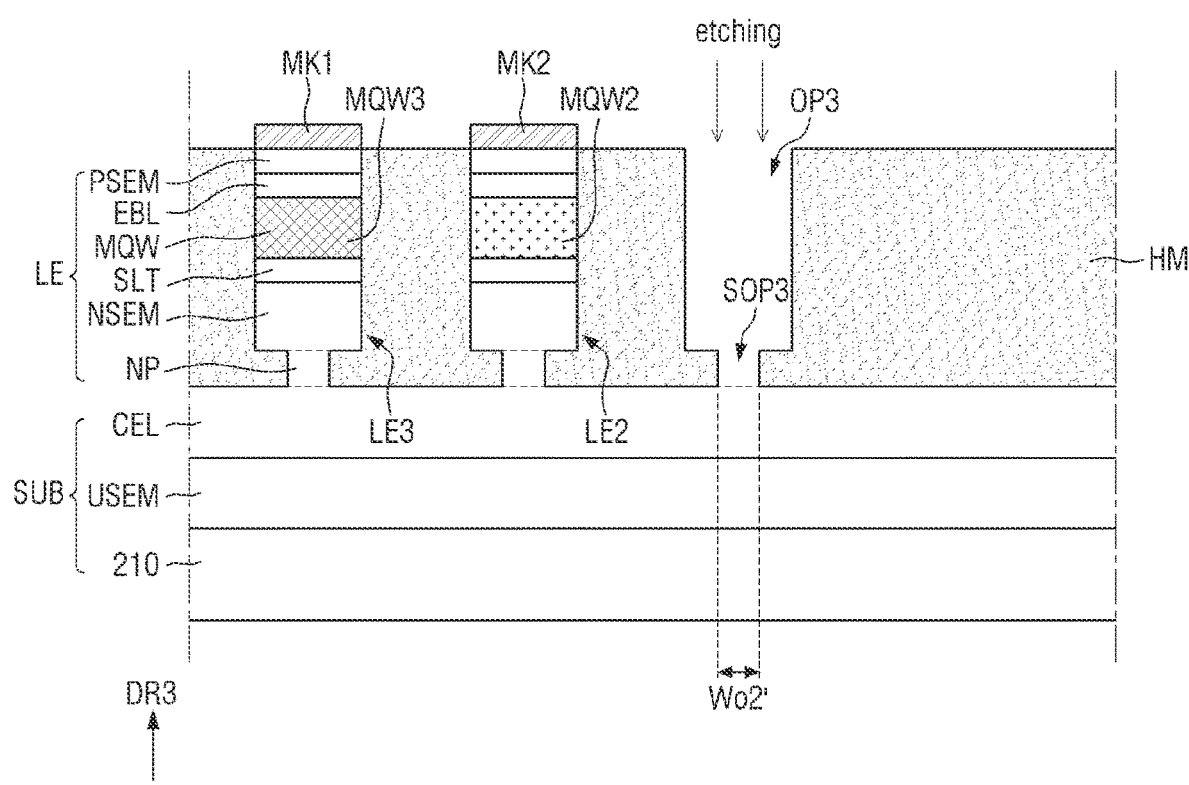
Figure 33:
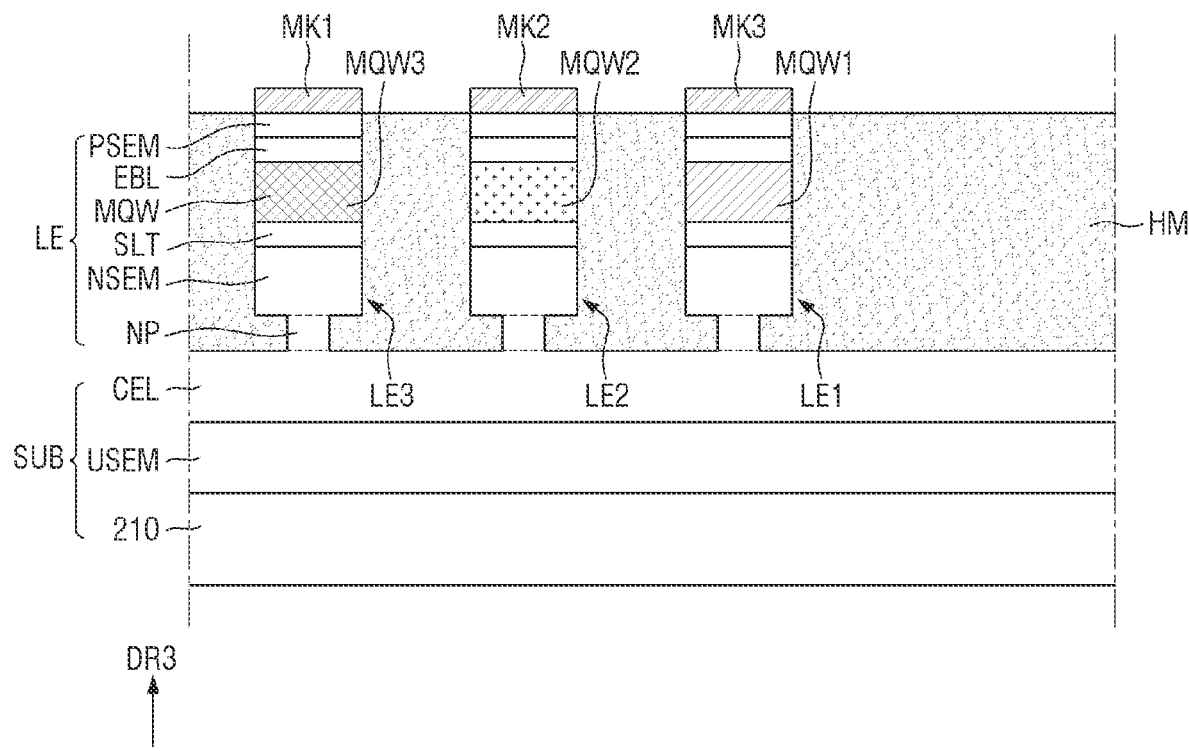

Referring to FIGS. 31 to 33, the third opening OP3 penetrating the hard mask HM is formed, and the third sub-opening SOP3 is formed (S235). Then, the protrusion NP is formed in the third sub-opening SOP3, the first light emitting element LE1 including the second semiconductor layer NSEM, the first active layer MQW1, and the first semiconductor layer PSEM is formed in the third opening OP3, and the third mask pattern MK3 covering the first light emitting element LE1 is formed (S236). The first width Wo1' of the third opening OP3 may be greater than the second width Wo2' of the third sub-opening SOP3. Because the first light emitting element LE1 is formed in the third opening OP3 and the third sub-opening SOP3, the width Wo1' of the third opening OP3 may be the same as the width W1' (see FIG. 22) of the first and second semiconductor layers PSEM and NSEM and the first active layer MQW1, and the width Wo2' of the third sub-opening SOP3 may be the same as the width W2' (see FIG. 22) of the protrusion NP.

In the same manner as described above but under different process conditions, materials, and the like, the protrusion NP is formed on the common electrode layer CEL, and the first light emitting element LE1 including the first active layer MQW1, and the third mask pattern MK3 covering the first light emitting element LE1 are formed on the protrusion NP. A detailed description thereof is the same as described above.

Figure 34:
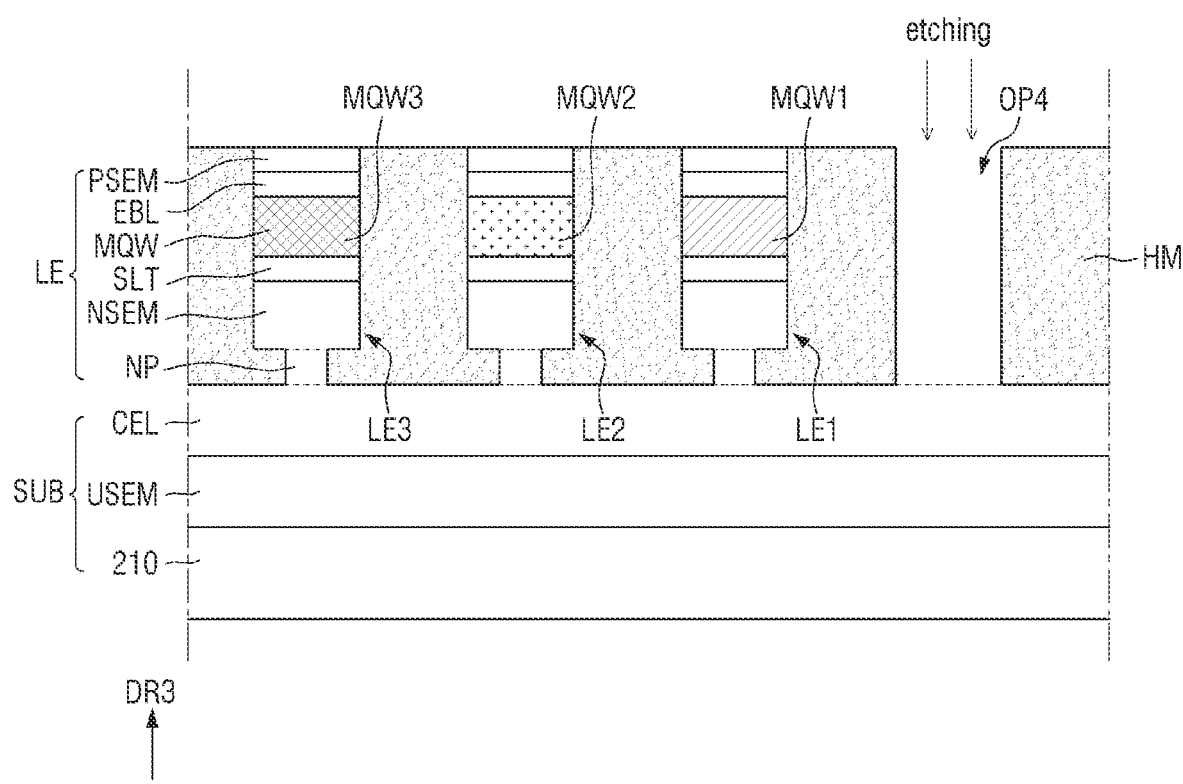
Figure 35:
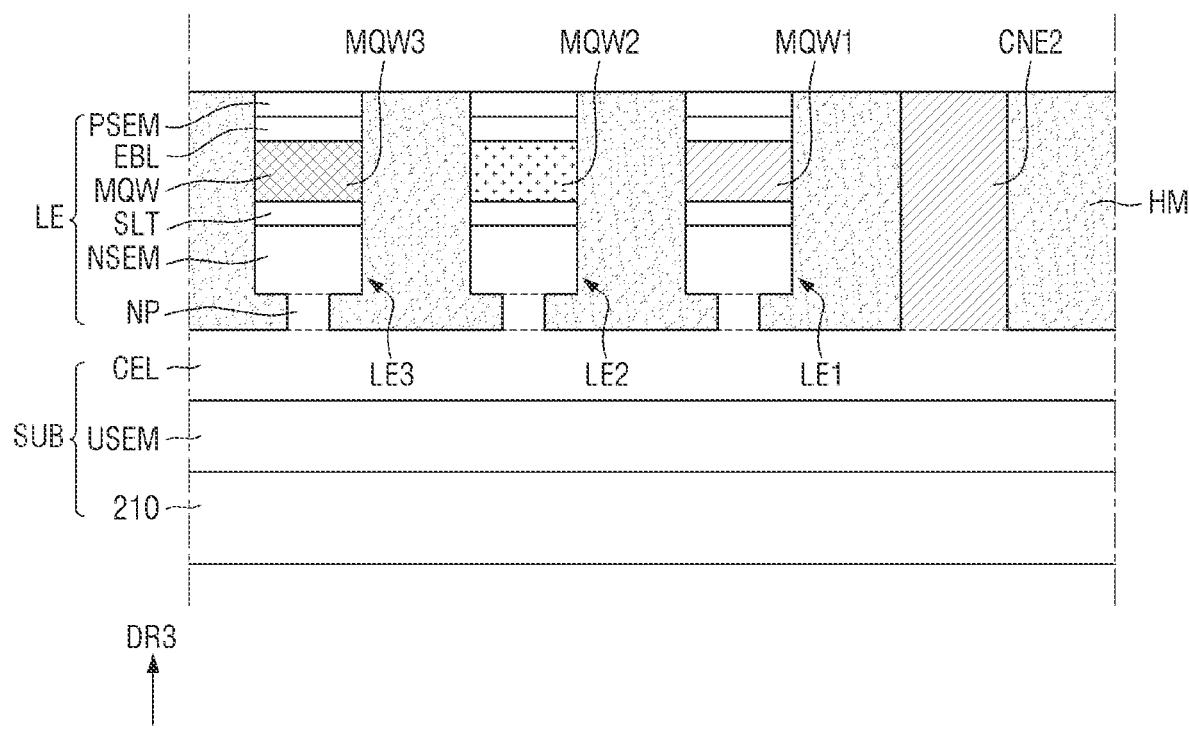
Figure 36:
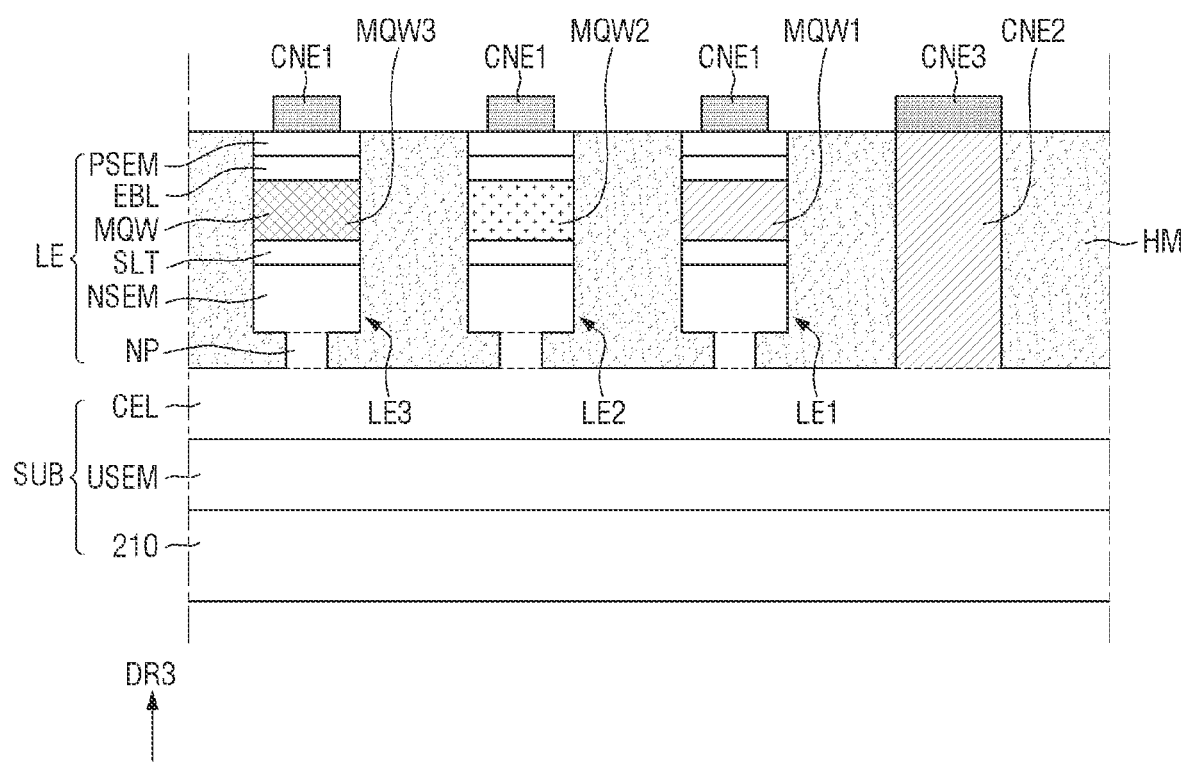

Next, as illustrated in FIGS. 34 to 36, the mask patterns MK1, MK2, and MK3 are removed, and the first connection electrode CNE1 is formed on the light emitting elements LE (S140). In addition, the second connection electrode CNE2 and the third connection electrode CNE3 are formed in the common electrode areas CPA1 and CPA2. The process of forming the first connection electrode CNE1 is omitted because it is the same as that of FIG.

17, and the process of forming the second connection electrode CNE2 and the third connection electrode CNE3 will be described.

Referring to FIG. 34, a fourth opening OP4 penetrating the hard mask HM is formed. The fourth opening OP4 may be spaced from the first to third light emitting elements LE1, LE2, and LE3, and may be disposed in the common electrode areas CPA1 and CPA2 of the display panel 10. The process of forming the fourth opening OP4 may be performed concurrently (e.g., simultaneously) with the etching process of removing the mask patterns MK1, MK2, and MK3, but is not limited thereto.

Referring to FIG. 35, the second connection electrode CNE2 is formed in the fourth opening OP4. The second connection electrode CNE2 may be directly disposed on the common electrode layer CEL in the common electrode areas CPA1 and CPA2.

Referring to FIG. 36, the third connection electrode CNE3 is formed on the top surface of the second connection electrode CNE2. The third connection electrode CNE3 may be concurrently (e.g., simultaneously) formed through the same process as the first connection electrode CNE1. The third connection electrode CNE3 and the second connection electrode CNE2 may serve as a common electrode of the light emitting elements LE in cooperation with the common electrode layer CEL.

Through the above process, the display substrate 200 disposed on the second substrate 210 may be fabricated. Then, the display device 1 may be fabricated by bonding the semiconductor circuit substrate 100 and the display substrate 200 to each other.

Figure 37:
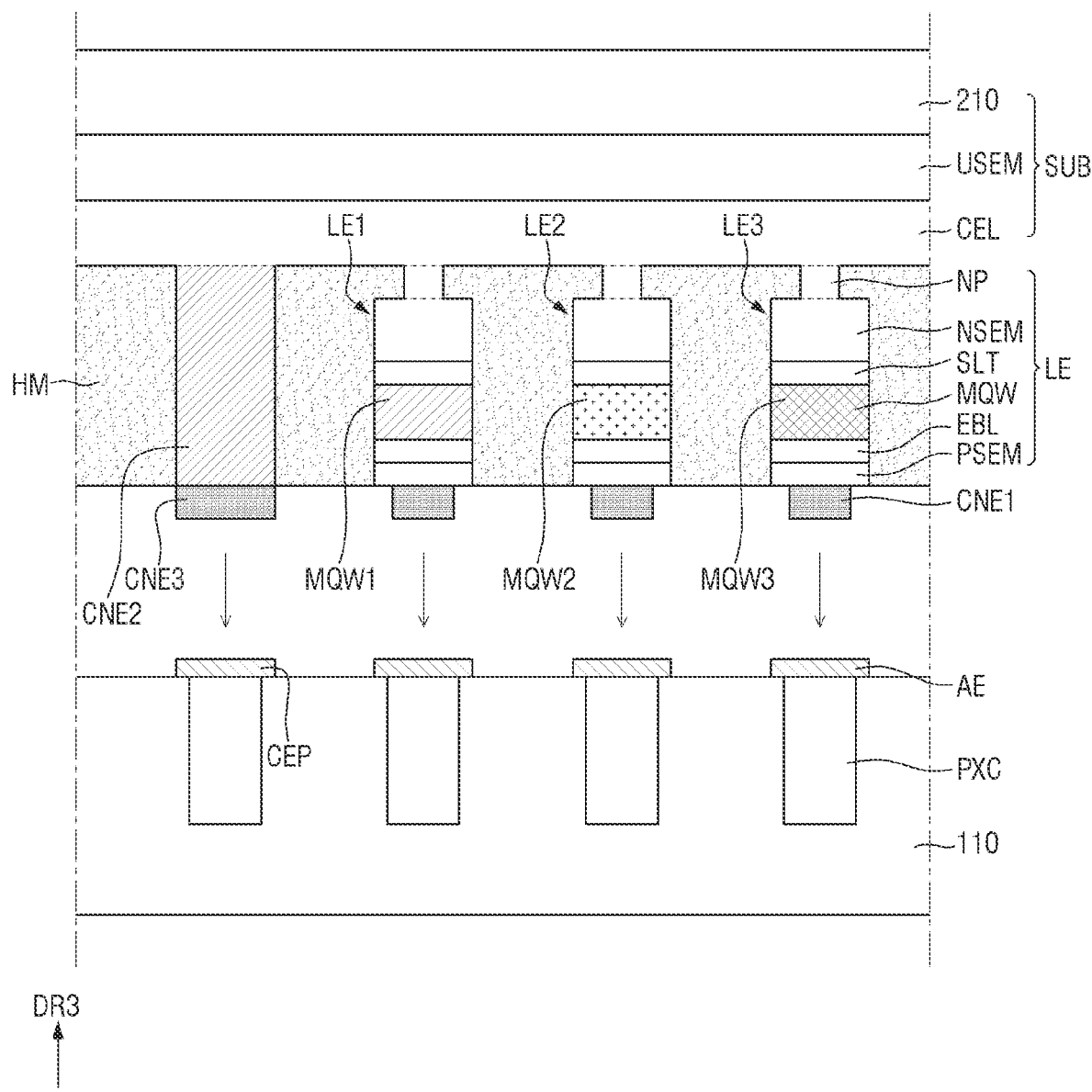

Referring to FIG. 37, the base substrate SUB on which the light emitting elements LE defined by the hard mask HM are formed and the semiconductor circuit substrate 100 are bonded (S150).

The semiconductor circuit substrate 100 further includes the common electrode connection portion CEP in addition to the pixel electrode AE formed on the first substrate 110. The common electrode connection portion CEP of the semiconductor circuit substrate 100, and the second connection electrode CNE2 and the third connection electrode CNE3 of the display substrate 200 may be aligned to overlap in a thickness direction (e.g., the third direction DR3).

The first connection electrode CNE1 disposed on the light emitting elements LE of the display substrate 200 may be directly in contact with the pixel electrode AE, and the third connection electrode CNE3 disposed in the common electrode areas CPA1 and CPA2 may be directly in contact with the common electrode connection portion CEP. When the semiconductor circuit substrate 100 and the display substrate 200 are bonded to each other, both ends of the light emitting elements LE may be electrically connected to the pixel circuit unit PXC of the semiconductor circuit substrate 100.

Figure 38:
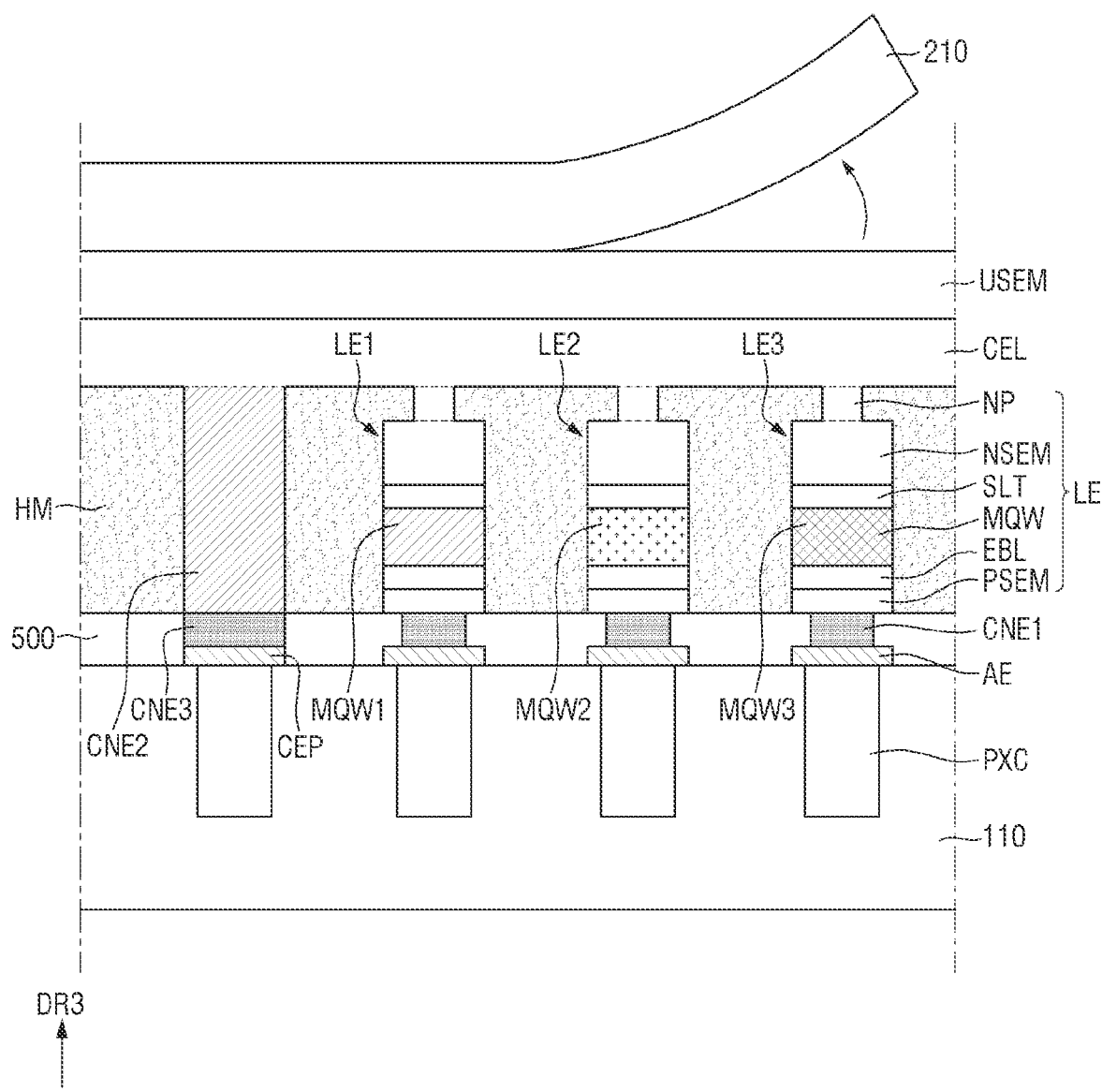
Figure 39:
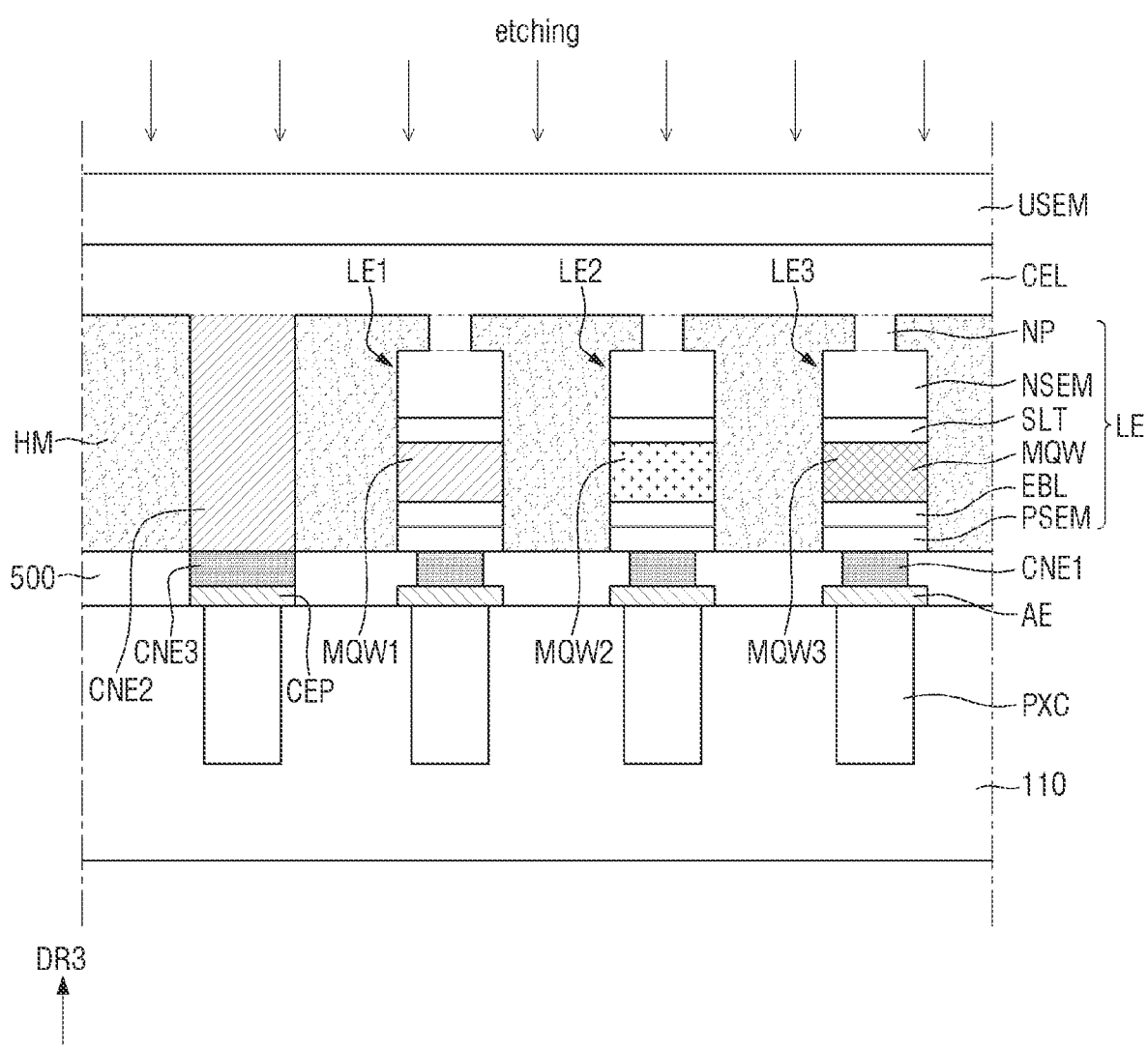
Figure 40:
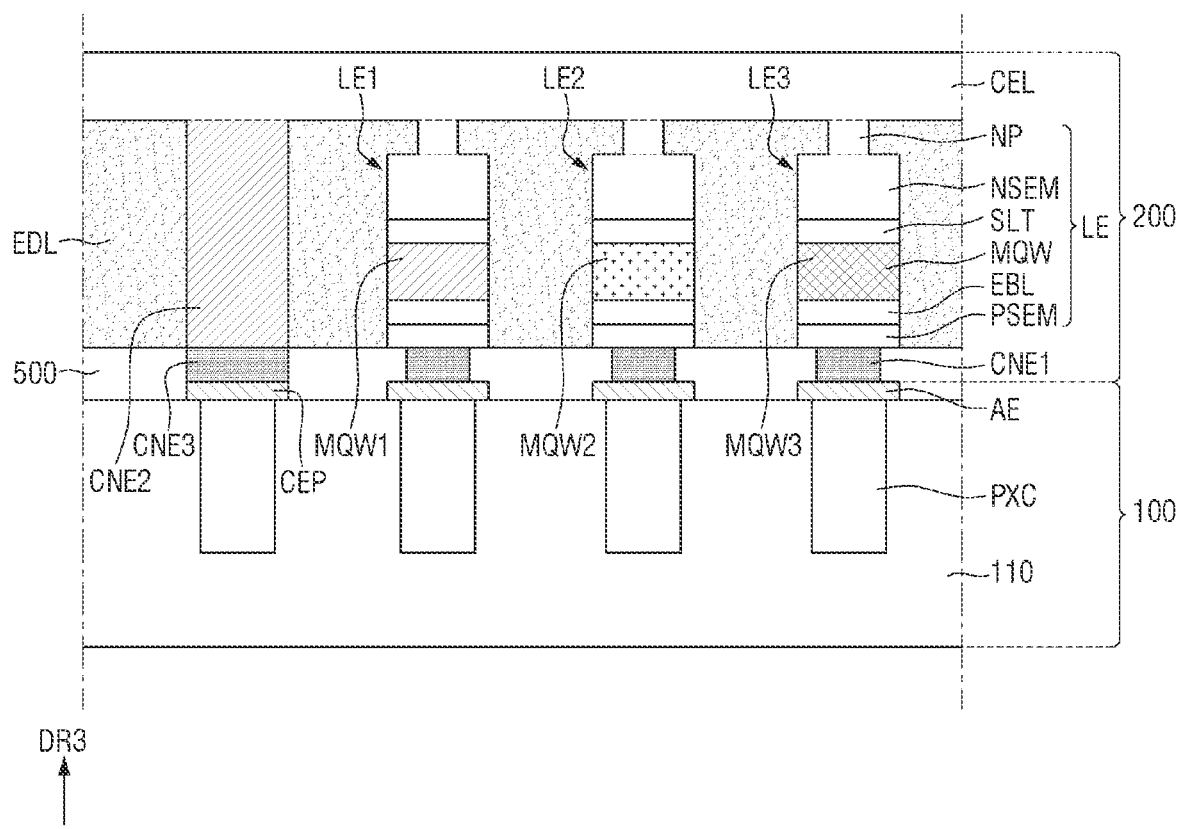

Next, referring to FIGS. 38 to 40, the undoped semiconductor layer USEM and the second substrate 210 of the display substrate 200 may be removed to fabricate the display device 1.

Hereinafter, another method for fabricating the display device 1 according to FIG. 22 will be described with reference to FIGS. 41 to 45.

Figure 41:
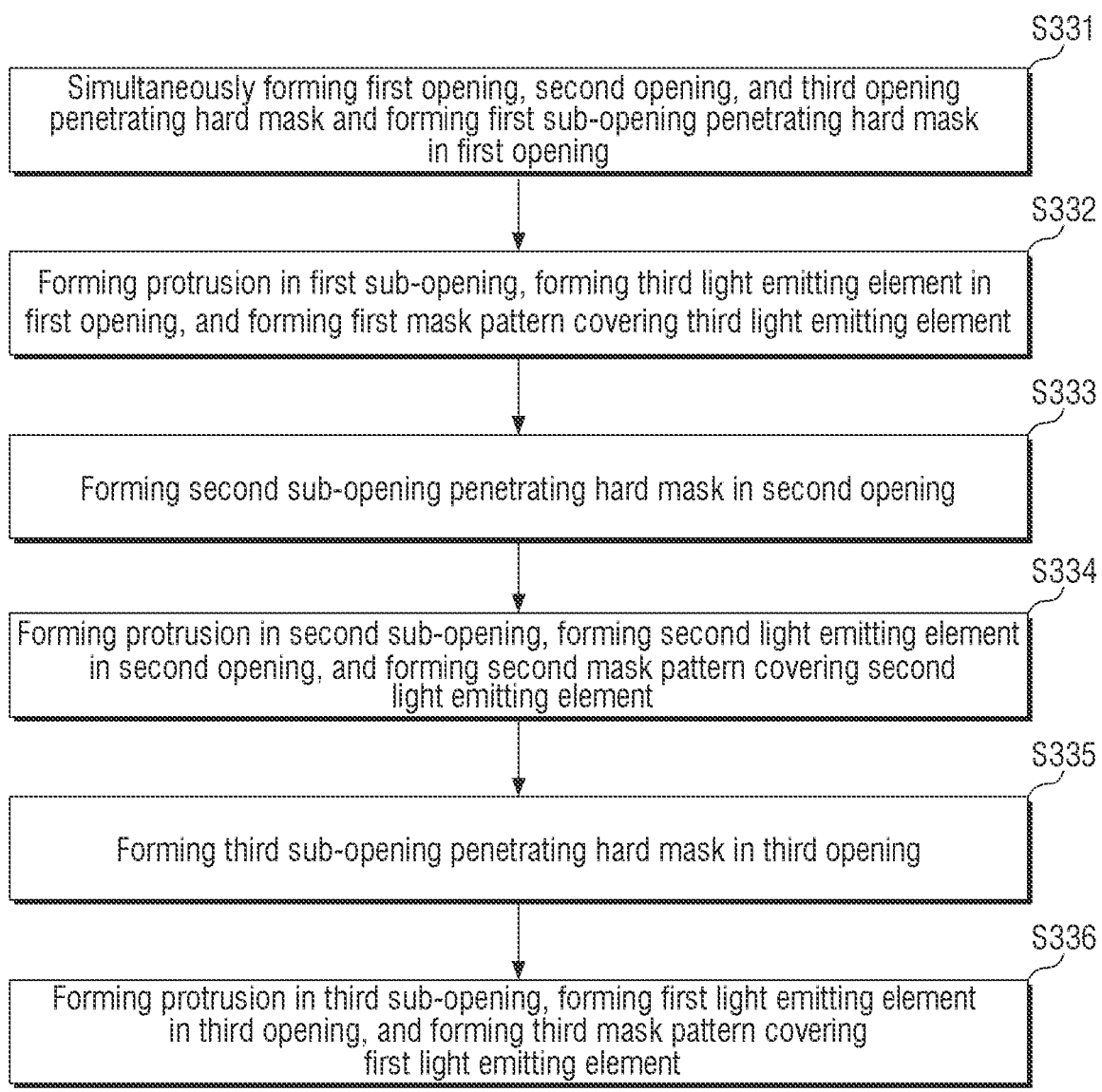
FIG. 41 is a flowchart illustrating an example of the fabricating method of S130 of FIG. 7.

FIG. 41 is a flowchart illustrating an example of the fabricating method of S130 of FIG. 7. FIGS. 42 to 45 are cross-sectional views sequentially illustrating a fabricating process of a display device according to one or more embodiments.

In the method for fabricating the display device 1 according to the present embodiment, the S130 of forming the light emitting elements LE in the plurality of openings OP and the mask patterns MK1, MK2 and MK3 respectively covering the light emitting elements LE by forming the plurality of openings OP penetrating the hard mask HM may be different from the previous embodiment.

The method for fabricating the display device 1 according to the present embodiment differs from the previous embodiment in that after concurrently (e.g., simultaneously) forming the first opening OP1, the second opening OP2, and the third opening OP3, the first sub-opening SOP1, the second sub-opening SOP2, and the third sub-opening SOP3 are sequentially formed in the respective openings. The fact that the first width W1' of the first to third openings OP1, OP2, and OP3 is greater than the second width W2' of the first to third sub-openings SOP1, SOP2, and SOP3 is the same as before, and the fact that a separate etching process is not required because the light emitting elements LE1, LE2, and LE3 may be defined by the opening of the hard mask HM is the same.

For example, the method for fabricating the display device 1 according to the present embodiment further include concurrently (e.g., simultaneously) forming the first opening OP1, the second opening OP2, and the third opening OP3 penetrating the hard mask HM and forming the first sub-opening SOP1 penetrating the hard mask HM in the first opening OP1 (S331), forming the protrusion NP in the first sub-opening SOP1, forming the third light emitting element LE3 in the first opening OP1, and forming the first mask pattern MK1 covering the third light emitting element LE3 (S332), forming the second sub-opening SOP2 penetrating the hard mask HM in the second opening OP2 (S333), forming the protrusion NP in the second sub-opening SOP2, forming the second light emitting element LE2 in the second opening OP2, and forming the second mask pattern MK2 covering the second light emitting element LE2 (S334), forming the third sub-opening SOP3 penetrating the hard mask HM in the third opening OP3 (S335), and forming the protrusion NP in the third sub-opening SOP3, forming the first light emitting element LE1 in the third opening OP3, and forming the third mask pattern MK3 covering the first light emitting element LE1 (S336).

FIGS. 42 to 45 exemplarily illustrate a process of forming the third light emitting element LE3 based on one cross section of the display device 1 illustrated in FIG. 22.

Figure 42:
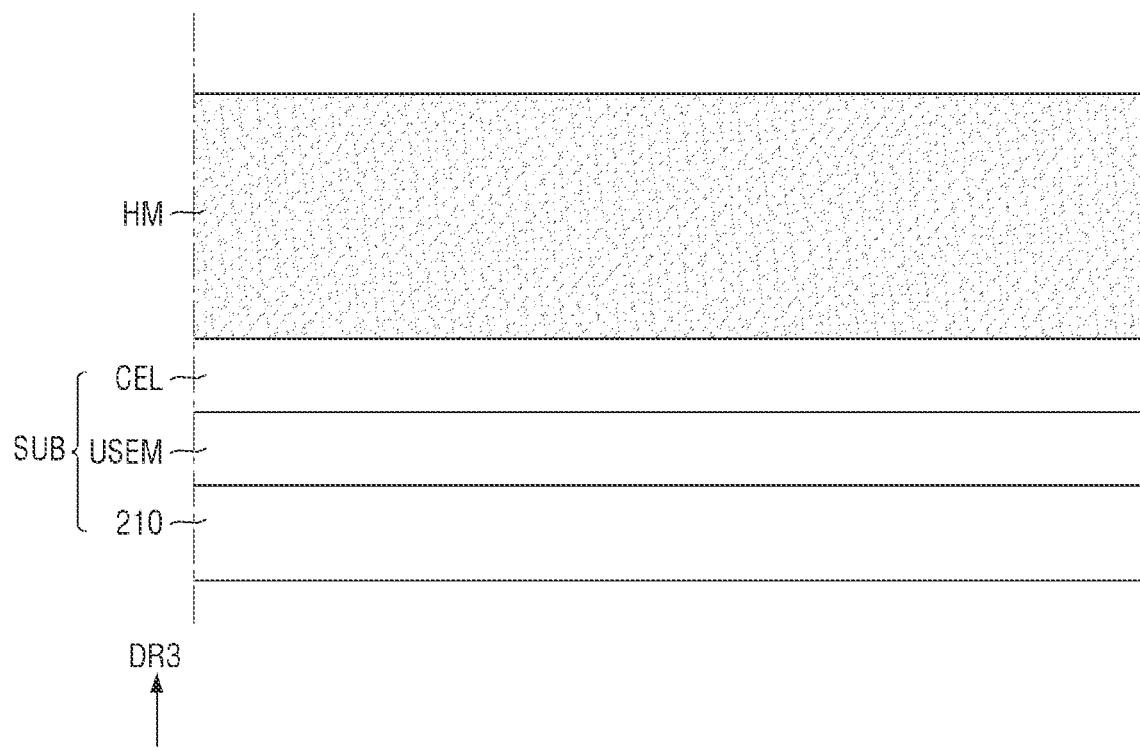
FIGS. 42 to 45 are cross-sectional views sequentially illustrating a fabricating process of a display device according to one or more embodiments.

Referring to FIG. 42, the hard mask HM is formed on the base substrate SUB including the second substrate 210, the undoped semiconductor layer USEM, and the common electrode layer CEL.

Figure 43:
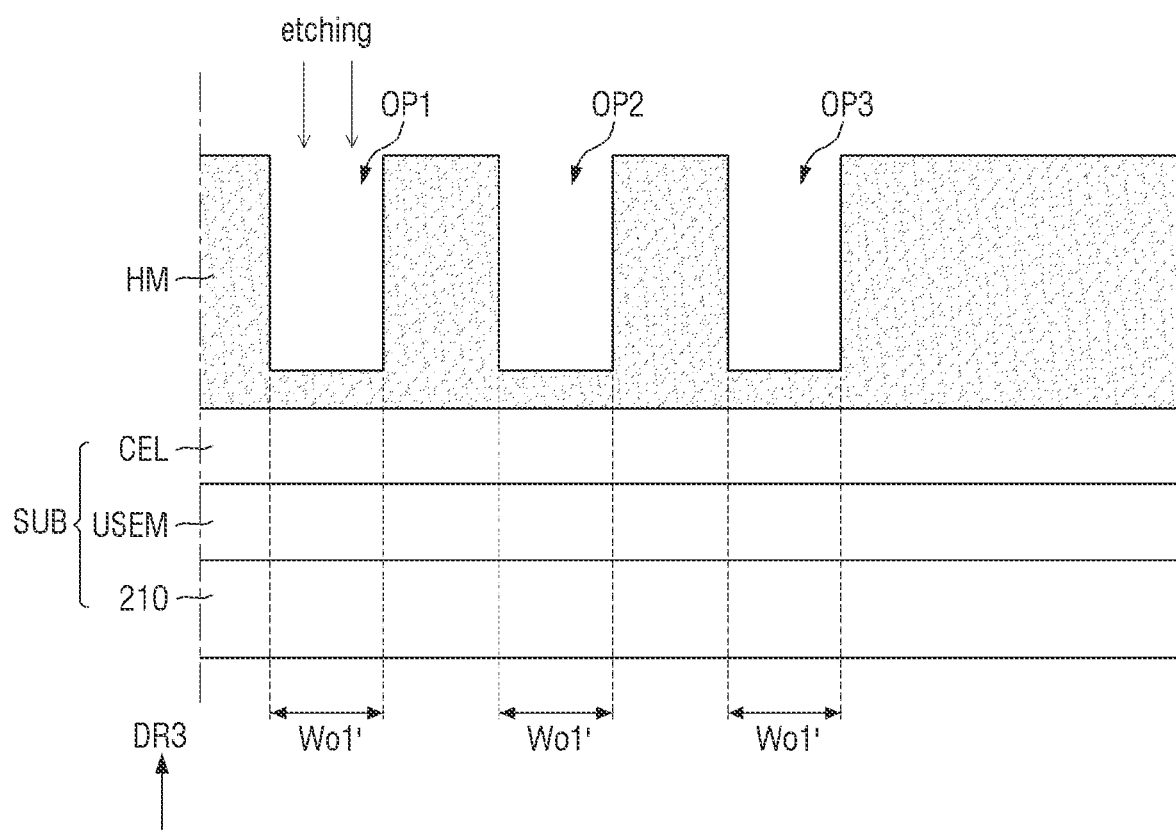
Figure 44:
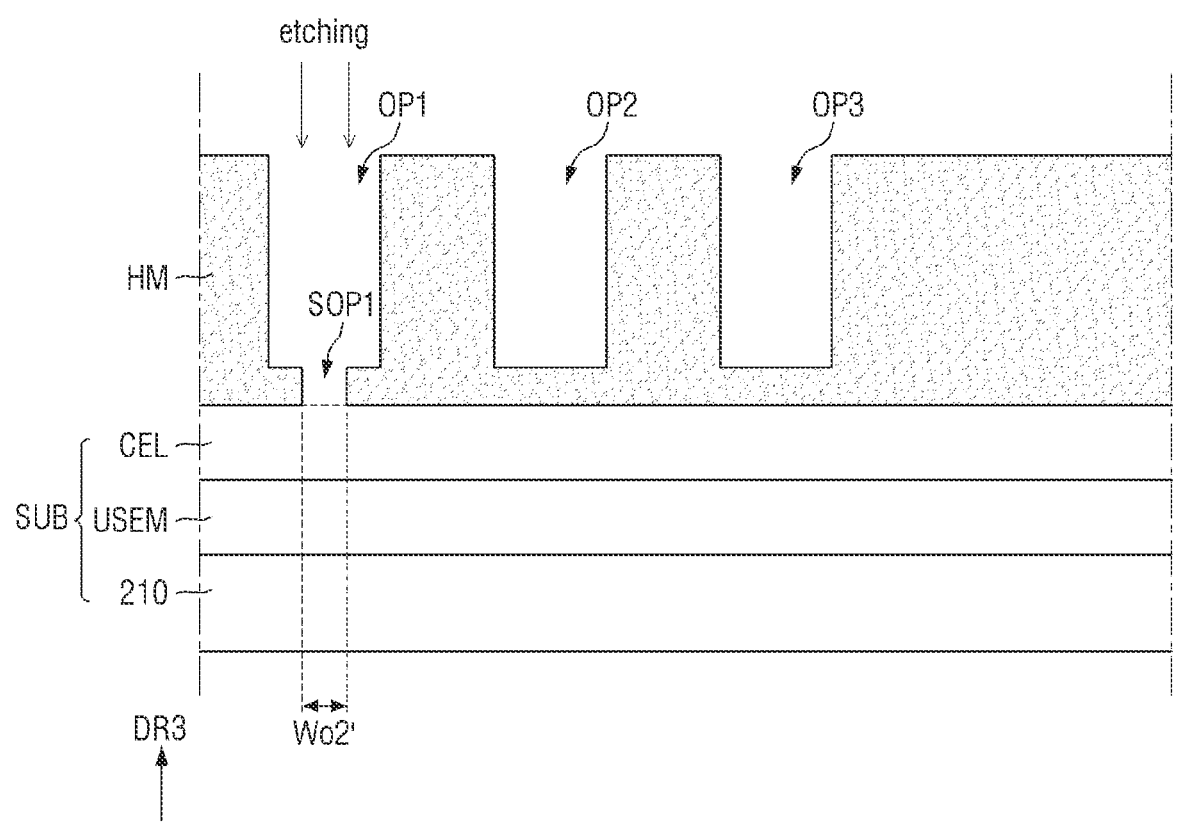

Referring to FIGS. 43 and 44, the first opening OP1, the second opening OP2, and the third opening OP3 penetrating the hard mask HM are concurrently (e.g., simultaneously) formed, and the first sub-opening SOP1 penetrating the hard mask HM is formed in the first opening OP1 (S331). The first to third openings OP1, OP2, and OP3 may be concurrently (e.g., simultaneously) formed through an etching process using the same mask.

Figure 45:
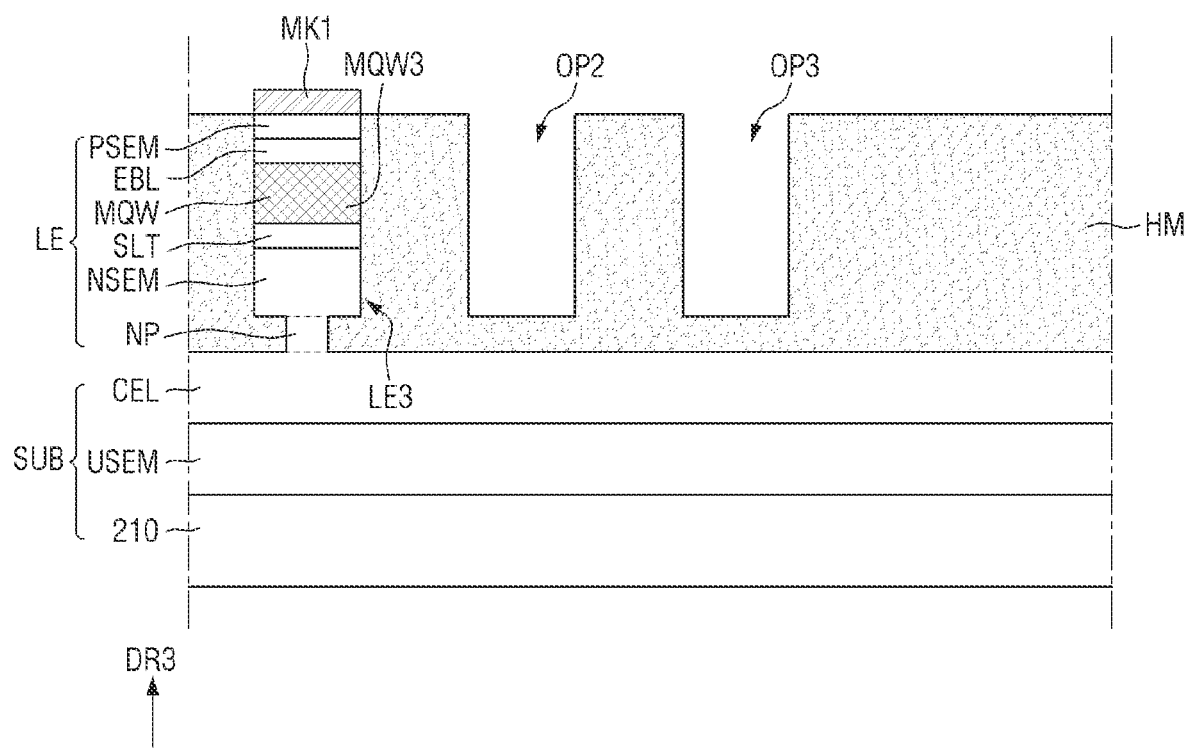

Referring to FIG. 45, the protrusion NP is formed in the first sub-opening SOP1, the third light emitting element LE3 is formed in the first opening OP1, and the first mask pattern MK1 covering the third light emitting element LE3 is formed (S332).

Because the process of forming the light emitting elements LE and the protrusion NP may be performed through the above-described epitaxial growth method, a detailed description thereof will be omitted. Then, the second semiconductor layer NSEM, the superlattice layer SLT, the third active layer MQW3, the electron blocking layer EBL, and the first semiconductor layer PSEM are sequentially grown to form the third light emitting element LE3. Because the protrusion NP and the second semiconductor layer NSEM may include the same material as the common electrode layer CEL and may be formed by growing semiconductor crystals of the common electrode layer CEL, the common electrode layer CEL, the protrusion NP, and the second semiconductor layer NSEM may be integrated.

In this process, only the third light emitting elements LE3 having the third active layer MQW3 may be formed, and in subsequent repeated processes, the light emitting elements LE1 and LE2 including the second active layer MQW2 or the first active layer MQW1 may be formed. The process of forming the first light emitting element LE1 and the second light emitting element LE2 is the same as described above but is performed under different process conditions, materials, and the like, and the detailed description thereof is the same as described above.

In the method for fabricating the display device 1 according to the present embodiment, because the first to third openings OP1, OP2, and OP3 are concurrently (e.g., simultaneously) formed, the number of masks may be reduced and the process may be simplified.

Figure 46:
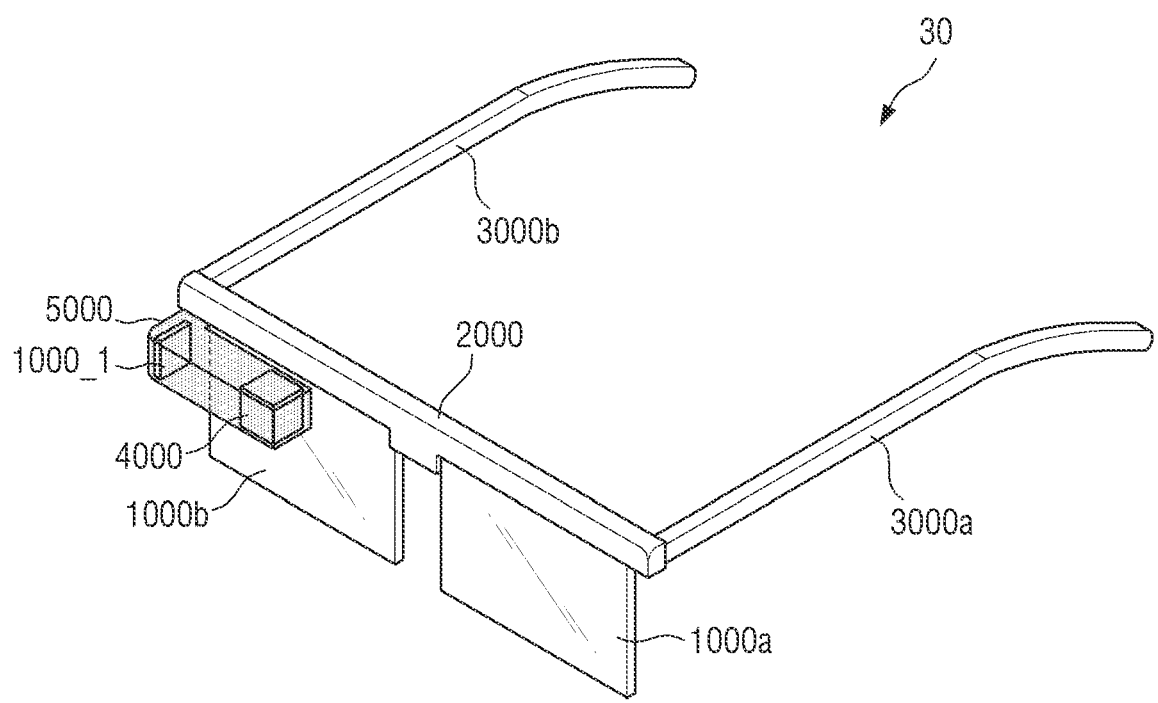
FIG. 46 is an diagram illustrating a virtual reality device including a display device according to one or more embodiments.

FIG. 46 is an diagram illustrating a virtual reality device including a display device according to one or more embodiments. FIG. 46 illustrates a virtual reality device 30 to which a display device 1000_1 according to one or more embodiments is applied.

Referring to FIG. 46, the virtual reality device 30 according to one embodiment may be a glass-type device. The virtual reality device 30 according to one or more embodiments may include the display device 1000_1, a left lens 1000a, a right lens 1000b, a support frame 2000, temples 3000a and 3000b, a reflection member 4000, and a display device storage 5000.

Although FIG. 46 illustrates the virtual reality device 30 including the temples 3000a and 3000b, the virtual reality device 30 according to one or more embodiments may be applied to a head mounted display including a head mounted band that may be worn on a head, instead of the temples 3000a and 3000b. That is, the virtual reality device 30 according to one or more embodiments is not limited to that shown in FIG. 46, and may be applied in various forms to various electronic devices.

The display device storage 5000 may include the display device 1000_1 and the reflection member 4000. The image displayed on the display device 1000_1 may be reflected by the reflection member 4000 and provided to a user's right eye through the right lens 1000b. Accordingly, the user can view the virtual reality image displayed on the display device 1000_1 through the right eye.

FIG. 46 illustrates that the display device storage 5000 is disposed at the end on the right side of the support frame 2000, but the present specification is not limited thereto. For example, the display device storage 5000 may be disposed at the left end of the support frame 2000, and in this case, the image displayed on the display device 1000_1 may be reflected by the reflection member 4000 and provided to a user's left eye through the left lens 1000a. Accordingly, the user can view the virtual reality image displayed on the display device 1000_1 through the left eye. Alternatively, the display device storage 5000 may be disposed at both the left end and the right end of the support frame 2000. In that case, the user can view the virtual reality image displayed on the display device 1000_1 through both the left eye and the right eye.

Figure 47:
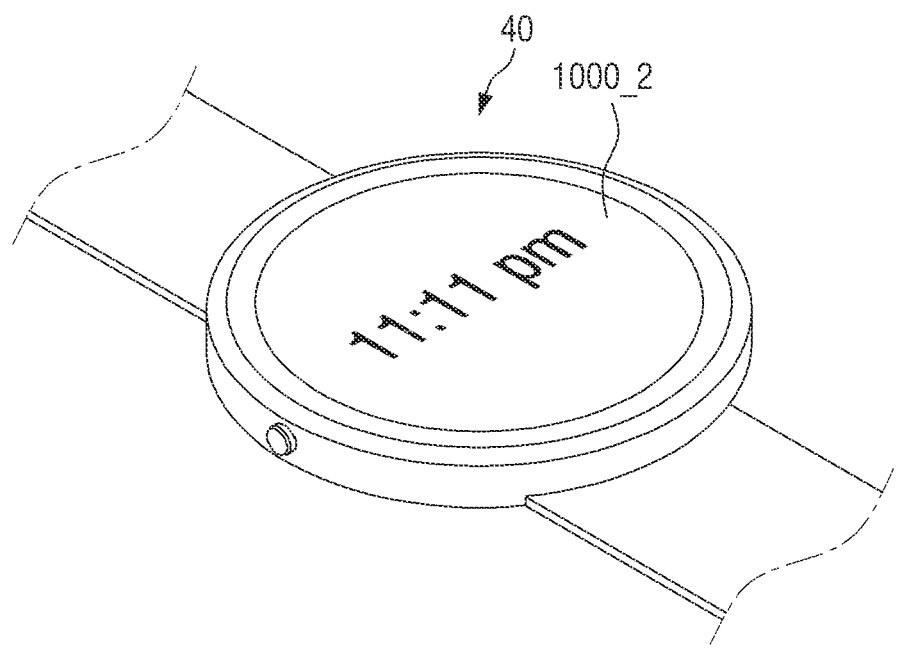
FIG. 47 is an diagram illustrating a smart device including a display device according to one or more embodiments.

FIG. 47 is an diagram illustrating a smart device including a display device according to one or more embodiments.

Referring to FIG. 47, a display device 1000_2 according to one or more embodiments may be applied to a smart watch 40 that is one of the smart devices.

Figure 48:
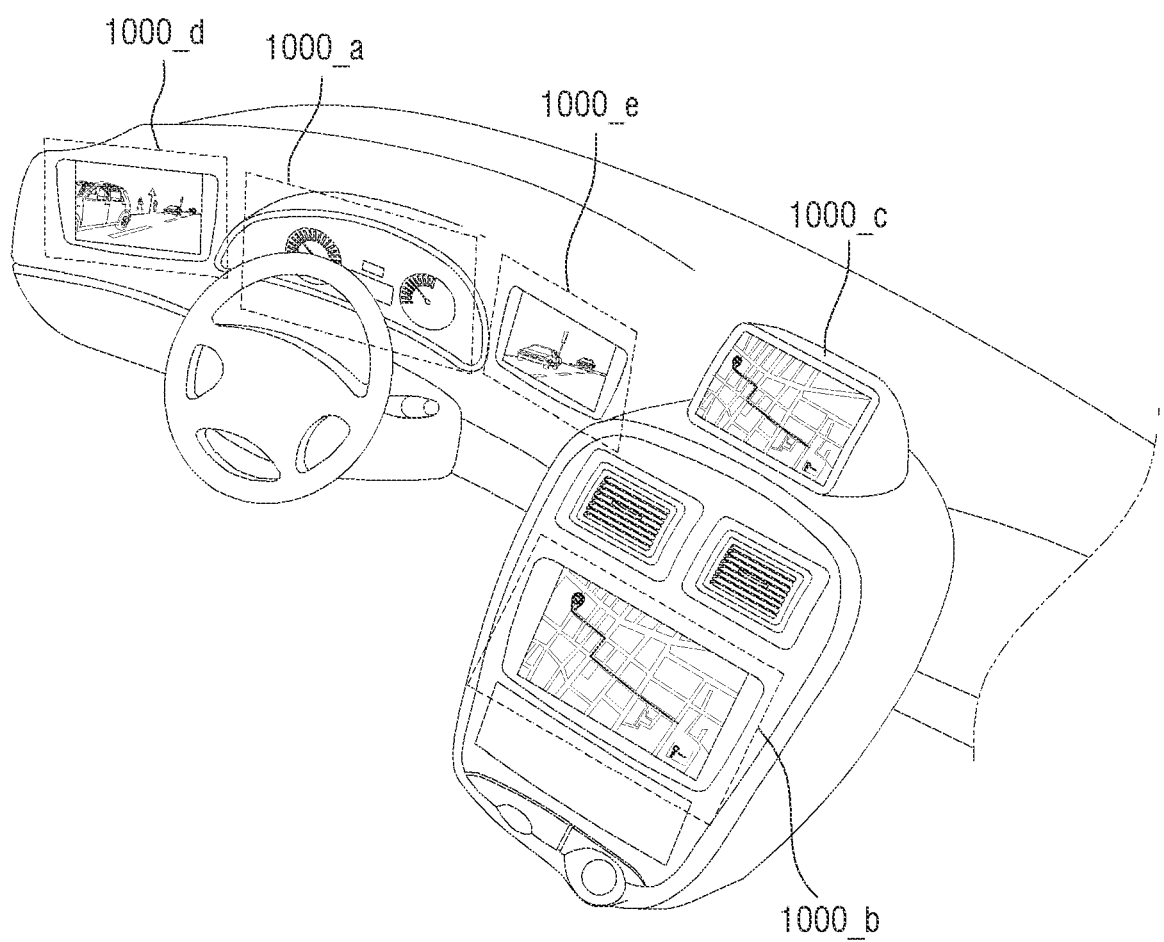
FIG. 48 is an diagram illustrating a vehicle instrument panel and a center fascia including a display device according to one or more embodiments.

FIG. 48 is an diagram illustrating a vehicle instrument panel and a center fascia including a display device according to one or more embodiments. FIG. 48 illustrates a vehicle to which display devices 1000_a, 1000_b, 1000_c, 1000_d, and 1000_e according to one or more embodiments are applied.

Referring to FIG. 48, the display devices 1000_a, 1000_b, and 1000_c according to one or more embodiments may be applied to the dashboard of the automobile, the center fascia of the automobile, or the center information display (CID) of the dashboard of the automobile. Further, the display devices 1000_d, and 1000_e according to one or more embodiments may be applied to a room mirror display instead of side mirrors of the automobile.

Figure 49:
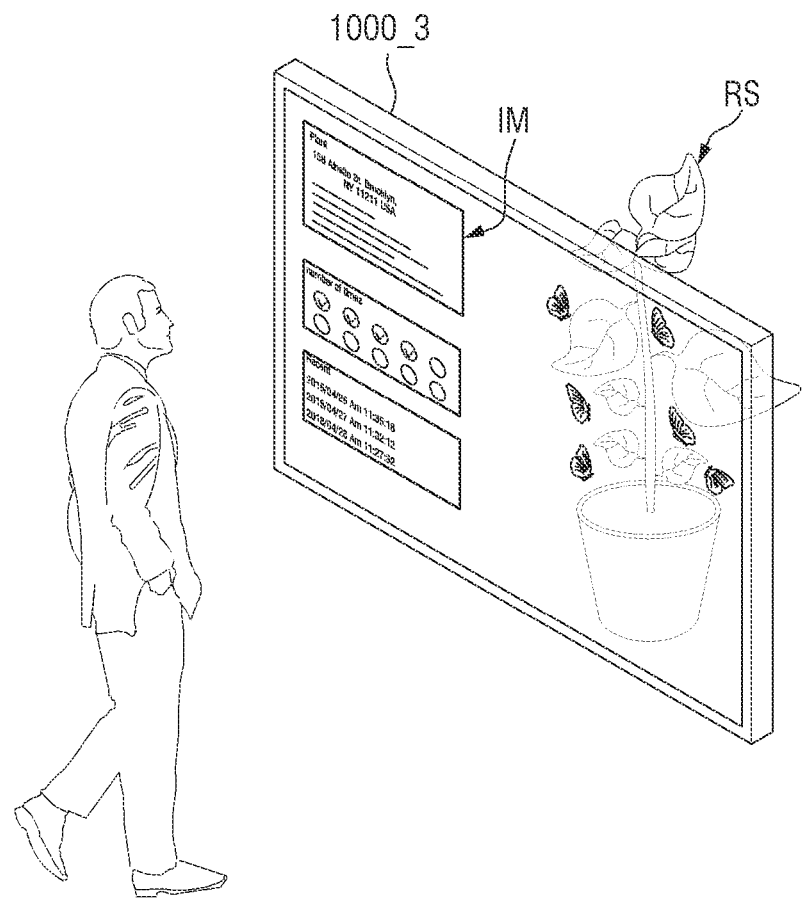
FIG. 49 is an diagram illustrating a transparent display device including a display device according to one or more embodiments.

FIG. 49 is an diagram illustrating a transparent display device including a display device according to one or more embodiments.

Referring to FIG. 49, a display device 1000_3 according to one or more embodiments may be applied to the transparent display device. The transparent display device may display an image IM, and also may transmit light. Thus, a user located on the front side of the transparent display device can view an object RS or a background on the rear side of the transparent display device as well as the image IM displayed on the display device 1000_3. When the display device 1000_3 is applied to the transparent display device, the first substrate 110 (see FIG. 5) of the display device 1000_3 may include a light transmitting portion capable of transmitting light or may be made of a material capable of transmitting light.

Figure 50:
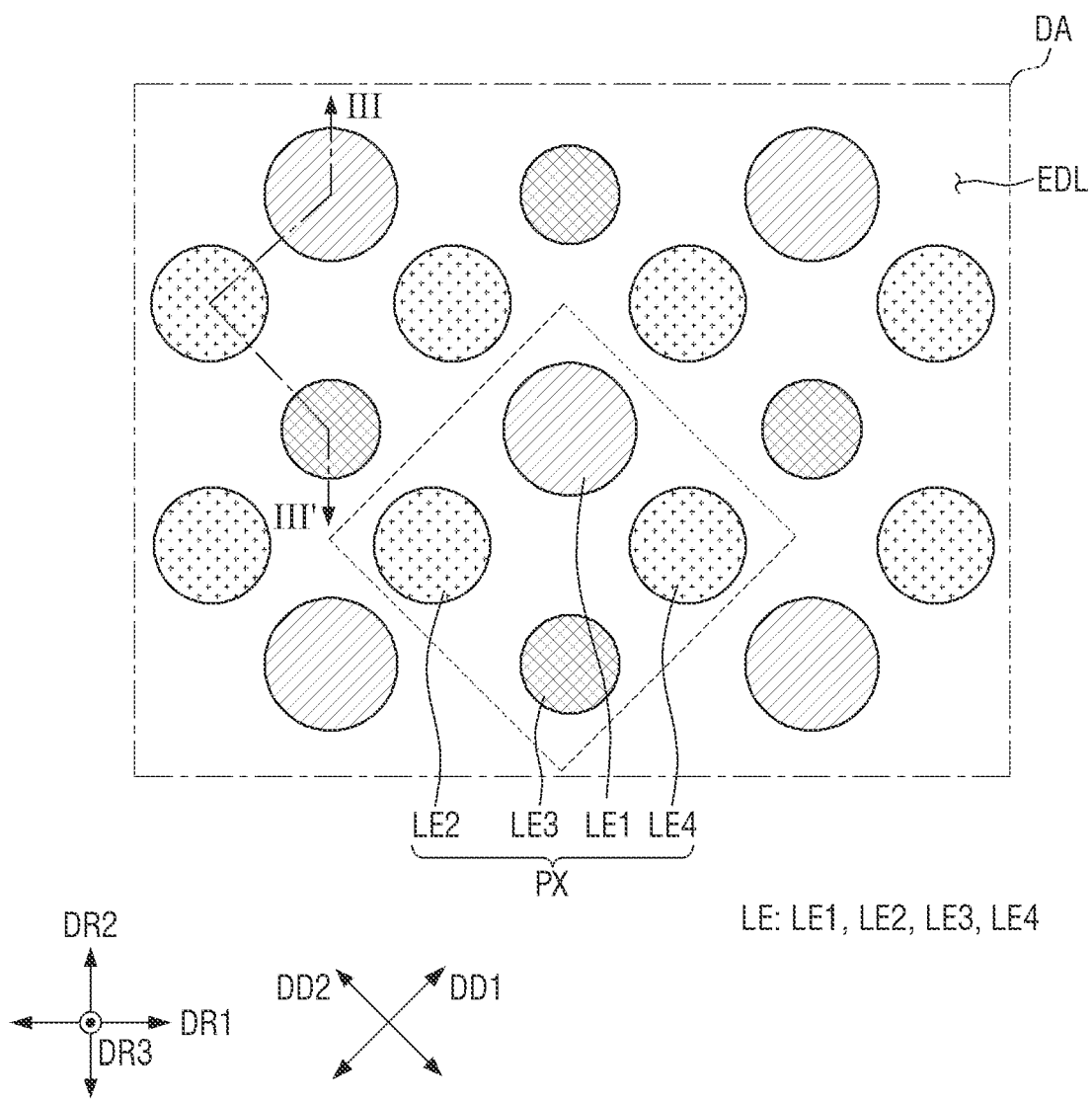
FIG. 50 is a plan layout view of first to fourth light emitting elements according to one or more embodiments.

Hereinafter, display devices 1_1, 1_2, 1_3, and 1_4 according to one or more embodiments will be described with reference to FIGS. 50 to 54. FIG. 50 is a plan layout view of first to fourth light emitting elements according to one or more embodiments.

In the present embodiment, the display devices 1_1, 1_2, 1_3, and 1_4 include the first to fourth light emitting elements LE1, LE2, LE3, and LE4 having different areas in a plan view. Accordingly, the width of the top surface and/or the width of the bottom surface of each of the first to fourth light emitting elements LE1, LE2, LE3 and LE4 may be different. In addition, the disposition relationship of the first to fourth light emitting elements LE1, LE2, LE3, and LE4, and the fact that the first light emitting element LE1 emits light of a first color (e.g., red light), the second light emitting element LE2 and the fourth light emitting element LE4 emit light of a second color (e.g., green light), and the third light emitting element LE3 emits light of a third color (e.g., blue light) are the same as the description of FIG. 2.

The first to fourth light emitting elements LE1, LE2, LE3, and LE4 may have an emission area defined by the emission defining layer EDL. Accordingly, the emission area of the light emitting element LE may be substantially the same as the planar area of the light emitting element LE.

In general, in the case of an ultra-small light emitting diode element emitting red light, the higher the current density, the lower the emission efficiency. Accordingly, in the present embodiment, the planar area of the first light emitting element LE1 emitting red light may be formed to be large to lower the current density and increase the emission efficiency. For example, the planar area of the first light emitting element LE1 may be greater than the planar areas of the second to fourth light emitting elements LE2, LE3, and LE4. In addition, the planar areas of the second light emitting element LE2 and the fourth light emitting element LE4 may be greater than the planar area of the third light emitting element LE3.

Figure 51:
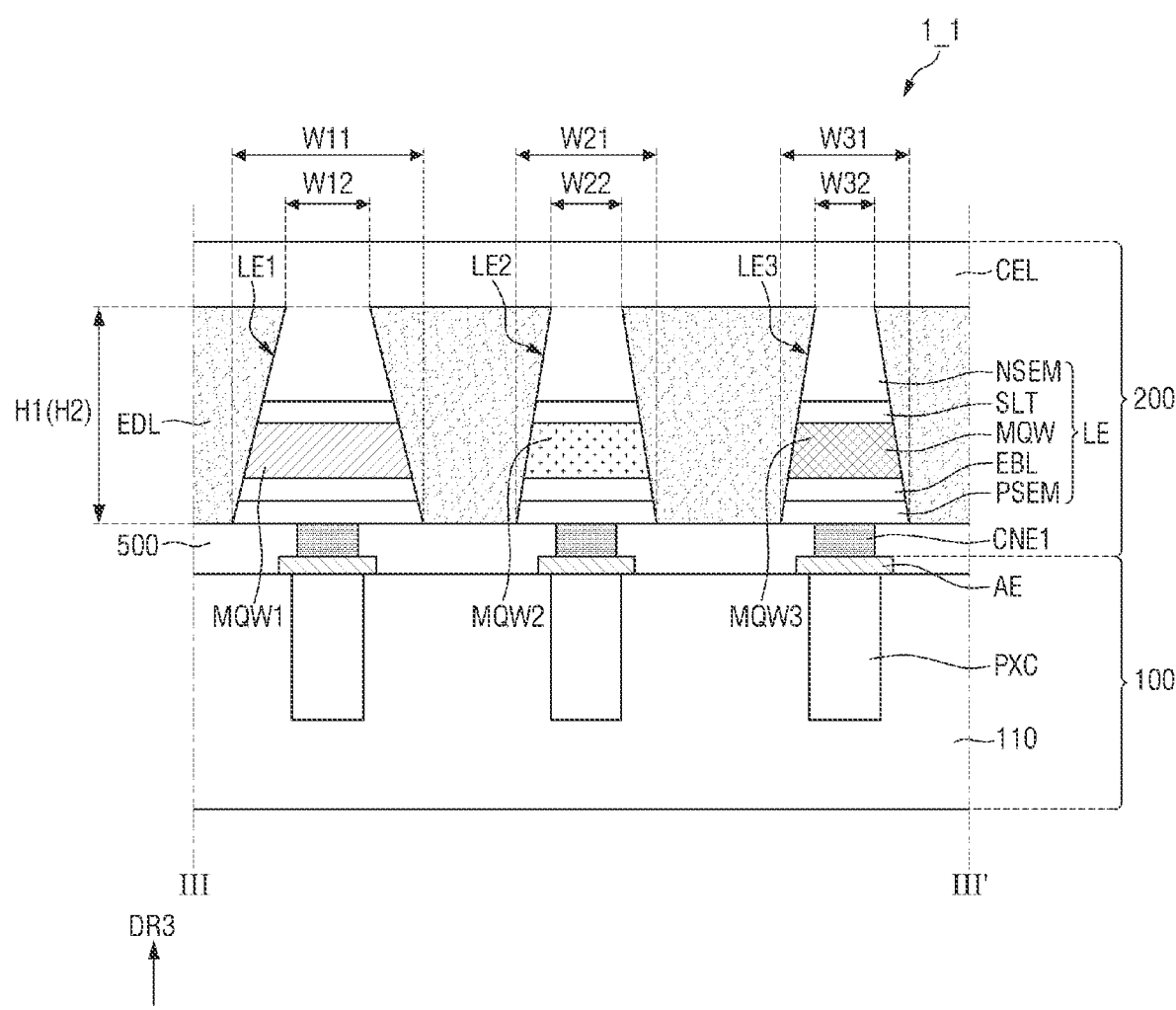
FIG. 51 is an example of a cross-sectional view taken along the line III-III' of FIG. 50.
Figure 52:
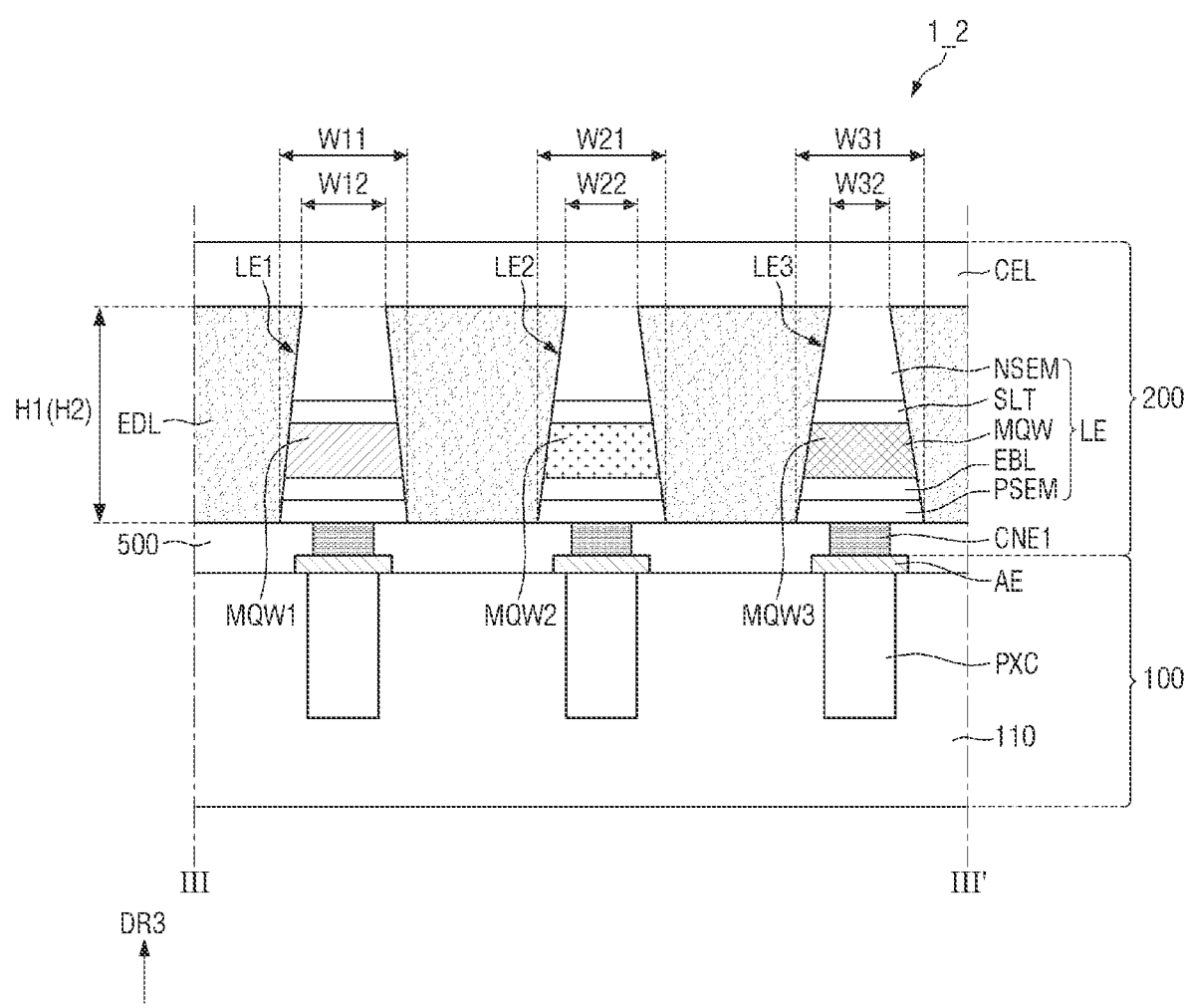
FIG. 52 is an example of a cross-sectional view taken along the line III-III' of FIG. 50.
Figure 53:
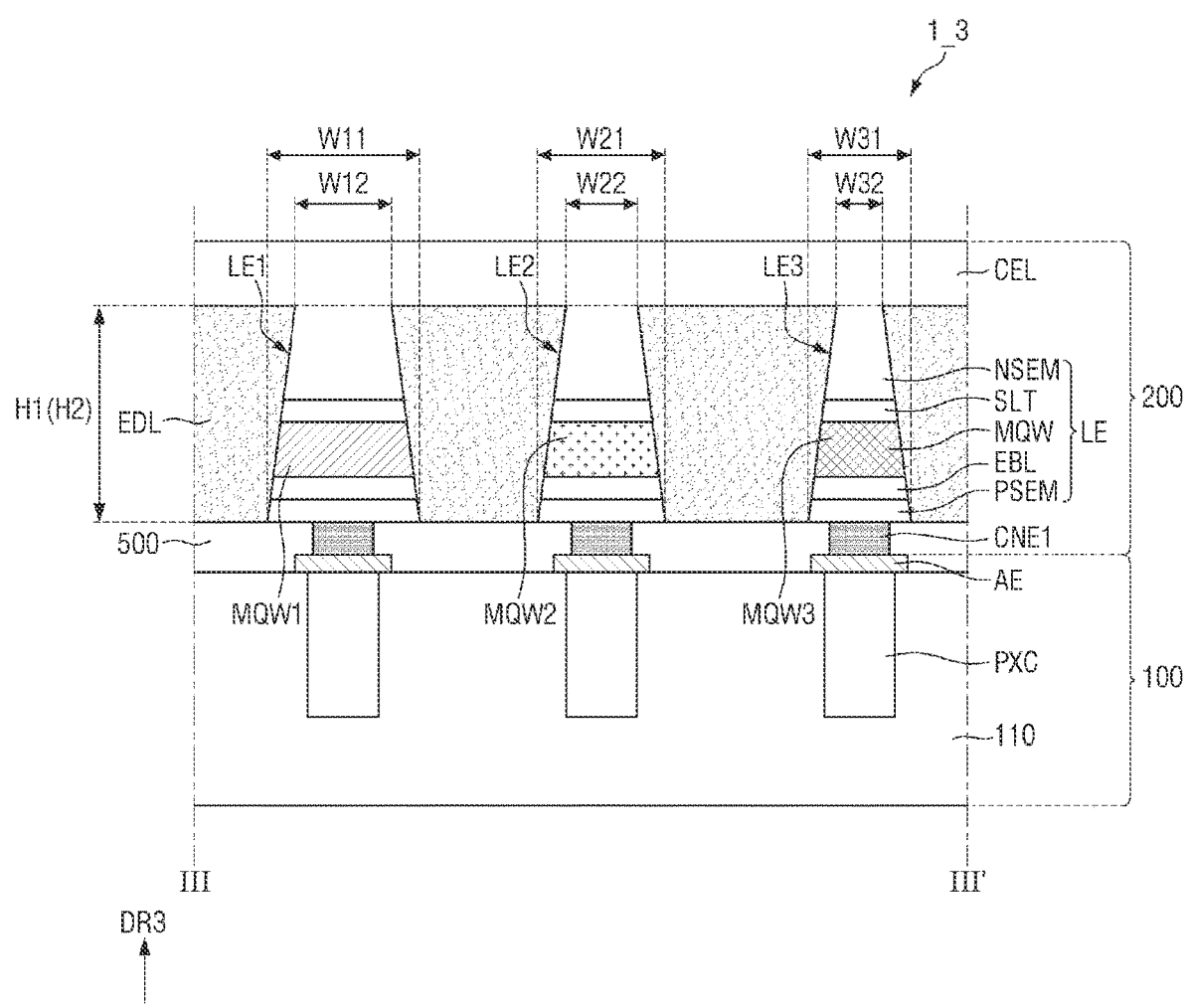
FIG. 53 is an example of a cross-sectional view taken along the line III-III' of FIG. 50.
Figure 54:
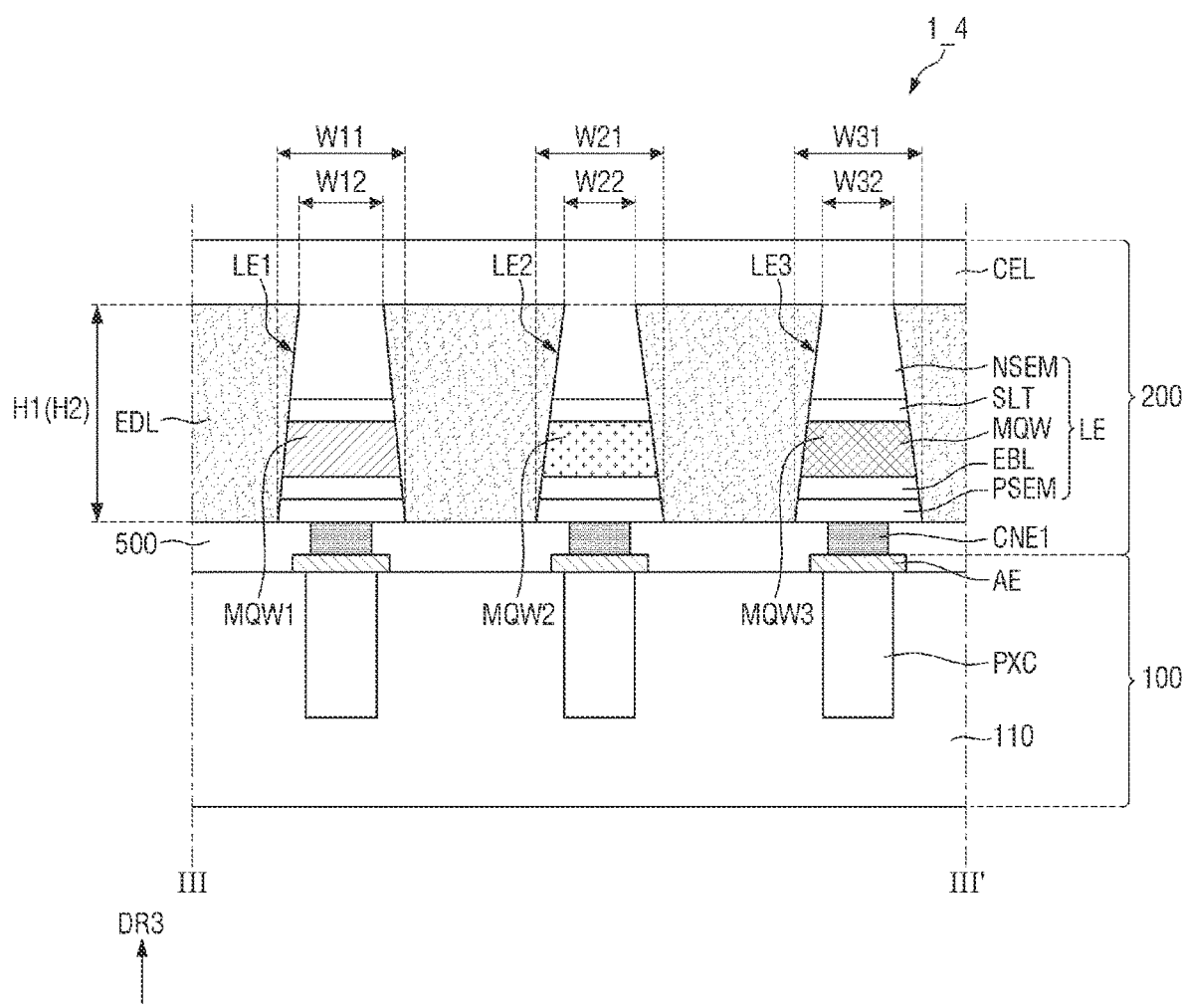
FIG. 54 is an example of a cross-sectional view taken along the line III-III' of FIG. 50.

FIG. 51 is an example of a cross-sectional view taken along the line III-III' of FIG. 50. FIG. 52 is another example of a cross-sectional view taken along the line III-III' of FIG. 50. FIG. 53 is still another example of a cross-sectional view taken along the line III-III' of FIG. 50. FIG. 54 is an example of a cross-sectional view taken along the line III-III' of FIG. 50. In the light emitting elements LE illustrated in FIGS. 51 to 54, the width of the bottom surface may be greater than the width of the top surface, like the light emitting element LE of FIG. 6. The present embodiment differs from the previous embodiments in that the widths of the first light emitting element LE1, the second light emitting element LE2, the third light emitting element LE3, and the fourth light emitting element LE4 are different from each other. Because the fourth light emitting element LE4 is substantially the same in cross-sectional view as the second light emitting element LE2, a description thereof will be omitted.

Referring to FIG. 51, the first light emitting element LE1 has a first width W11 that is the width of the bottom surface and a second width W12 that is the width of the top surface, the second light emitting element LE2 has a first width W21 that is the width of the bottom surface and a second width W22 that is the width of the top surface, and the third light emitting element LE3 has a first width W31 that is the width of the bottom surface and a second width W32 that is the width of the top surface.

The first width W11 of the first light emitting element LE1 may be greater than the first width W21 of the second light emitting element LE2, and the first width W21 of the second light emitting element LE2 may be greater than the first width W31 of the third light emitting element LE3. In one or more embodiments, the second width W12 of the first light emitting element LE1 may be the same as the second width W22 of the second light emitting element LE2 and the second width W32 of the third light emitting element LE3. When the width of the first light emitting element LE1 increases, the area of the first light emitting element LE1 increases, so that emission efficiency may increase.

In addition, a side surface slope of the first light emitting element LE1 may be greater than side surface slopes of the second light emitting element LE2 and the third light emitting element LE3. Accordingly, because the area of the first active layer MQW1 of the first light emitting element LE1 may be greater than the areas of the active layers MQW2 and MQW3 of the second and third light emitting elements LE2 and LE3, the emission amount of the first light emitting element LE1 may increase. In addition, because the area of the second light emitting element LE2 is also similarly increased compared to that of the third light emitting element LE3, emission efficiency may increase.

Referring to FIG. 52, the second width W12 of the first light emitting element LE1 may be greater than the second width W22 of the second light emitting element LE2, and the second width W22 of the second light emitting element LE2 may be greater than the second width W32 of the third light emitting element LE3. In one or more embodiments, the first width W11 of the first light emitting element LE1 may be the same as the first width W21 of the second light emitting element LE2 and the first width W31 of the third light emitting element LE3. When the width of the first light emitting element LE1 increases, the area of the first light emitting element LE1 increases, so that emission efficiency may increase. In addition, because the area of the second light emitting element LE2 is also similarly increased compared to that of the third light emitting element LE3, emission efficiency may increase.

Referring to FIG. 53, the first width W11 of the first light emitting element LE1 may be greater than the first width W21 of the second light emitting element LE2, and the first width W21 of the second light emitting element LE2 may be greater than the first width W31 of the third light emitting element LE3. Further, the second width W12 of the first light emitting element LE1 may be greater than the second width W22 of the second light emitting element LE2, and the second width W22 of the second light emitting element LE2 may be greater than the second width W32 of the third light emitting element LE3. When the width of the first light emitting element LE1 increases, the area of the first light emitting element LE1 increases, so that emission efficiency may increase.

Referring to FIG. 54, the first width W11 of the first light emitting element LE1 may be greater than the first width W21 of the second light emitting element LE2 and the first width W31 of the third light emitting element LE3. The second width W12 of the first light emitting element LE1, the second width W22 of the second light emitting element LE2, and the second width W32 of the third light emitting element LE3 may be the same. It differs from FIG. 52 in that the first width W21 of the second light emitting element LE2 and the first width W31 of the third light emitting element LE3 are the same. That is, the planar area of the first light emitting element LE1 may be greater than the planar areas of the second light emitting element LE2 and the third light emitting element LE3, and the planar area of the second light emitting element LE2 and the planar area of the third light emitting element LE3 may be the same.

That is, when the width of the opening forming the first light emitting element LE1 is increased or the side surface inclination thereof is increased in the process of forming the opening of the emission defining layer EDL as illustrated in FIGS. 51 to 54, the width and the sidewall inclination of the first light emitting element LE1 may increase. Accordingly, because the area of the first active layer MQW1 of the first light emitting element LE1 may be greater than the areas of the active layers MQW2 and MQW3 of the second and third light emitting elements LE2 and LE3, the emission amount and emission efficiency of the first light emitting element LE1 may increase. The combination of the width and the inclination of the light emitting elements LE is not limited thereto, and various structures for increasing the emission amount and emission efficiency of the first light emitting element LE1 may be applied.

Hereinafter, a display device 1_5 and a fabricating method thereof according to one or more embodiments will be described with reference to FIGS. 55 to 71.

Figure 55:
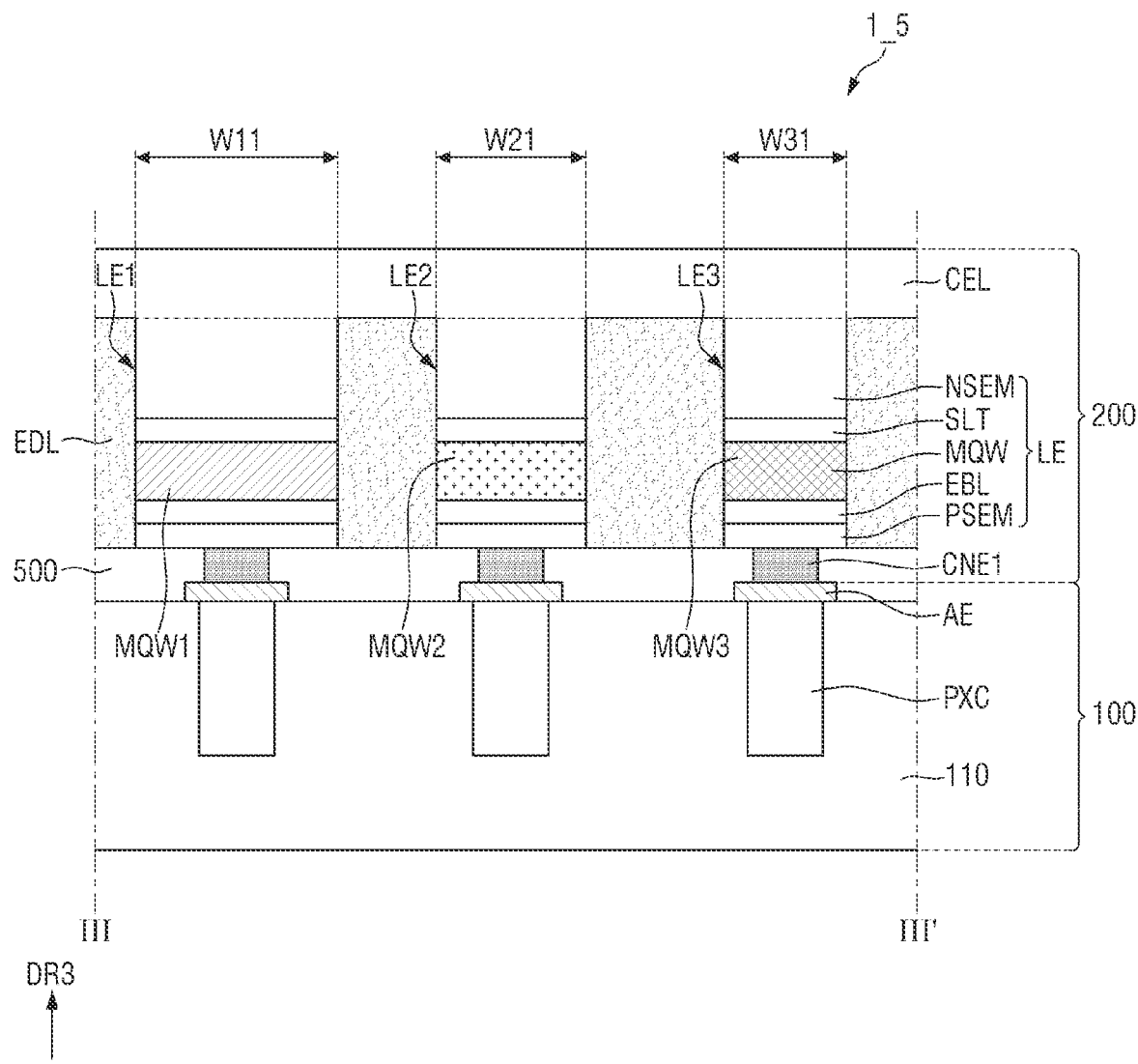
FIG. 55 is a cross-sectional view of first to third light emitting elements according to one or more embodiments.
Figure 56:
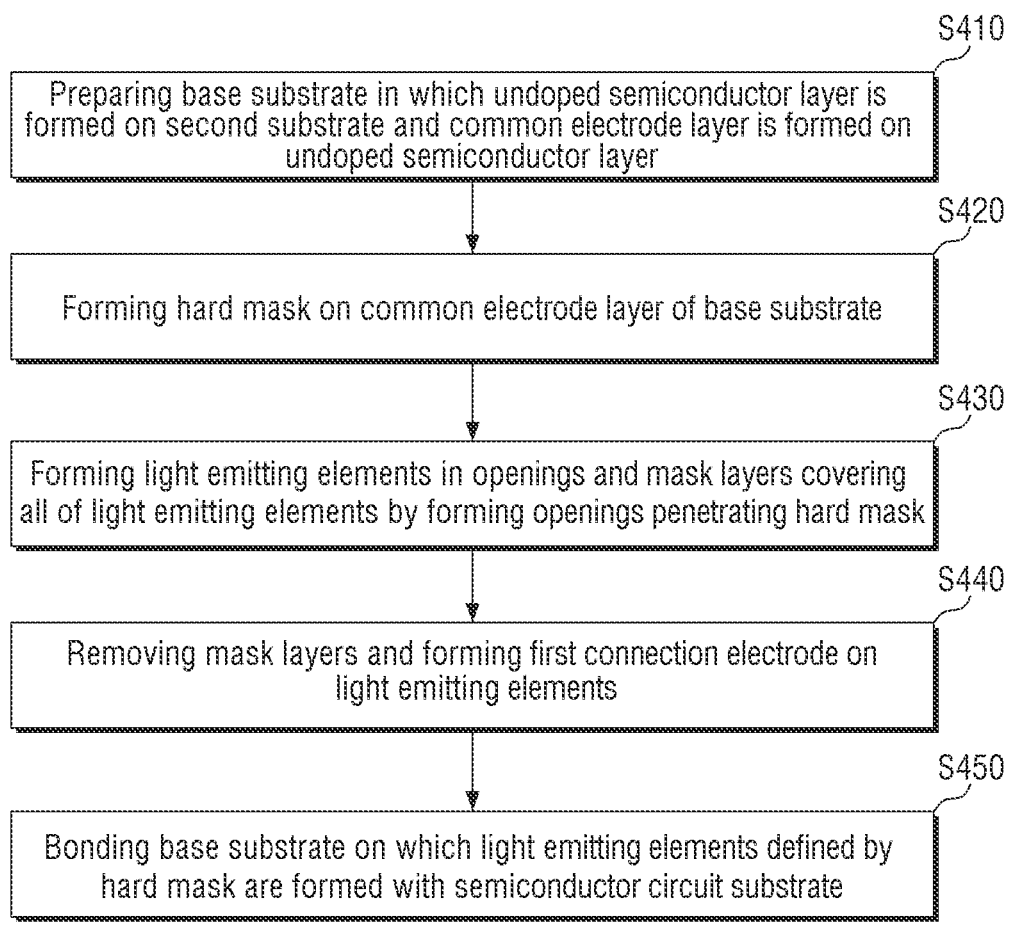
FIG. 56 is a flowchart illustrating a method of fabricating a display device according to one or more embodiments.
Figure 57:
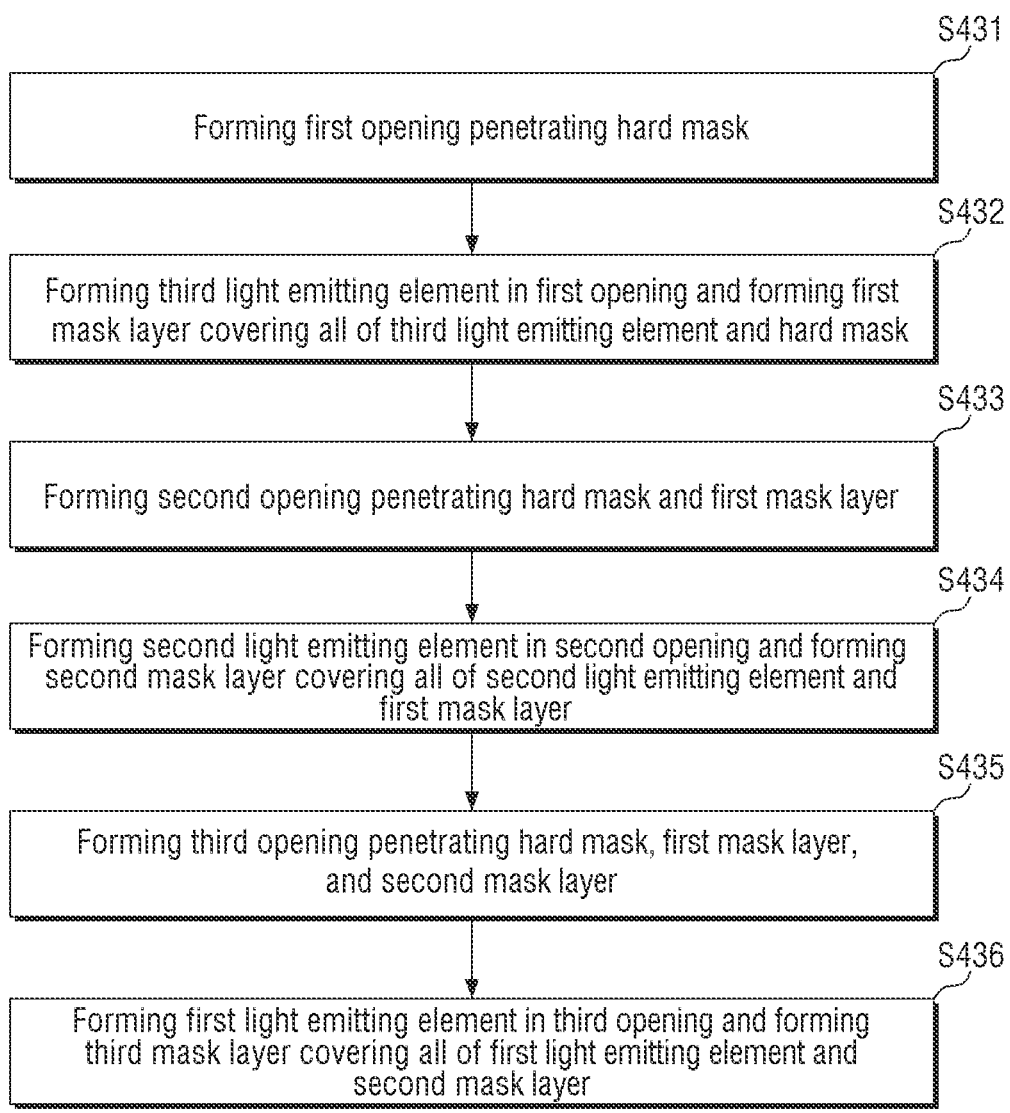
FIG. 57 is a flowchart illustrating an example of the fabricating method of FIG. 56.

FIG. 55 is a cross-sectional view of first to third light emitting elements according to one or more embodiments. For example, FIG. 55 may correspond to a cross-sectional view taken along the line III-III' of FIG. 50. FIG. 56 is a flowchart illustrating a method of fabricating a display device according to one or more embodiments. FIG. 57 is a flowchart illustrating an example of the fabricating method of S430 of FIG. 56. FIGS. 58 to 71 are cross-sectional views sequentially illustrating a fabricating process of a display device according to one or more embodiments.

The display device 1_5 according to the present embodiment in which mask layers ML1, ML2, and ML3 covering the light emitting elements LE1, LE2, and LE3 and the hard mask HM are formed during a fabricating process, differs from the previous embodiments in which the mask patterns MK1, MK2, and MK3 are formed. The fact that the light emitting elements LE1, LE3, and LE3 may include the second semiconductor layer NSEM, the superlattice layer SLT, the active layer MQW, the electron blocking layer EBL, and the first semiconductor layer PSEM and the emission area may be defined by the emission defining layer EDL is the same as in the embodiment of FIG. 6.

Although FIG. 55 illustrates that the light emitting elements LE have a rectangular shape in cross-sectional view, the present disclosure is not limited thereto. For example, it may have a trapezoidal shape as illustrated in FIG. 6. In addition, in the display device 1_5 according to the present embodiment, the widths of the light emitting elements LE may be different. For example, the width W11 of the first light emitting element LE1 may be greater than the width W21 of the second light emitting element LE2, and the width W21 of the second light emitting element LE2 may be greater than the width W31 of the third light emitting element LE3.

Accordingly, the area of the first light emitting element LE1 emitting red light may be enlarged to increase the emission efficiency of the first light emitting element LE1, and the area of the first active layer MQW1 may be enlarged to increase the emission amount of the first light emitting element LE1.

A fabricating process of the display device 1_5 according to the present embodiment will be described with reference to FIGS. 56 and 57.

The method for fabricating the display device 1_5 may include preparing the base substrate SUB in which the undoped semiconductor layer USEM is formed on the second substrate 210 and the common electrode layer CEL is formed on the undoped semiconductor layer USEM (S410), forming the hard mask HM on the common electrode layer CEL of the base substrate SUB (S420), forming the light emitting elements LE in the plurality of openings OP and the mask layers ML1, ML2 and ML3 covering all of the light emitting elements LE by forming the plurality of openings OP penetrating the hard mask HM (S430), removing the mask layers ML1, ML2 and ML3 and forming the first connection electrode CNE1 on the light emitting elements LE (S440), and bonding the base substrate SUB on which the light emitting elements LE defined by the hard mask HM are formed with the semiconductor circuit substrate 100 (S450).

The S430 of forming the light emitting elements LE and the mask layers ML1, ML2, and ML3 may include forming the first opening OP1 penetrating the hard mask HM (S431), forming the third light emitting element LE3 in the first opening OP1 and forming the first mask layer ML1 covering all of the third light emitting element LE3 and the hard mask HM (S432), forming the second opening OP2 penetrating the hard mask HM and the first mask layer ML1 (S433), forming the second light emitting element LE2 in the second opening OP2 and forming the second mask layer ML2 covering all of the second light emitting element LE2 and the first mask layer ML1 (S434), forming the third opening OP3 penetrating the hard mask HM, the first mask layer ML1, and the second mask layer ML2 (S435), and forming the first light emitting element LE1 in the third opening OP3 and forming the third mask layer ML3 covering all of the first light emitting element LE1 and the second mask layer ML2 (S436).

A fabricating process based on one cross section of the display device 1_5 will be described with reference to FIGS. 58 to 71. The contents overlapping with those of FIGS. 9 to 21 will be briefly described, and the modified process will be described in detail.

Figure 58:
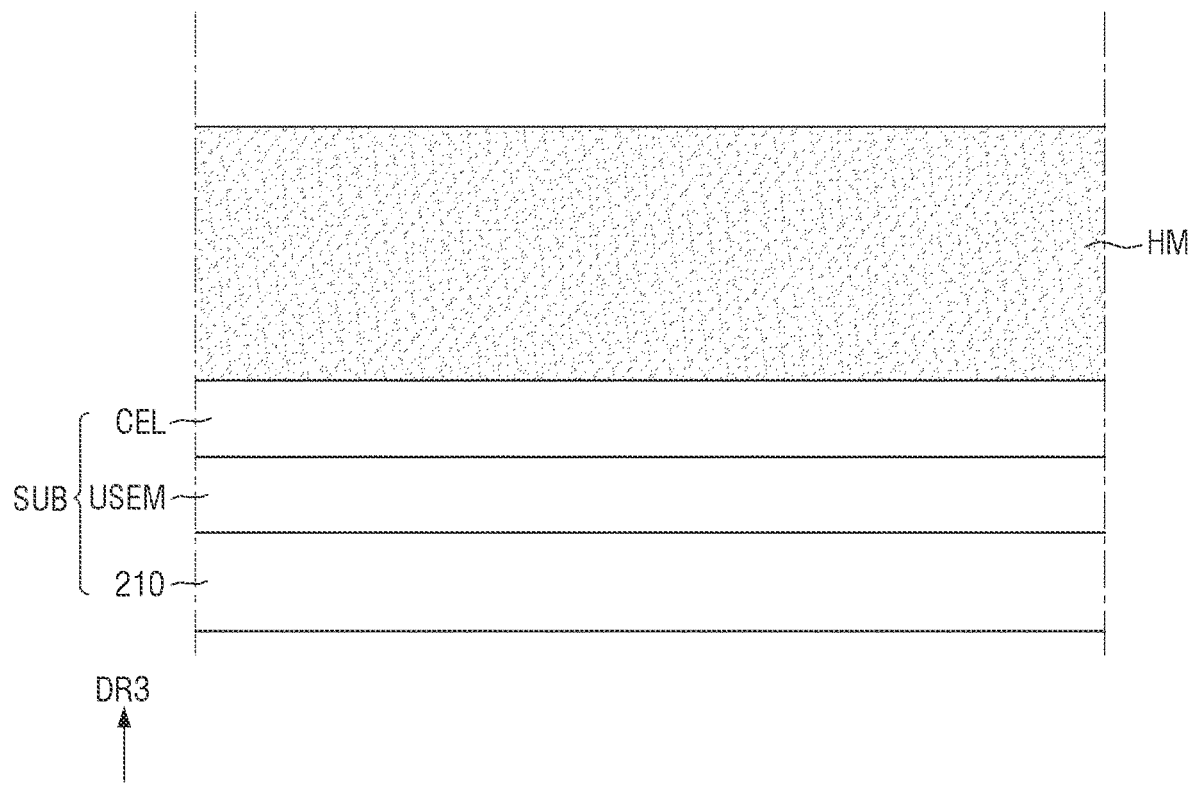
FIGS. 58 to 71 are cross-sectional views sequentially illustrating a fabricating process of a display device according to one or more embodiments.

Referring to FIG. 58, the base substrate SUB is prepared in which the undoped semiconductor layer USEM is formed on the second substrate 210 and the common electrode layer CEL is formed on the undoped semiconductor layer USEM (S410). In addition, the hard mask HM is formed on the common electrode layer CEL of the base substrate SUB (S420).

Figure 59:
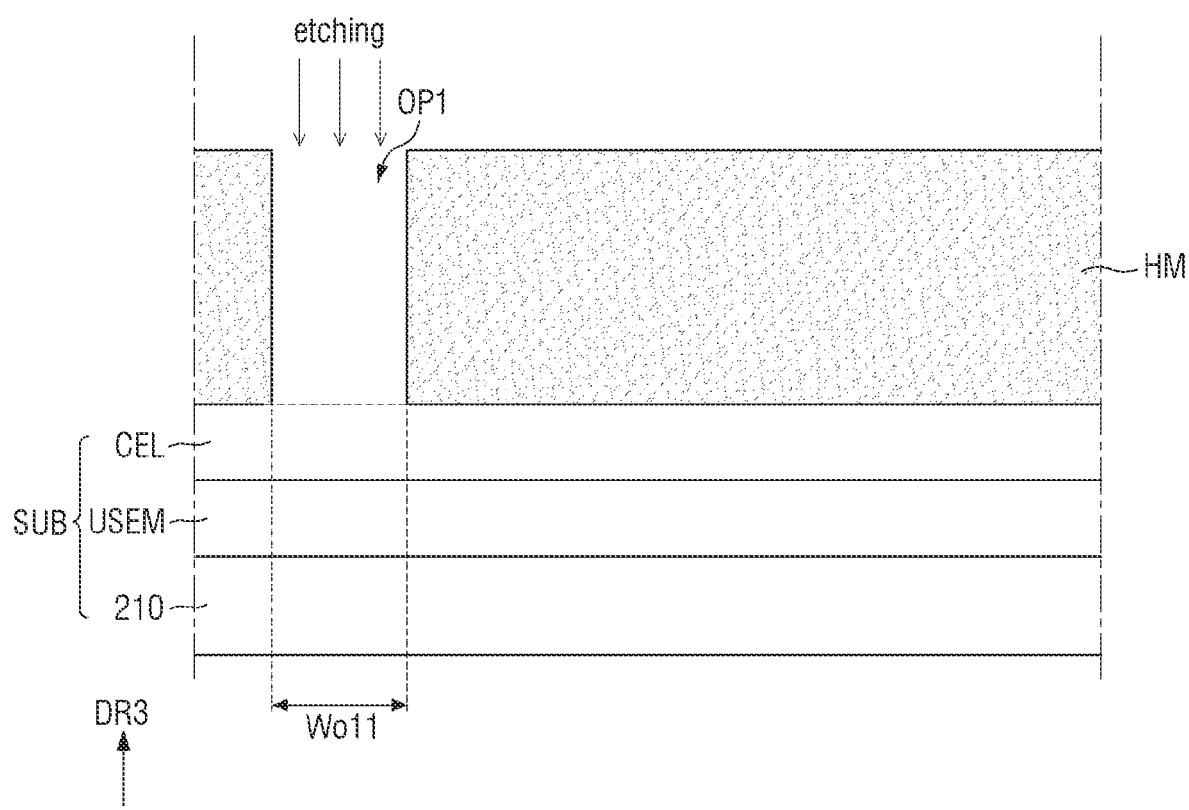
Figure 60:
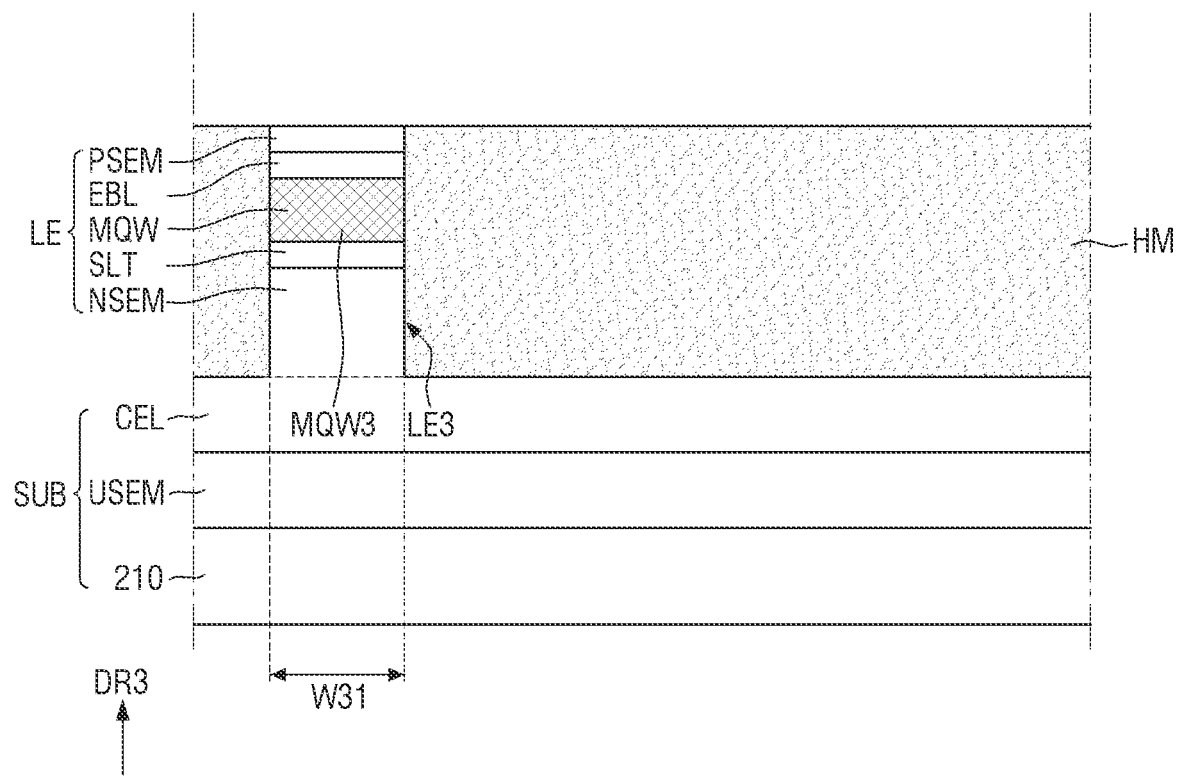
Figure 61:
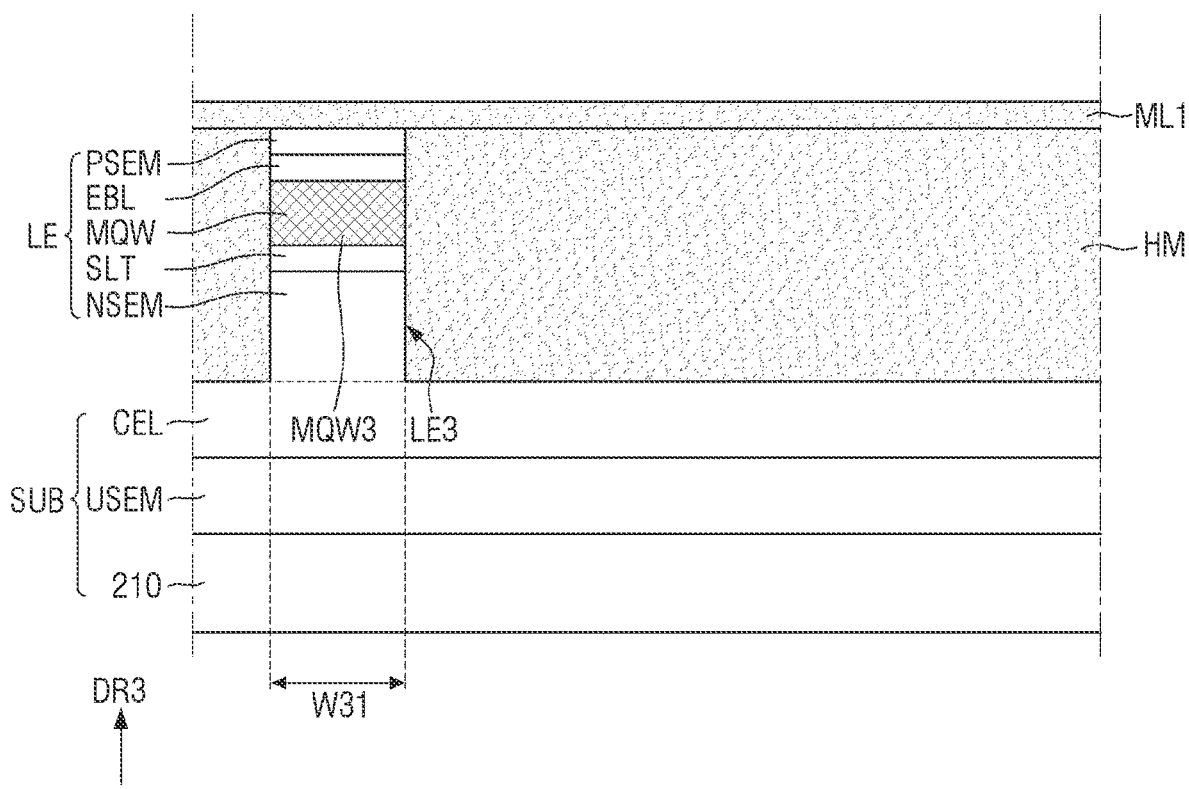

Referring to FIGS. 59 to 61, the first opening OP1 penetrating the hard mask HM is formed (S431). Then, the third light emitting element LE3 is formed in the first opening OP1, and the first mask layer ML1 covering all of the third light emitting element LE3 and the hard mask HM is formed (S432).

The hard mask HM is etched to form the plurality of first openings OP1 exposing the common electrode layer CEL. The plurality of first openings OP1 are formed to be spaced from each other. The third light emitting element LE3 is formed in each of the plurality of first openings OP1. The separation distance, width, and the like of the first openings OP1 may be set according to the separation distance and width between the third light emitting elements LE3. For example, a width Wo11 of the first opening OP1 may be the same as the width W31 of the third light emitting element LE3.

The process of forming the third light emitting element LE3 may be performed through an epitaxial growth method. The second semiconductor layer NSEM, the superlattice layer SLT, the third active layer MQW3, the electron blocking layer EBL, and the first semiconductor layer PSEM are sequentially grown on the top surface of the common electrode layer CEL exposed by the first opening OP1 to form the third light emitting element LE3.

Then, the first mask layer ML1 covering all of the third light emitting element LE3 and the hard mask HM is formed. The first mask layer ML1 may be formed of an inorganic layer such as a silicon oxide layer ($SiO_2$), an aluminum oxide layer ($Al_2O_3$), or a hafnium oxide layer (HfOx), and may include the same material as the above-described hard mask HM, but the present disclosure is not limited thereto. The first mask layer ML1 may be a passivation layer or a barrier layer that protects the third light emitting element LE3. It differs from the fabricating process of FIGS. 9 to 21 in that the first mask layer ML1 is formed on all the top surfaces of the third light emitting element LE3 and the hard mask HM without an additional etching process. Accordingly, because the process for etching the mask pattern may be omitted, the number of masks in the process may be reduced.

Figure 62:
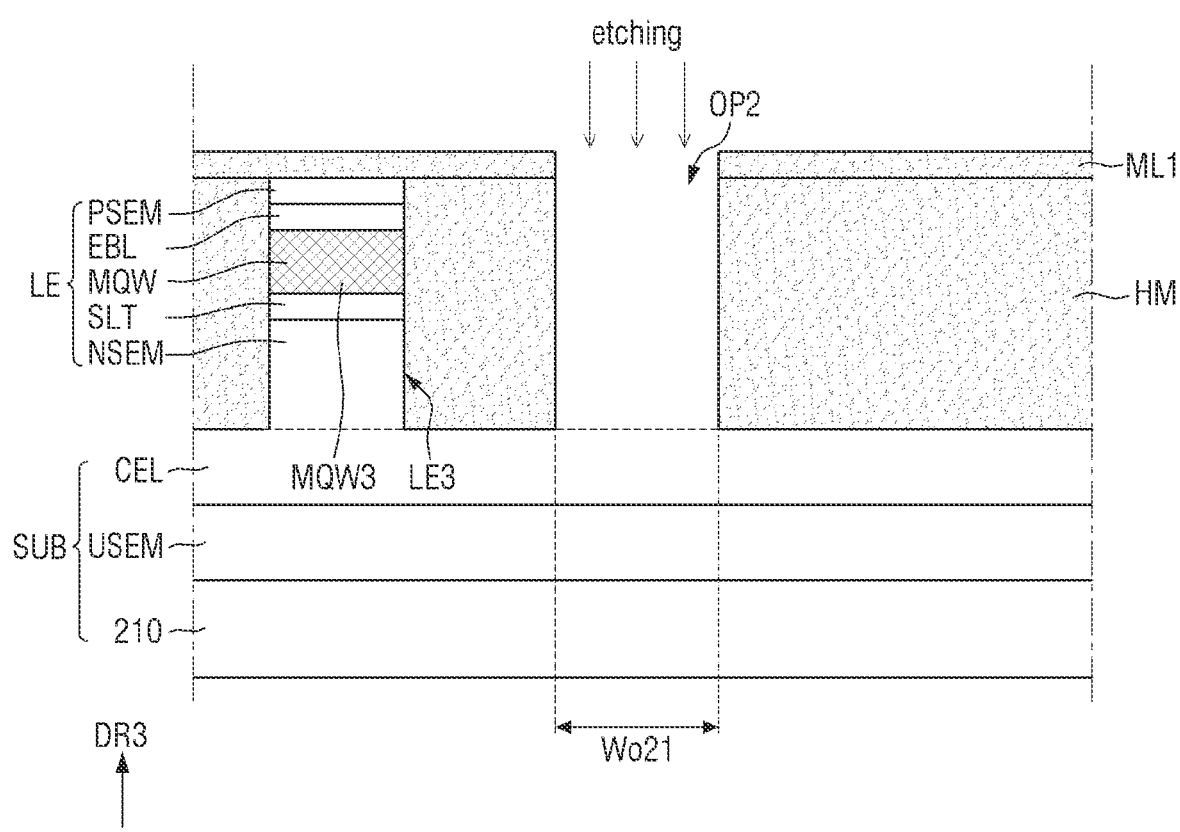
Figure 63:
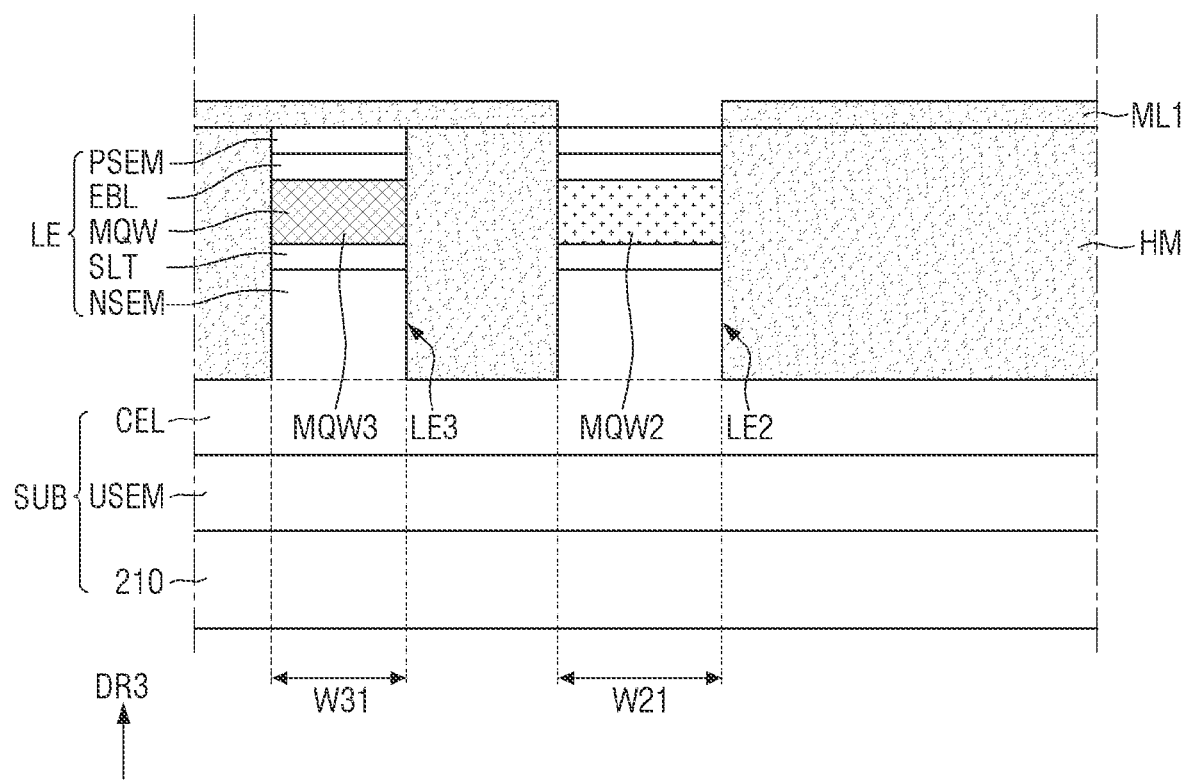
Figure 64:
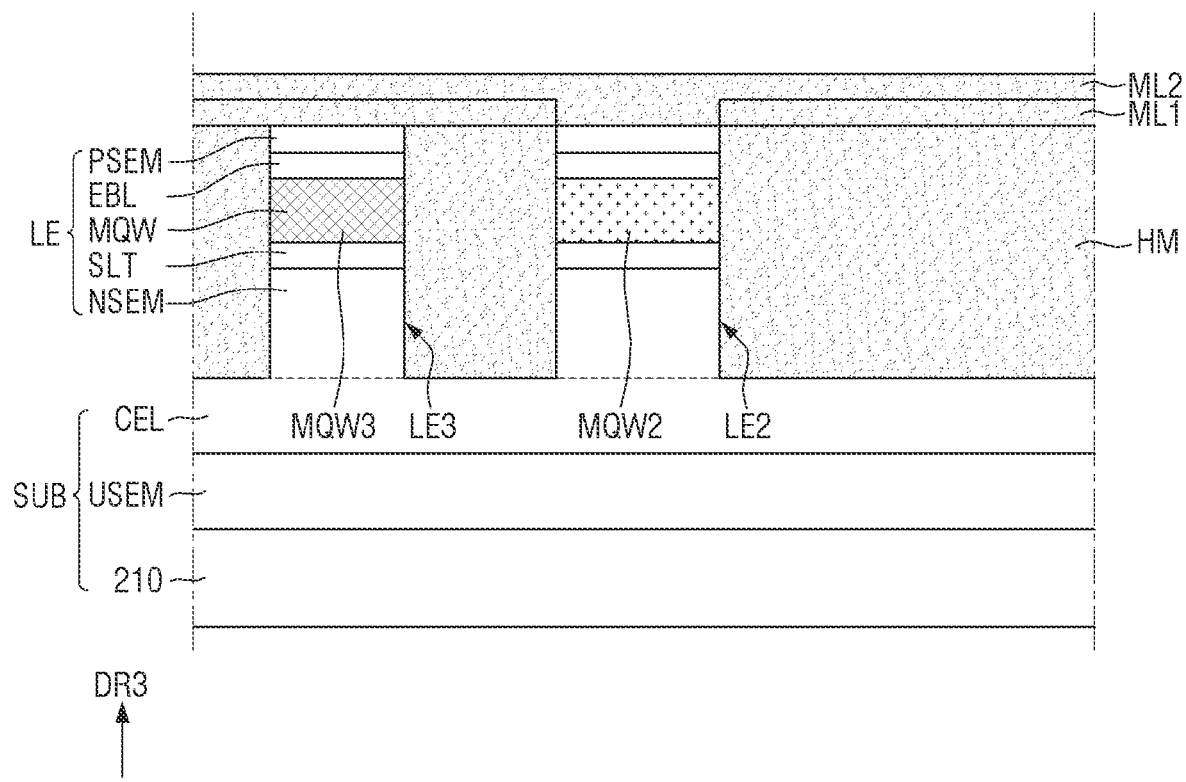

Referring to FIGS. 62 to 64, the second opening OP2 penetrating the hard mask HM and the first mask layer ML1 is formed (S433). Then, the second light emitting element LE2 is formed in the second opening OP2 and the second mask layer ML2 covering all of the second light emitting element LE2 and the first mask layer ML1 is formed (S434). A width Wo21 of the second opening OP2 may be formed to be greater than the width Wo11 of the first opening OP1.

The hard mask HM and the first mask layer ML1 are etched to form the plurality of second openings OP2 exposing the common electrode layer CEL. When the first mask layer ML1 includes the same material as the hard mask HM, the etching process may be performed in a single process.

The plurality of second openings OP2 are formed to be spaced from each other. The second light emitting element LE2 is formed in each of the plurality of second openings OP2. The separation distance, width, and the like of the second openings OP2 may be set according to the separation distance and width between the second light emitting elements LE2. For example, the width Wo21 of the second opening OP2 may be the same as the width W21 of the second light emitting element LE2. Accordingly, the width W21 of the second light emitting element LE2 may be greater than the width W31 of the third light emitting element LE3.

The process of forming the second light emitting element LE2 may be performed through an epitaxial growth method. The second semiconductor layer NSEM, the superlattice layer SLT, the second active layer MQW2, the electron blocking layer EBL, and the first semiconductor layer PSEM are sequentially grown on the top surface of the common electrode layer CEL exposed by the second opening OP2 to form the second light emitting element LE2.

The process of forming the second light emitting element LE2 may be performed using different precursor materials and process conditions from the process of forming the third light emitting element LE3. The third light emitting element LE3 and the second light emitting element LE2 may include the third active layer MQW3 and the second active layer MQW2, respectively, and as described above, may include different doping concentrations, indium (In) contents, and the like.

Then, the second mask layer ML2 covering all of the second light emitting element LE2 and the first mask layer ML1 is formed. The second mask layer ML2 may be formed of an inorganic layer such as a silicon oxide layer ($SiO_2$), an aluminum oxide layer ($Al_2O_3$), or a hafnium oxide layer (HfOx), and may include the same material as the above-described hard mask HM and the first mask layer ML1, but the present disclosure is not limited thereto. The second mask layer ML2 may be a passivation layer or a barrier layer that protects the second light emitting element LE2. It differs from the fabricating process of FIGS. 9 to 21 in that the second mask layer ML2 is formed on all the top surfaces of the second light emitting element LE2 and the first mask layer ML1 without an additional etching process. Accordingly, because the process for etching the mask pattern may be omitted, the number of masks in the process may be reduced.

Figure 65:
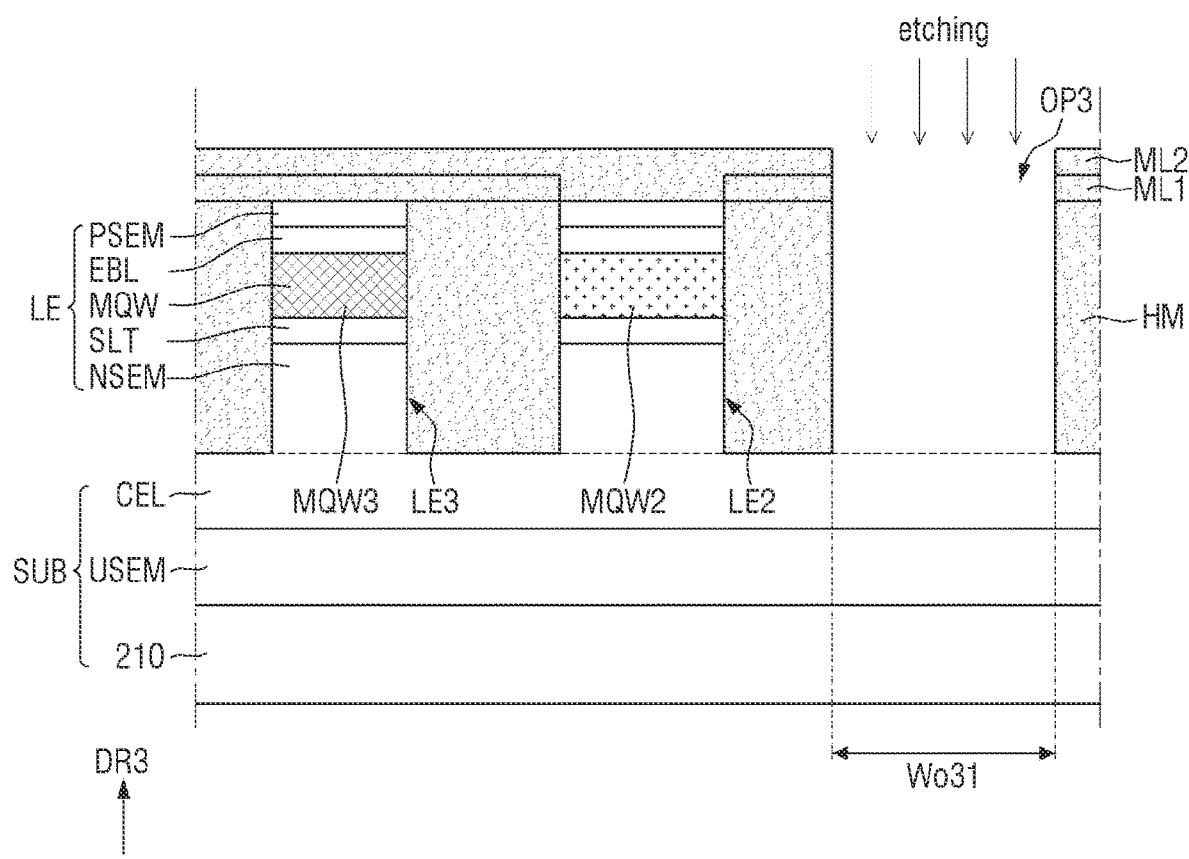
Figure 66:
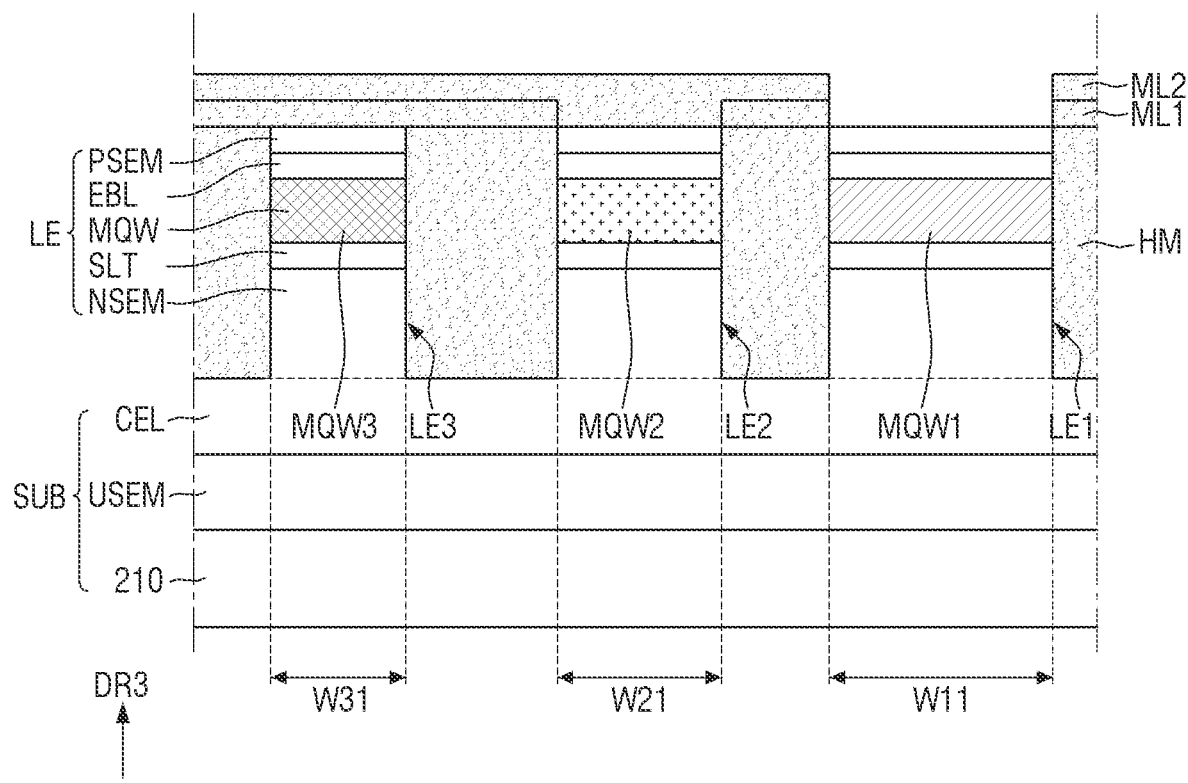
Figure 67:
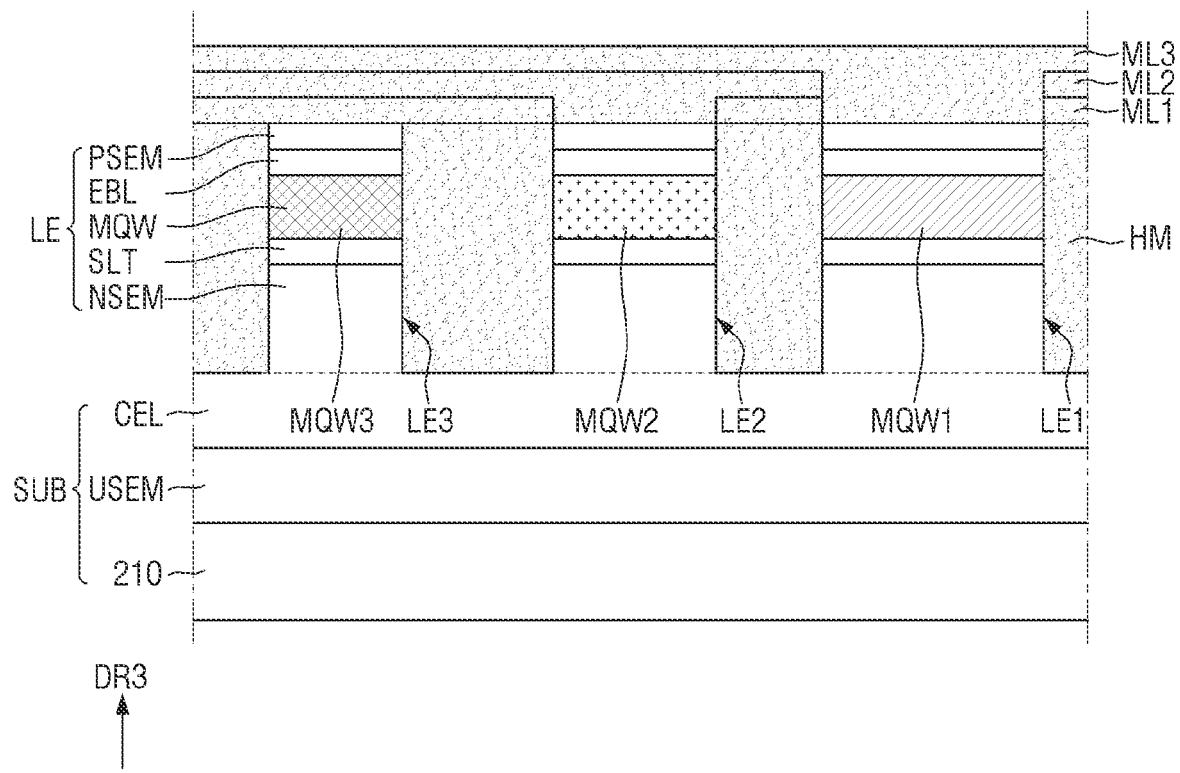

Referring to FIGS. 65 to 67, the third opening OP3 penetrating the hard mask HM, the first mask layer ML1, and the second mask layer ML2 is formed (S435). Then, the first light emitting element LE1 is formed in the third opening OP3 and the third mask layer ML3 covering all of the first light emitting element LE1 and the second mask layer ML2 is formed (S436).

The hard mask HM, the first mask layer ML1, and the second mask layer ML2 are etched to form a plurality of third openings OP3 exposing the common electrode layer CEL. When the second mask layer ML2 includes the same material as the hard mask HM and the first mask layer ML1, the etching process may be performed in a single process.

In the same manner as described above but under different process conditions, materials, and the like, the first light emitting element LE1 including the first active layer MQW1, and the third mask layer ML3 covering the first light emitting element LE1 and the hard mask HM are formed on the common electrode layer CEL. The detailed description thereof is the same as described above.

A width Wo31 of the third opening OP3 may be formed to be greater than the width Wo21 of the second opening OP2. In addition, the width Wo31 of the third opening OP3 may be the same as the width W11 of the first light emitting element LE1. Accordingly, the width W11 of the first light emitting element LE1 may be greater than the width W21 of the second light emitting element LE2.

Figure 68:
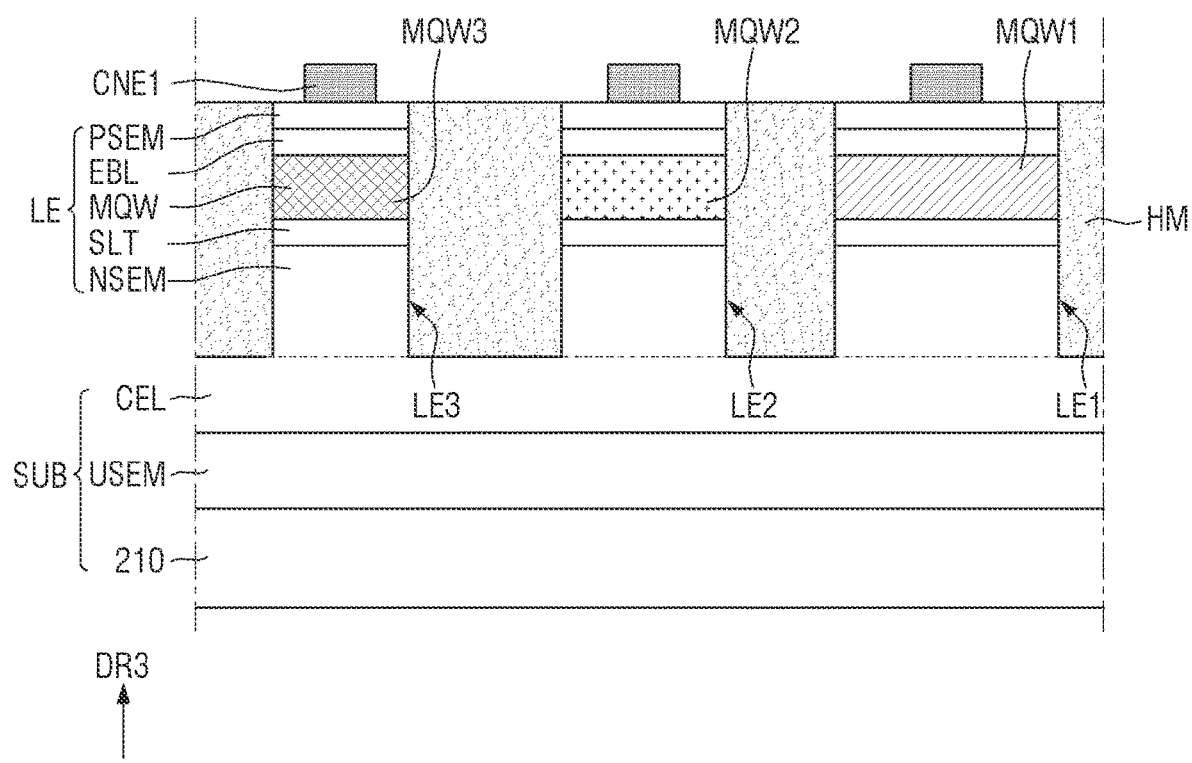

Next, as illustrated in FIG. 68, the mask layers ML1, ML2, and ML3 are removed, and the first connection electrode CNE1 is formed on the light emitting elements LE (S440). The mask layers ML1, ML2, and ML3 may be removed through a polishing process such as a chemical mechanical polishing (CMP) process and/or an etching process. Accordingly, one surface of the light emitting element LE and the hard mask HM may be planarized.

Figure 69:
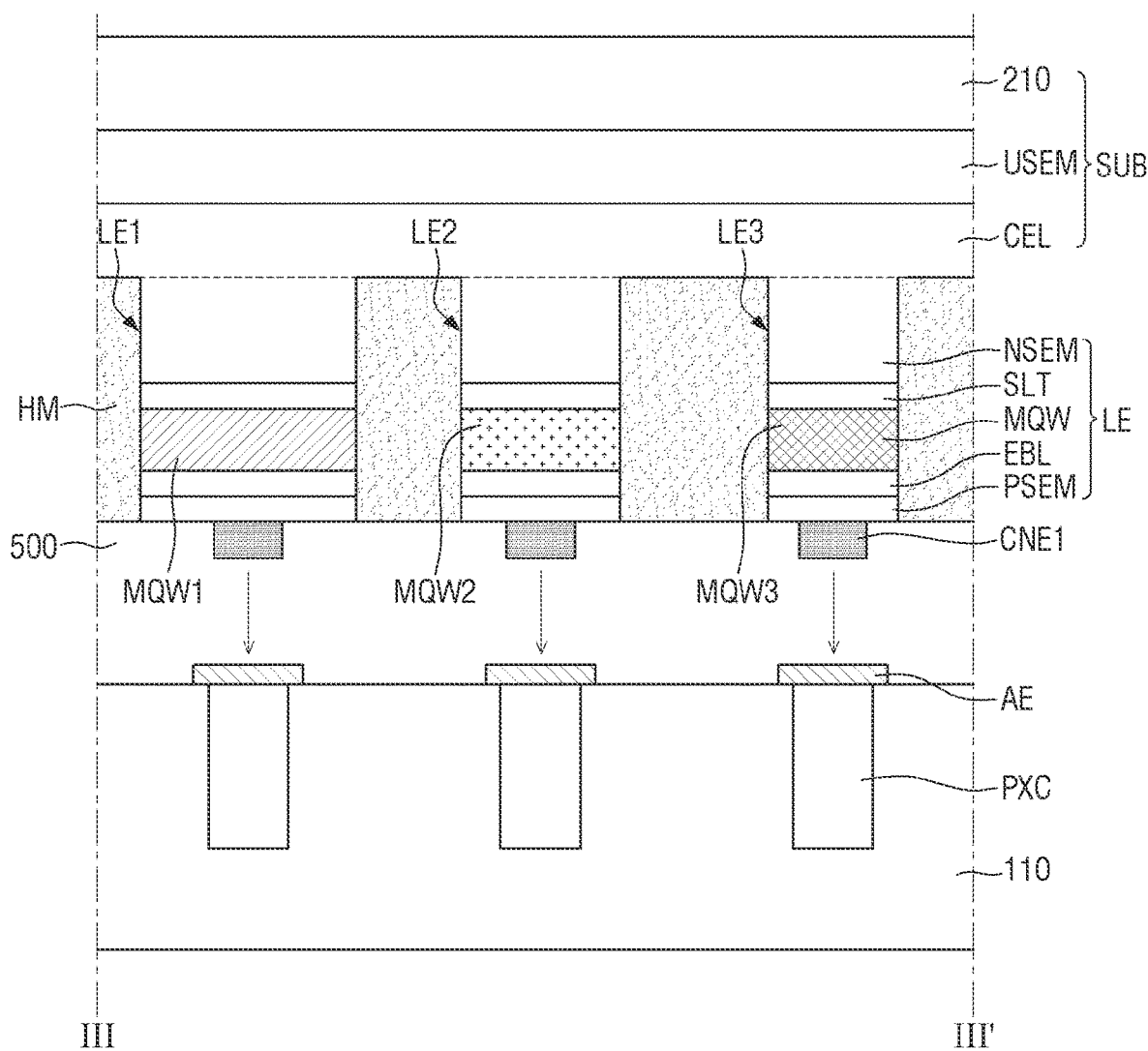
Figure 70:
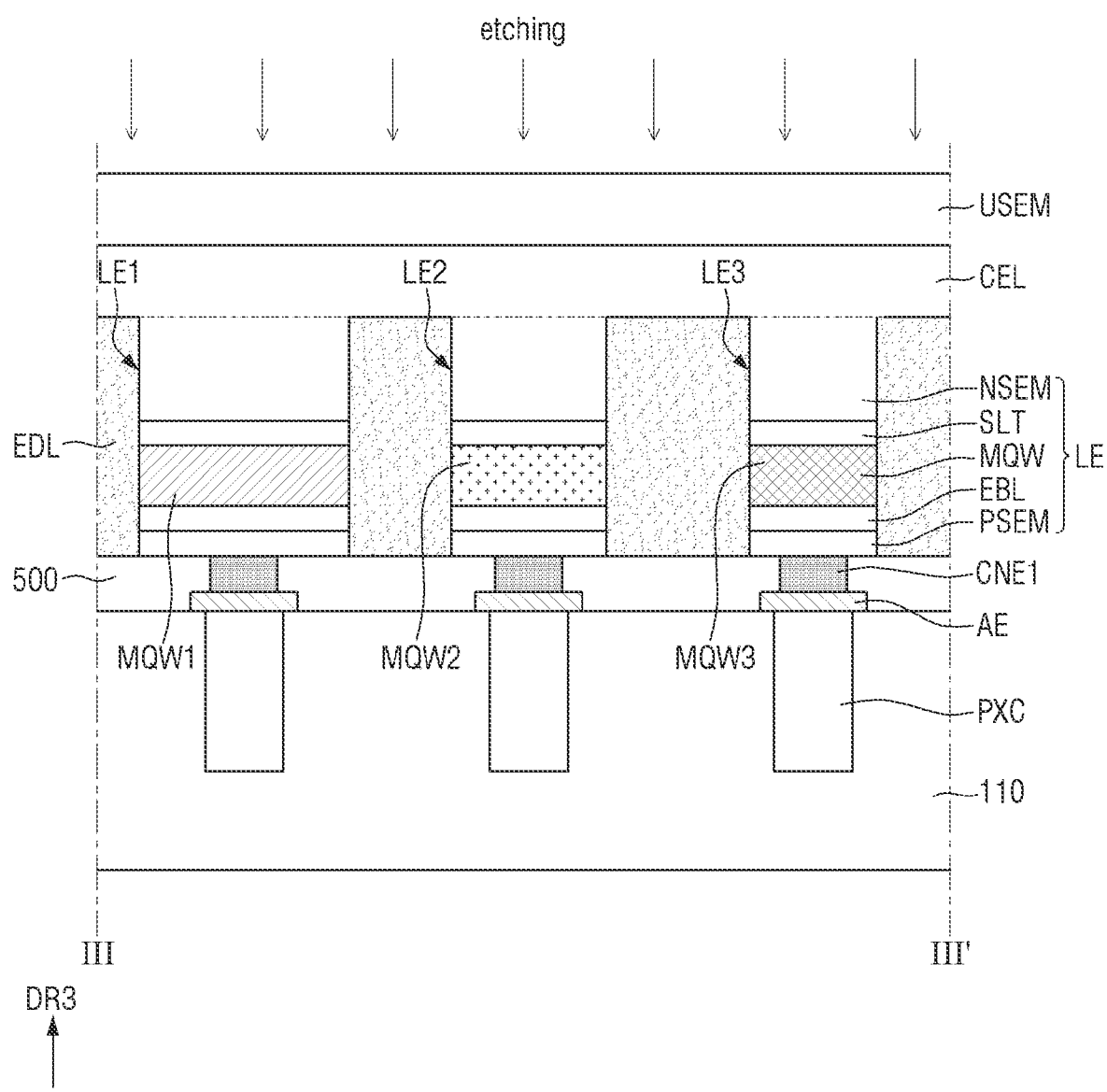
Figure 71:
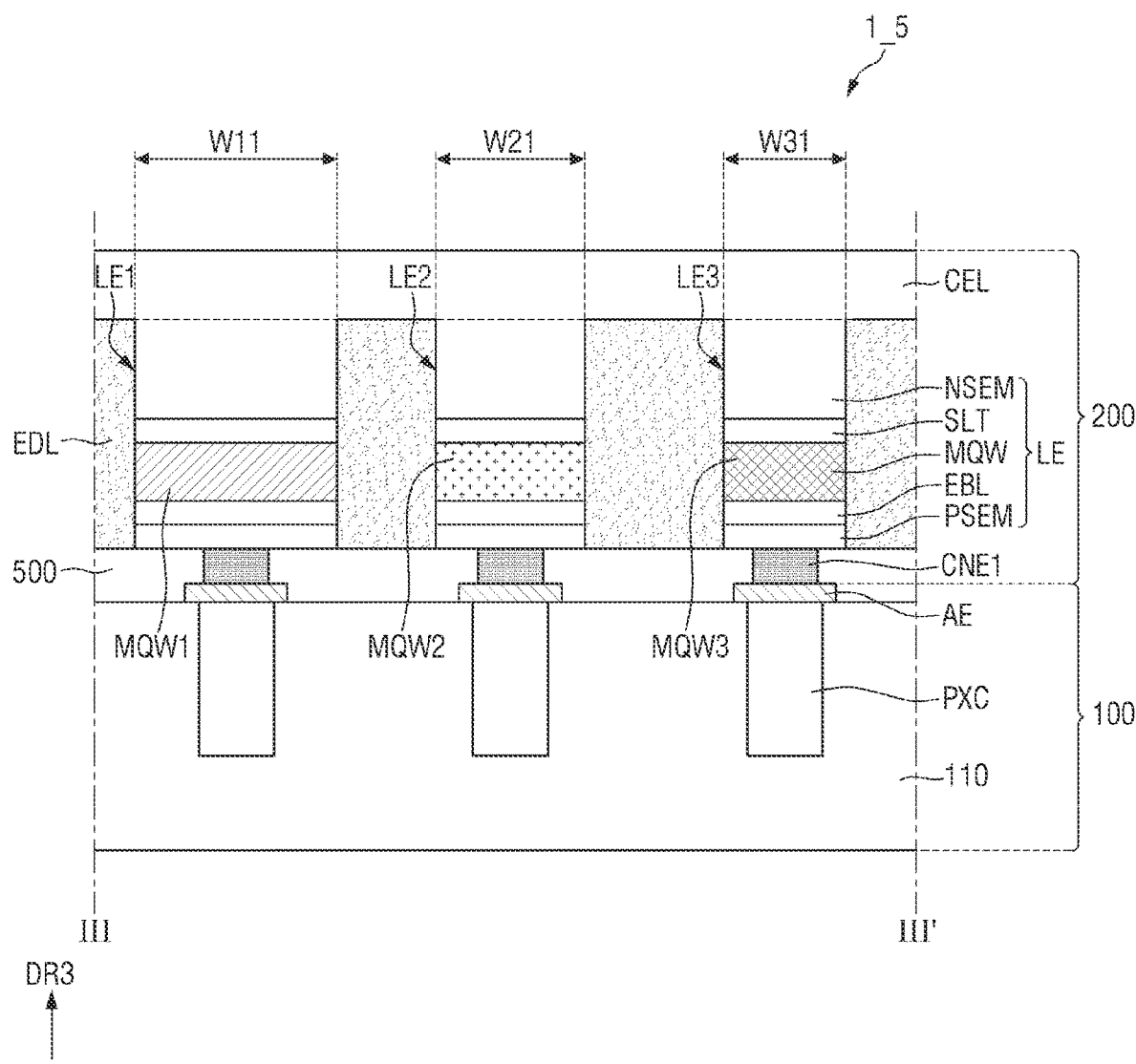

Then, as illustrated in FIGS. 69 to 71, the display device 1_5 may be fabricated by bonding the display substrate 200 including the light emitting element LE to the semiconductor circuit substrate 100. Because this is the same as the previous embodiments described above, it will be omitted.

In the method for fabricating the display device 1_5 according to the present embodiment, the light emitting element LE may be protected by forming the first to third mask layers ML1, ML2, and ML3 on the entire surface of the light emitting element LE and the hard mask HM. In addition, because the process for etching the mask pattern (see MK1, MK2, and MK3 in FIGS. 9 to 21) may be omitted, the number of masks may be reduced, simplification of the process procedure, and reduction of process cost may be induced.

In addition, the width W11 of the first light emitting element LE1 may be greater than the width W21 of the second light emitting element LE2, and the width W21 of the second light emitting element LE2 may be greater than the width W31 of the third light emitting element LE3. Accordingly, the area of the first light emitting element LE1 emitting red light may be enlarged to increase the emission efficiency of the first light emitting element LE1, and the area of the first active layer MQW1 may be enlarged to increase the emission amount of the first light emitting element LE1.

The display device 1_5 according to the present embodiment may prevent or reduce sidewall defects of the light emitting element LE by individualizing the light emitting elements LE without etching the emission defining layer EDL (or the hard mask HM).

In concluding the detailed description, those skilled in the art will appreciate that many variations and modifications can be made to the embodiments without substantially departing from the principles and scope of the present disclosure. Therefore, the present disclosure are used in a generic and descriptive sense only and not for purposes of limitation.

What is claimed is:
1. A display device comprising:
    a plurality of pixel electrodes spaced from each other on a substrate;
    a plurality of light emitting elements respectively located on the plurality of pixel electrodes;
    a common electrode layer on the plurality of light emitting elements; and
    an emission defining layer defining emission areas in which the plurality of light emitting elements are disposed,
    wherein the emission defining layer is in contact with a side surface of each of the plurality of light emitting elements and surrounds the side surface of each of the plurality of light emitting elements, and
    wherein a width of a bottom surface of each of the plurality of light emitting elements is greater than a width of a top surface thereof.

2. The display device of claim 1, wherein a filling layer is located between pixel electrodes adjacent to each other in one direction among the plurality of pixel electrodes, and the emission defining layer overlaps the filling layer in a thickness direction of the substrate.

3. The display device of claim 2, further comprising a plurality of connection electrodes respectively located between the plurality of pixel electrodes and the plurality of light emitting elements,
wherein the filling layer is located between connection electrodes adjacent to each other in the one direction among the plurality of connection electrodes.

4. The display device of claim 1, wherein top or bottom surfaces of the emission defining layer and the plurality of light emitting elements are at a same plane, and the plurality of light emitting elements extends in a thickness direction of the substrate.

5. The display device of claim 1, wherein the plurality of light emitting elements comprises a first semiconductor layer, a second semiconductor layer, and an active layer between the first semiconductor layer and the second semiconductor layer.

6. The display device of claim 5, wherein the common electrode layer comprises the same material as the second semiconductor layer.

7. The display device of claim 5, wherein the plurality of light emitting elements comprises a first light emitting element comprising a first active layer, and a second light emitting element comprising a second active layer different from the first active layer.

8. The display device of claim 7, wherein a minimum distance between the first light emitting element and the second light emitting element is equal to a minimum width of the emission defining layer between the first light emitting element and the second light emitting element.

9. The display device of claim 7, wherein the plurality of light emitting elements further comprises a third light emitting element comprising a third active layer different from the first active layer and the second active layer,
wherein the first active layer, the second active layer, and the third active layer each comprise indium (In),
wherein an indium content of the first active layer is greater than an indium content of the second active layer and the third active layer, and
wherein an indium content of the second active layer is greater than an indium content of the third active layer.

10. The display device of claim 5, wherein each of the plurality of light emitting elements further comprises a protrusion protruding from the second semiconductor layer, and located between the second semiconductor layer and the common electrode layer, and
wherein the protrusion comprises the same material as the second semiconductor layer.

11. The display device of claim 10, wherein a first width of the second semiconductor layer in one direction is greater than a second width of the protrusion in the one direction.

12. The display device of claim 10, wherein at least a part of a top surface of the second semiconductor layer is covered by the emission defining layer.

13. A display device comprising:
a plurality of pixel electrodes spaced from each other on a substrate;
a common electrode layer on the plurality of pixel electrodes;
an emission defining layer between the pixel electrodes and the common electrode layer and having a plurality of openings; and
a plurality of light emitting elements in the plurality of openings of the emission defining layer on the pixel electrodes,
wherein a maximum width of the plurality of openings is equal to a maximum width of each of the plurality of light emitting elements, and
wherein a minimum width of the plurality of openings is equal to a minimum width of each of the plurality of light emitting elements.

* * * * *